US006202043B1

(12) United States Patent
Devoino et al.

(10) Patent No.: US 6,202,043 B1
(45) Date of Patent: Mar. 13, 2001

(54) COMPUTER BASED SYSTEM FOR IMAGING AND ANALYZING A PROCESS SYSTEM AND INDICATING VALUES OF SPECIFIC DESIGN CHANGES

(75) Inventors: Igor G. Devoino; Oleg E. Koshevoy, both of Minsk (BY); Simon S. Litvin, St. Petersburg (RU); Valery Tsourikov, Boston, MA (US)

(73) Assignee: Invention Machine Corporation, Boston, MA (US)

( * ) Notice: Subject to any disclaimer, the term of this patent is extended or adjusted under 35 U.S.C. 154(b) by 0 days.

(21) Appl. No.: 09/245,669

(22) Filed: Feb. 8, 1999

Related U.S. Application Data

(63) Continuation-in-part of application No. 08/822,314, filed on Mar. 21, 1997, now Pat. No. 6,056,428, which is a continuation of application No. 08/747,922, filed on Nov. 12, 1996, now abandoned.

(51) Int. Cl.[7] .................................................. G05B 17/00
(52) U.S. Cl. .............................. 703/17; 703/22; 700/104; 700/31; 700/32
(58) Field of Search .................................. 703/1, 6, 7, 13, 703/14; 700/28, 29, 31, 32, 104; 705/7, 8, 9

(56) References Cited

U.S. PATENT DOCUMENTS

| | | | |
|---|---|---|---|
| 5,195,041 | * 3/1993 | George et al. | 700/100 |
| 5,229,948 | * 7/1993 | Wei et al. | 700/99 |
| 5,486,995 | * 1/1996 | Krist et al. | 700/29 |
| 5,541,849 | * 7/1996 | Rostoker et al. | 395/500.19 |
| 5,610,833 | * 3/1997 | Chang et al. | 395/500.12 |
| 5,666,288 | * 9/1997 | Jones et al. | 395/500.18 |
| 5,666,297 | * 9/1997 | Britt et al. | 703/18 |
| 5,754,447 | * 5/1998 | Gardner et al. | 395/500.01 |
| 5,841,660 | * 11/1998 | Robinson et al. | 700/115 |

* cited by examiner

Primary Examiner—Kevin J. Teska
Assistant Examiner—Kyle J. Choi
(74) Attorney, Agent, or Firm—Edward Dreyfus

(57) ABSTRACT

A computer system for analyzing and automatically modifying existing process system models that includes (i) an Initial Data stage that prompts the user to enter qualitative and quantitative objectives in designing or re-designing a Process System, (ii) a Component Model stage that displays an image of the sequence of components produced or added during the process and that allows the user to edit or complete the Component Model display that includes components, which are produced during the process, operations that produce them, and functions, each consisting of an element or tool that causes an action and an element or tool that receives the action, (iii) a Process (Functional) Analysis stage that includes functional and interaction relationships of the functions and operations designating each function as harmful or useful, and ranking each useful function according to the value of its contribution to the respective operation, and performing a value link analysis of each function including the level of the function performance (insufficient, excessive), defining parameters and designating their values and their dependencies in time and space, and comparing between actual and required parameters, (iv) a trimming routine for eliminating or simplifying an operation in a process, while retaining or transferring its useful functions by calculating the values of and ranking the operations or functions to identify the best-to-least function candidate for elimination or transfer, and (v) a trimming routine that generates a recommended list, in priority, of problem, to be solved to achieve the function trimming.

30 Claims, 65 Drawing Sheets

FIG. 9

Advanced objectives, limitations

Objectives:

| Objective | Unit | Current value | Desired value |
|---|---|---|---|
| | | | |
| 2 | | | |
| 3 | | | |

Typical objectives, limitations:

- ⊞ Object cost
- ⊞ Harmful actions
- ⊞ Main object parameters
- ⊞ Additional object parameters
- ⊞ Operation object parameters Add...
Remove...
Importance...
Reset...

Limitations:

| Limitation | Unit | Value |
|---|---|---|
| | | |
| 2 | | |
| 3 | | |

OK
Cancel
Help

| Element | Function | | Rank | Parameter | Level |
|---|---|---|---|---|---|
| | action | element | | | |
| Piston | compress | Water | B | pressure | V |
| Air | corrode | Cylinder | H | | |
| | corrode | Piston | H | wear | D |
| Dust | cover | Valve | H | | |
| Cylinder | direct | Piston | A1 | | |
| | resist | Piston | H | | |
| | keep | Piston | A1 | accuracy | V |
| Valve | control | Cylinder | A2 | | |
| Lever | move | Piston | A1 | | |

Legend
B - basic action
An - auxiliary function of rank "n"
H - harmful action

D - dependency discrepancy
V - value discrepancy

E - excessive level
I - insufficient level
N - normal level

FIG. 35

Feature transfer

List of objects:

| | Object | | |
|---|---|---|---|
| ▲ | Piston (design1) | | |
| 2 | Piston (design2) | | |
| 3 | Piston (design3) | | |
| 4 | | | |
| 5 | | | |
| 6 | | | |

List of parameters:

| | Parameter | Objective | Unit | Importance (1-10) |
|---|---|---|---|---|
| ▲ | durability | Up | hours | 4 |
| 2 | leakage | Down | nm3/min | 9 |
| 3 | | Up | | 1 |
| 4 | | | | |
| 5 | | | | |

10 = most important, 1 = least

[Help]    [Cancel] [< Back] [Next >] [Close]

FIG. 36

Feature transfer: Object data

Complete the following table:

| | durability (hours) 4 <Up> | leakage (nm3/min) 9 <Down> |
|---|---|---|
| Piston (design1) | 10000.00 | 5.00 |
| Piston (design2) | 25000.00 | 4.00 |
| Piston (design3) | 13000.00 | 5.00 |
| Technological limit | 30000.00 | 1.00 |
| Theoretical limit | 50000.00 | 0.00 |

[Help]  [Cancel]  [< Back]  [Next >]  [Close]

COMPONENT CAN BE ELIMINATED IF:

1) ITS ACTION IS PERFORMED BY ANOTHER COMPONENT OR SUPERSYSTEM ELEMENT:

2) ITS ACTION IS PERFORMED BY THE COMPONENT WHICH RECEIVES THE ACTION:

3) THE COMPONENT WHICH RECEIVES THE ACTION IS ALSO ELIMINATED:

THERE ARE TWO WAYS TO TRANSFORM AN ACTION APPLIED TO A TRIMMED ELEMENT:

1) ACTION CAN BE APPLIED TO ANOTHER ELEMENT:

2) ACTION CAN BE DELETED:

| # | OPERATION | OPERATION COST | ENERGY CONSUMPTION, (KW*HOUR) | OPERATION TIME, (MIN) |
|---|---|---|---|---|
| 1.1 | CUTTING | 21.00 | 5.00 | 25.00 |
| 1.2 | HEAT TREATMENT | 33.00 | 10.00 | 15.00 |
| 1.3 | FINISHING | 30.00 | 2.00 | 20.00 |
| + | | 0.00 | 0.00 | 0.00 |

SHAFT
GEAR
ASSEMBLY UNIT

TEAM MEMBERS:
JOHN ▶

CONCENSUS

OPERATIONS / FUNCTIONS

FIG. 50

FUNCTION TYPE DEFINITION

FUNCTION: SPINDLE ROTATE SHAFT (1.1.1)

OF OPERATION: CUTTING(1.1)

TYPE:
- PRODUCTIVE
- ✓ PROVIDING
- CORRECTIVE
- HARMFUL

PROVIDES
CORRECTS

A PROVIDING FUNCTION IS A USEFUL FUNCTION THAT TEMPORARILY CHANGES THE PARAMETER(S) OF THE OBJECT. THIS PARAMETER CHANGE ENABLES OR FACILITATES SUBSEQUENT OR CONCURRENT USEFUL FUNCTIONS OR OPERATIONS.
THE TEMPORARY CHANGES PRODUCED BY PROVIDING FUNCTIONS ARE REVERSED BY CORRECTIVE FUNCTIONS.

RESULT: PROVIDING FUNCTION ROTATE SHAFT PROVIDES:

| FUNCTION | OF OPERATION |
|---|---|
| REMOVE METAL | CUTTING(1.1) |

PROVIDES WHAT?

- SHAFT (1)
  - ☑ CUTTING (1.1)
    - ☑ CUTTER REMOVE METAL (1.1.2)
  - ☐ HEAT TREATMENT (1.2)
    - ☐ TOOLING SUPPORT SHAFT (1.2.1)
    - ☐ INDUCTOR HEAT SHAFT (1.2.2)
  - ☐ FINISHING (1.3)
    - ☐ SPINDLE ROTATE SHAFT (1.3.1)
    - ☐ GRINDSTONE REMOVE SLAG (1.3.2)
    - ☐ GRINDSTONE GRIND SHAFT (1.3.3)
- GEAR (2)
  - ☐ GEAR CUTTING (2.1)
    - ☐ TOOLING SUPPORT GEAR (2.1.1)
    - ☐ MILLING CUTTER REMOVE METAL (2.
- ASSEMBLY UNIT (3)
  - ☐ COUPLING (3.1)

[ OK ]   [ CANCEL ]

FUNCTION TYPE DEFINITION

FUNCTION  TYPE

CUTTER REMOVE METAL (1.1.2)   ✓ PRODUCTIVE   PROVIDES
                              PROVIDING       CORRECTS
OF OPERATION                  CORRECTIVE
CUTTING(1.1)                  HARMFUL

A PROVIDING FUNCTION IS A USEFUL FUNCTION THAT PERMANENTLY CHANGES THE PARAMETER(S) OF THE OBJECT. THIS CHANGE WILL EXIST PARTIALLY OR FULLY IN THE FINAL STATE OF THE OBJECT OR WILL BRING OBJECT'S PARAMETERS CLOSER TO THAT OBJECT'S DESIRED FINAL STATE.

- SHAFT (1)
  - CUTTING (1.1)
    - SPINDLE ROTATE SHAFT (1.1.1)
  - HEAT TREATMENT (1.2)
    - TOOLING SUPPORT SHAFT (1.2.1)
    - INDUCTOR HEAT SHAFT (1.2.2)
    - AIR OXIDIZE SHAFT (1.2.4)
  - FINISHING (1.3)
    - SPINDLE ROTATE SHAFT (1.3.1)
    - GRINDSTONE REMOVE SLAG (1.3.2)
    - GRINDSTONE GRIND SHAFT (1.3.3)
- GEAR (2)
  - GEAR CUTTING (2.1)
    - TOOLING SUPPORT GEAR (2.1.1)
    - MILLING CUTTER REMOVE METAL (2.
- ASSEMBLY UNIT (3)

OK    CANCEL

FIG. 54

FUNCTION TYPE DEFINITION

FUNCTION
GRINDSTONE REMOVE SLAG (1.3.2)

OF OPERATION
FINISHING (1.3)

TYPE
- PRODUCTIVE
  - PROVIDING
  - ✓ CORRECTIVE
  - HARMFUL
- PROVIDES
- CORRECTS

A CORRECTIVE FUNCTION IS A USEFUL FUNCTION THAT CHANGE THE PARAMETER(S) OF THE OBJECT TO ELIMINATE UNWANTED OBJECT CHARACTERISTICS. THIS PARAMETER CHANGE MAY REVERSE THE CHANGES OF A PROVIDING FUNCTION, REVERSE THE CHANGES AN EXCESSIVE PRODUCTIVE FUNCTION, OR ELIMINATE/REDUCE UNWANTED RESULTS OF A HARMFUL FUNCTION.

RESULT: CORRECTIVE FUNCTION REMOVE SLAG CORRECTS:

| FUNCTION | OF OPERATION |
|---|---|
| OXIDIZE SHAFT | HEAT TREATMENT (1.2) |

CORRECT WHAT?

- SHAFT (1)
  - CUTTING (1.1)
    - SPINDLE ROTATE SHAFT (1.1.1)
    - CUTTER REMOVE METAL (1.1.2)
  - HEAT TREATMENT (1.2)
    - TOOLING SUPPORT SHAFT (1.2.1)
    - INDUCTOR HEAT SHAFT (1.2.2)
    - ✓ AIR OXIDIZE SHAFT (1.2.4)
  - FINISHING (1.3)
    - SPINDLE ROTATE SHAFT (1.3.1)
    - GRINDSTONE GRIND SHAFT (1.3.3)
- GEAR (2)
  - GEAR CUTTING (2.1)
    - TOOLING SUPPORT GEAR (2.1.1)
    - MILLING CUTTER REMOVE METAL (2.
- ASSEMBLY UNIT (3)

[ OK ]  [ CANCEL ]

TRIMMING: COMPONENT EVALUATION

FUNCTION RANK | PROBLEM RANK | COST

RANK THE FUNCTION FOR EACH OPERATION

| # | OPERATION | FUNCTION RANK | | |
|---|---|---|---|---|
| | | JOHN | SMITH | AVERAGE |
| 1.1 | CUTTING | 8.33 | 8.33 | 8.33 |
| 1.2 | HEAT TREATMENT | 8.33 | 8.33 | 8.33 |
| 1.3 | FINISHING | 10.00 | 10.00 | 10.00 |
| 2.1 | GEAR CUTTING | 8.33 | 8.33 | 8.33 |
| 3.1 | COUPLING | 10.00 | 10.00 | 10.00 |

10 - MOST FUNCTIONAL, 0 - LEAST

CONSENSUS   RESET

HELP        CANCEL   < BACK   NEXT >   FINISH

FIG. 58

TRIMMING: COMPONENT EVALUATION

FUNCTION RANK | PROBLEM RANK | COST

RANK THE PROBLEM FOR EACH OPERATION

PROBLEM RANK

| # | OPERATION | JOHN | SMITH | AVERAGE |
|---|---|---|---|---|
| 1.1 | CUTTING | 4.00 | 4.00 | 4.00 |
| 1.2 | HEAT TREATMENT | 10.00 | 10.00 | 10.00 |
| 1.3 | FINISHING | 7.20 | 7.20 | 7.20 |
| 2.1 | GEAR CUTTING | 3.00 | 3.00 | 3.00 |
| 3.1 | COUPLING | 1.00 | 1.00 | 1.00 |

10 - LARGEST PROBLEM, 0 - SMALLEST

[HELP]    [CANCEL]   [<BACK]  [CONSENSUS]  [NEXT >]  [RESET]  [FINISH]

FIG. 59A

TRIMMING: COMPONENT EVALUATION

FUNCTION RANK | PROBLEM RANK          COST

COST OF EACH OPERATION

PROBLEM RANK

| # | OPERATION | JOHN | SMITH | AVERAGE |
|---|---|---|---|---|
| 1.1 | CUTTING | 21.00 | 21.00 | 21.00 |
| 1.2 | HEAT TREATMENT | 33.00 | 33.00 | 33.00 |
| 1.3 | FINISHING | 30.00 | 30.00 | 30.00 |
| 2.1 | GEAR CUTTING | 22.00 | 22.00 | 22.00 |
| 3.1 | COUPLING | 3.00 | 3.00 | 3.00 |

CONSENSUS   RESET

HELP        CANCEL   < BACK   NEXT >   FINISH

FIG. 59B

TRIMMING: CONDITIONS

TRIMMED OPERATION '1.2 HEAT TREATMENT'. PRODUCTIVE FUNCTION: 1.2.2 INDUCTOR HEAT SHAFT ▶

CHOOSE SUITABLE TRIMMING CONDITION
OPERATION '1.2 HEAT TREATMENT' CAN BE TRIMMED IF:

⦿ THE FUNCTION TO 'HEAT SHAFT' IS PERFORMED DURING THE OPERATION  1.1 CUTTING ▶
○ THERE IS NO OBJECT 'SHAFT'
○ THERE IS NO NEED TO 'HEAT SHAFT'
○ THE FUNCTION TO 'HEAT SHAFT' IS PERFORMED DURING THE NEW OPERATION  NEW OPERATION

○ SKIP CONSIDERATION OF THE FUNCTION 'HEAT SHAFT'

[HELP]  [STORE...]  [CANCEL]  [<BACK]  [NEXT>]  [FINISH]

FIG. 62

TRIMMING: CONDITIONS

TRIMMED OPERATION 'HEAT TREATMENT'. OPERATION/FUNCTION UNDER CONSIDERATION: GRINDSTONE REMOVE SLAG ▶

```
┌───────────┐
│ FINISHING │
├───────────┤
│ REMOVE SLAG │ ✕
└───────────┘
      │ CORRECTS
      ▼
┌───────────────┐
│ HEAT TREATMENT │
├───────────────┤
│ OXIDIZE SHAFT │
└───────────────┘
```

TO SET THE OPERATION/FUNCTION 'REMOVE SLAG'
⦿ TRIM THE OPERATION/FUNCTION 'REMOVE SLAG'
○ THE FUNCTION 'REMOVE SLAG' CORRECTS '...'  ↑

[HELP]   [STORE...]   [CANCEL]   [<BACK]   [NEXT >]   [FINISH]

FIG. 63B

COMPUTER BASED SYSTEM FOR IMAGING AND ANALYZING A PROCESS SYSTEM AND INDICATING VALUES OF SPECIFIC DESIGN CHANGES

RELATED PATENT

This is a continuation-in-part application of U.S. patent application Ser. No. 08/822,314, filed Mar. 21, 1997, now U.S. Pat. No. 6,056,428, which is a continuation of U.S. patent application Ser. No. 08/747,922, filed Nov. 12, 1996, now abandoned.

BACKGROUND

The present invention relates to engineering problem solving and design tools and more particularly to computer based systems for aiding engineers, scientists and the like to have a greater understanding of the products, processes, or machines they wish to improve and the technical problems related thereto that they wish to solve.

Great advancements have been made in the fields commonly known as computer aided design (CAD) and computer aided engineering (CAE). These computer based systems enable the designer to create detailed images and print-outs of the product or machine he/she is designing or improving. With CAD, the designer can try many new designs or modifications of subsystems and components quickly and view the modified products immediately on the monitor or print-out. The CAD system also generates virtual 3-D images of the product or machine, enables in-space rotation of the product image and zoom through the product image interior.

Although CAD systems are a great designer tool for trying design changes quickly, they do not otherwise aid the designer in the evaluation and solving of technical engineering problems or conceiving new products or processes that provide new functional performance or the same functional performance with completely different engineering approaches. Accordingly, there has arisen a relatively new area of computer based engineering tools known as concept engineering computer based systems. These systems serve to increase the designer's inventive and creative abilities in solving engineering and scientific operational or functional problems and, in the course of such problem solving, induce the designer to invent new structural and functional concepts applicable to his/her design goals.

One such concept engineering computer based system is the Invention Machine™ LAB™ Software sold by Invention Machine Corporation of Boston, Mass., that comprises a knowledge and logic based system that generates concepts and recommendations for solving engineering problems at the conceptual level. Various inventive rules or procedures are included and certain ones selected and presented to the user to consider in solving the user's current session problem. This system applies to all fields of physics and aid the engineer by solving engineering contradictions to reduce the tendency of user applied engineering trade-offs. In addition, this system includes a large data base of physical, geometric, and chemical effects used in the past to solve other engineering problems and selected ones of the effects are presented to the user to consider for a solution to his/her current problem session. Lastly, this system includes a technology evolution and prediction capability that aids the user in understanding the dynamics of his/her product evolution and the logical next or future generation of the product or its function. This stimulates the user to think forward and extrapolate the dynamics of the technology life cycle and originate the next generation of technology.

Although the above conceptual engineering system has experienced much acceptance by the technical community, there is still a need for a computer based systems that aid the user in understanding the nature and value aspects of the current product, machine, or process the engineer wishes to design or re-design. In addition, there is a need for the user to be aided in formulating the statement of the most important technical problems for elimination of components or harmful actions between components of the object system being analyzed.

SUMMARY OF EXEMPLARY EMBODIMENTS OF INVENTION

One exemplary embodiment of the present invention pertains to a computer based conceptual engineering analysis software system and method (EAS) that satisfies the above described needs and provides other benefits described below. The EAS, according to the principles of the present invention, assists the user to input and displays a functional model of the object system under analysis, which functional model of an object, device, machine, or other engineering system (hereafter termed "object system") includes the major components, supersystems, products and both useful and harmful interactions between them.

The EAS prompts the user to input data that enables the EAS to perform a parameter analysis of the various interactions. The EAS then analyzes the functional model elements, conducts an interaction parameter analysis, conducts an object system component function and problem and task significance ranking subroutine, and automatically displays recommendations of which components should be changed or eliminated from the object system to achieve the greatest redesign value and which functions should be transferred to the other remaining components.

The EAS includes an Initial Data routine that prompts the user to input analysis or session qualitative and quantitative objectives in re-designing an engineering system or object. After entering initial data, the EAS next prompts user to create an image of a functional model of the object system, learn what parts this object consists of, and how these parts interact with each other and with the environment. It is then possible to decide where the bottleneck is, what problems should be solved, and what is the urgency of the problems. Next a Functional Model routine displays an image of a functional model of the current session object and allows the user to edit it or complete the statement to generate the functional and interaction relationships of components of the current object system the user wishes to modify or redesign. The Functional Model routine includes three alternate modes to enable the user to build the functional model, namely, (i) a graph mode in which the user builds the functional model directly on the screen by entering boxes representing components, products and supersystems or (ii) an expert or table mode in which the user is prompted to enter each component, product and supersystem. With such data entered, the EAS will display automatically the graphic form of the functional model if desired by the user.

The EAS also prompts user to apply to the functional model or an interaction matrix the harmful effects and useful interactions between specific components and any supersystems affected by and products produced by the object system. The EAS also prompts user to input the actual, desired and ideal values of harmful and useful interactions and parameter dependencies. The EAS then analyzes the model components and interactions and formulates a list of specifically numbered problems and sorts them according to urgency or priority.

The EAS provides a Trimming routine during which the object system functional model is analyzed, evaluated, and the functions and problems of each object system component ranked in importance. The user checks results and enters the cost of each component. The system re-analyzes the object system and recommends the components that can or should be simplified or trimmed (omitted) and certain trimming conditions.

The EAS conducts each analysis on either of two levels of depth as selected by the user, namely express (short analysis level) or advanced (detailed analysis level), as described below. Different levels of analysis for different interactions of the same object can also be conducted. After analyses are completed, the system presents the engineering system characteristics before trimming and after trimming and the percent of improvement of each characteristic.

As can be seen below, the EAS, according to the present invention indicates to the user new and powerful information about the object, each component of the object, and each interaction between such components and each supersystem and any products produced or conveyed by the object. In addition, the EAS hereof in a Problem Management routine indicates to the user which components to try to modify or trim and eliminate their functions or transfer their functions to other components of the object system. The results also aid the user in identifying the core technical problems to be solved to produce the greatest value and the technical problems that disappear and need no solution if the trimming effort is successful. In addition, the EAS also includes the ability to generate a report at the end of each session describing all analysis steps, the original and trimmed object system, lists of detected problems, received concepts, object structure changes, feature transfer recommendations and results of the session.

The EAS, according to the principles of the present invention, also includes a Process System Analysis module (hereafter "PSA") that assists the user to analyze a process system intended to be modified or designed to improve a manufacturing, treatment, or other physical effectiveness, process (Process System) energy consumption, cost, time, number of steps, material consumption, pollution, space, or waste. The Process System Components and Operations, each Component being made, modified or added by a sequence of one or more Operations, each Operation being performed by a sequence of one or more Functions or steps.

The PSA module enables the user to analyze manufacturing, engineering, medical or technical processes from different perspectives and at several different levels of abstraction. The user first examines Components that are produced during a process, then the Operation that produces each individual component, and finally the various Functions that make up each discrete operation.

The PSA constructs graphical models of Components that are produced in the process, as well as a graphical Function model. Process (Link) Analysis is performed, and a new, powerful Trimming routine is provided.

With PSA, the user can define project objectives and their relative importance, which change the Trimming factors and subsequent recommendations for Trimming. Objectives can be evaluated one operation at a time, offering a level of scrutiny not previously available. In addition, there is a capability for establishing Trimming Variants, in which the user can define multiple paths for Trimming in order to find the optimum approach.

The Process System Analysis module includes five major routines:

1. Initial Data stage that prompts the user to enter qualitative and quantitative objectives in designing or re-designing a Process System.

2. Component Model stage that displays an image of the sequence of Components produced or added during the process and that allows the user to edit or complete the Component Model display. The user begins this stage by drawing a model structure of the operations and their sequence. Each process has a hierarchy: a process can be reduced to components, which are produced during the process; the components can be further reduced to operations that produce them. The operations are further made up of functions, each consisting of three parts: an element or tool, an action, and an element or tool that receives the action. The user can start the analysis on the highest level of the hierarchy and analyze the lower levels of the hierarchy subsequently, if necessary.

3. Process (Functional) Analysis stage prompts the user to enter data for the functional and interaction relationships of the Functions and Operations that produce each Component of the Process System and to identify and designate each Function of each Operation as harmful or useful. This routine further enables the user to (i) identify tools and parts of components used or addressed during the respective operation, (ii) rank each useful Function according to the value of its contribution to the respective Operation, (iii) display graphically the logic links between Functions of each Operation and other Operations. The routine enables the user to make a contribution value link analysis of each Function including the level of the Function performance (insufficient, excessive), define parameters and designate their values and their dependencies in time and space, and compare between actual and required parameters.

Thus, after building the model graphically, user can analyze each action thoroughly through this stage. PSA supports two levels of link analysis. The primary level, called actions analysis, requires very little information for the description of the action. Each function is defined according to one of four types in just a few words. Useful actions are classified according to their level of function performance: normal, excessive, and insufficient, and scored on a scale. Harmful actions are also scored from least harmful to most harmful.

The second level of analysis is advanced link analysis, which allows the user to define functional performance in terms of associated parameters. Parameters analysis includes parameters of the actions. For every useful action, each parameter actual and required values within dependencies of time, space, or other dimension, are compared. Actual and admissible, parameter values are compared for harmful actions. The PSA determines the degree of discrepancy between actual and required values of useful parameters, or between actual and admissible values of harmful parameters. A description of how these discrepancies influence the effectiveness of the process can be defined by the user.

4. Trimming is a PSA routine for eliminating or simplifying an operation in a process, while retaining or transferring its useful functions. The Trimming stage is based on the benefit that a process can be simplified by eliminating certain component operations of the process, while redistributing the operations' useful functions to other operations or to non-processed components. Redistributing functions means fewer and simpler operations. Eliminating operations means there are fewer problems to be solved.

Trimming routine calculates the values of and ranks the Operations or Functions to identify the best candidate for elimination. This routine develops the Process Function Rank for each Operation, its Process Problem Rank and Cost. The Trimming routine then presents a set of rules by which the modification or elimination or transfer of the Function can be analyzed and selected depending upon the type of Function being considered.

Trimming stage provides the following benefits:

1. If an operation is eliminated, all harmful actions associated with the operation are also eliminated.
2. Trimming the operation makes the process less expensive. The operation does not need to be produced or performed.
3. If an operation is not trimmed, one or more functions are transferred to other operations, and the first operation becomes simpler and less expensive.
4. The process structure becomes optimized.
5. Trimming conditions are methods of redistributing the useful functions of an eliminated element or operation.
6. PSA will discourage the removal of a useful function, without transferring its action to another operation or to a non-processed component. Thus, PSA provides trimming conditions that correctly transform the process structure. All useful actions are performed by the remaining components.
5. Problem Manager routine manages the problem statement and displays, and stores parts of the entire session and generates a list of problems to be solved in achieving the redesign objectives. In addition, Problem Manager ranks each problem to display the relative importance in solving such problems. PSA, accordingly, collects this information, correlates it with the components of the process, generates a list of problems, and defines their urgency or significance. In this way, the PSA makes significant recommendations to the user about which problems should be solved first for maximizing the benefits of process redesign and of meeting the user's objectives. Problem Manager can collect organize, and print out a report summarizing the entire project, including all stages of PSA if desired.

DRAWINGS

Other and further aspects, benefits and objectives of the present invention will become apparent with the following detailed description when taken in view of the appended drawings in which:

FIG. 9 is a visual display device screen illustrating a display for inputting data and displaying advanced project data.

FIG. 11 is a visual display device screen illustrating a display for inputting data and displaying the team member file.

FIG. 14 is a visual display device screen illustrating a display for inputting data and displaying parameter quantitative value link analysis.

FIG. 21 is a visual display device screen illustrating a display for inputting data and displaying trimming parameter evaluation functional rank.

FIG. 22 is a visual display device screen illustrating a display for inputting data and displaying trimming parameter evaluation problem rank.

FIG. 23 is a visual display device screen illustrating a display for inputting data and displaying trimming parameter evaluation cost evaluation.

FIG. 28 is a visual display device screen illustrating a display for inputting data and displaying the expert mode product element definition.

FIG. 33 is a visual display device screen illustrating a display for inputting data and displaying browser mode functional model table.

FIG. 35 is a visual display screen illustrating a display screen for inputting data and displaying the first screen of the feature transfer routine.

FIG. 36 is a visual display screen illustrating a display screen for inputting data and displaying feature transfer object data.

FIGS. 44A–E are representations of EAS trimming rules.

Figure 45A:

FIG. 45A is a flow diagram of the major sub-sessions or stages of the PSA system.

Figure 45B:
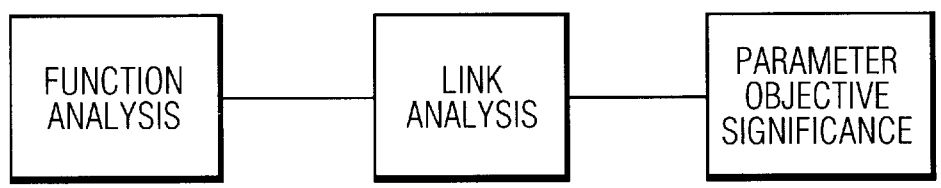

FIG. 45B is a flow diagram of the major routines of the Process Analysis stage of FIG. 45A.

Figure 46:
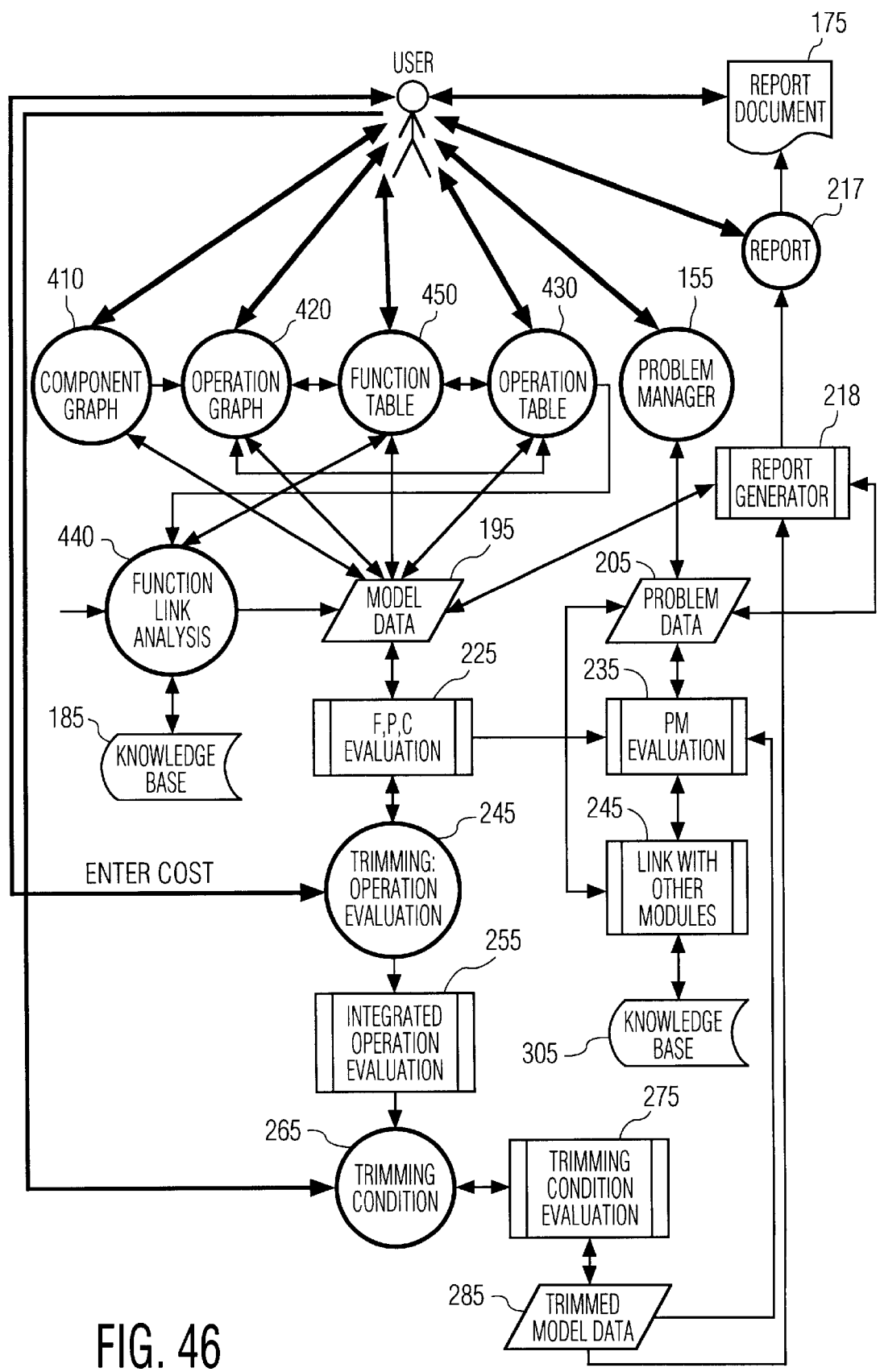

FIG. 46 is a block diagram of the PSA system.

Figure 47:
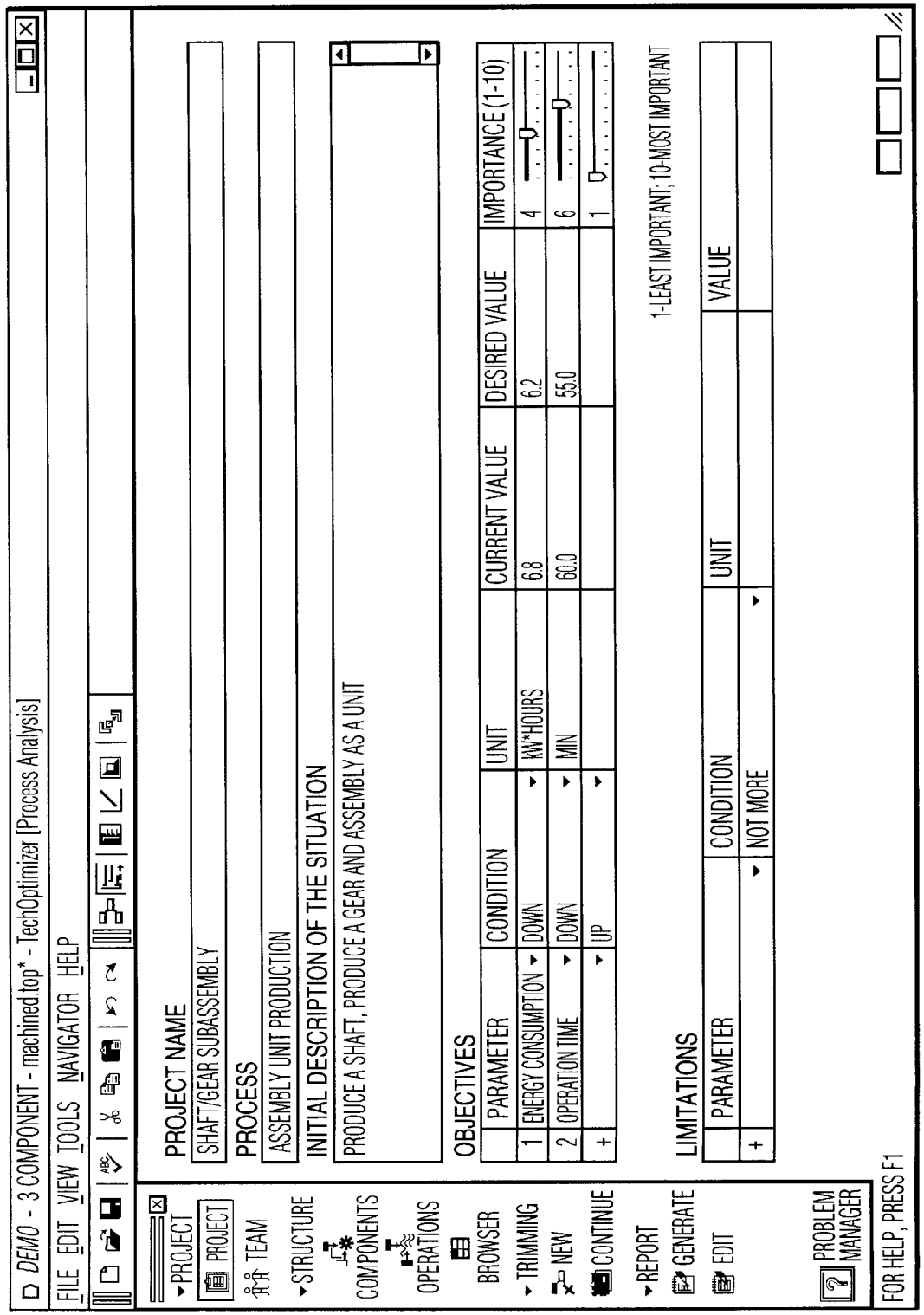

FIG. 47 is a PSA visual device screen illustrating a display for entering data and displaying initial PSA project data.

Figure 48:
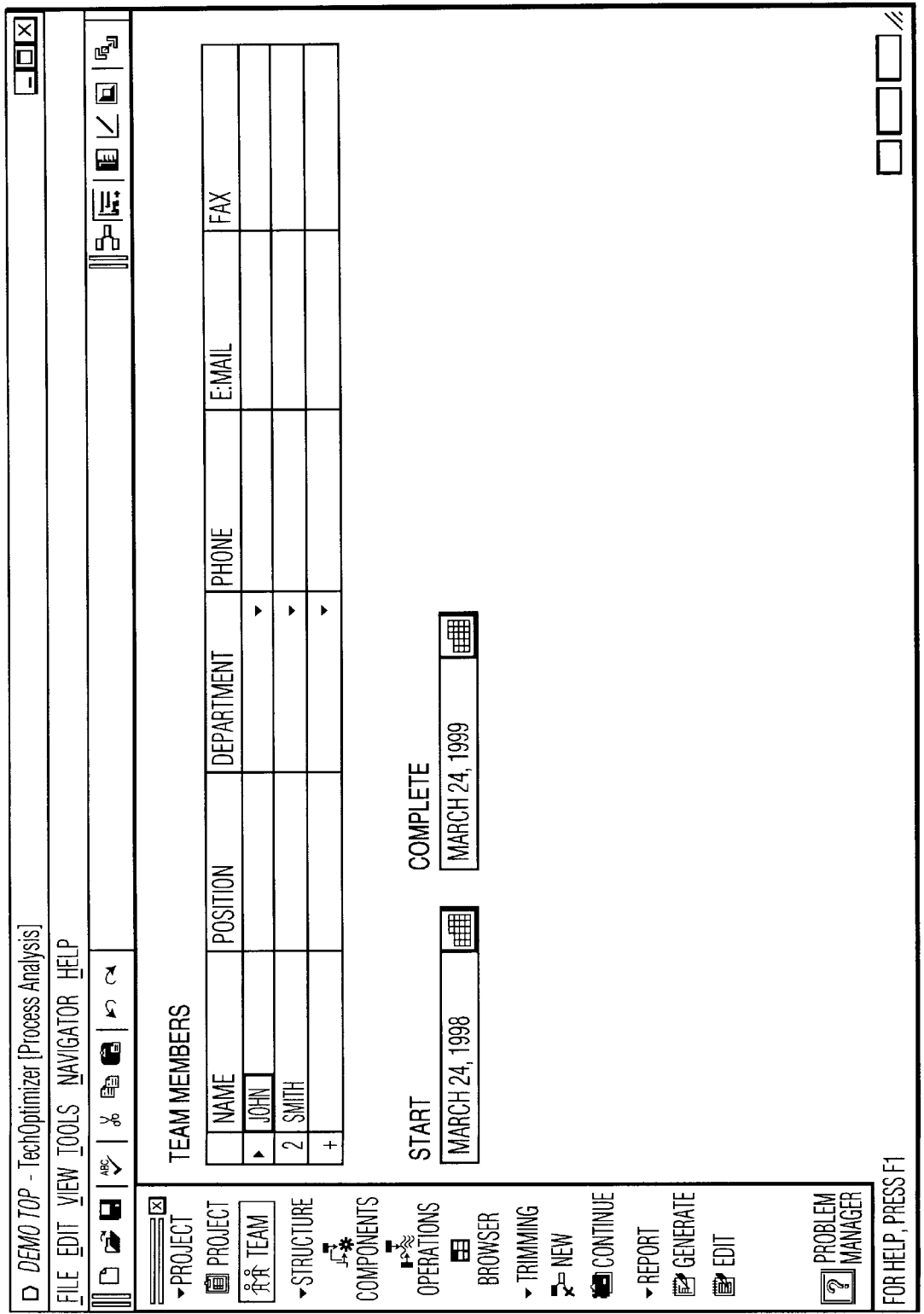

FIG. 48 is a PSA visual device screen illustrating a display for entering data and displaying initial PSA team member and project data.

Figure 49:
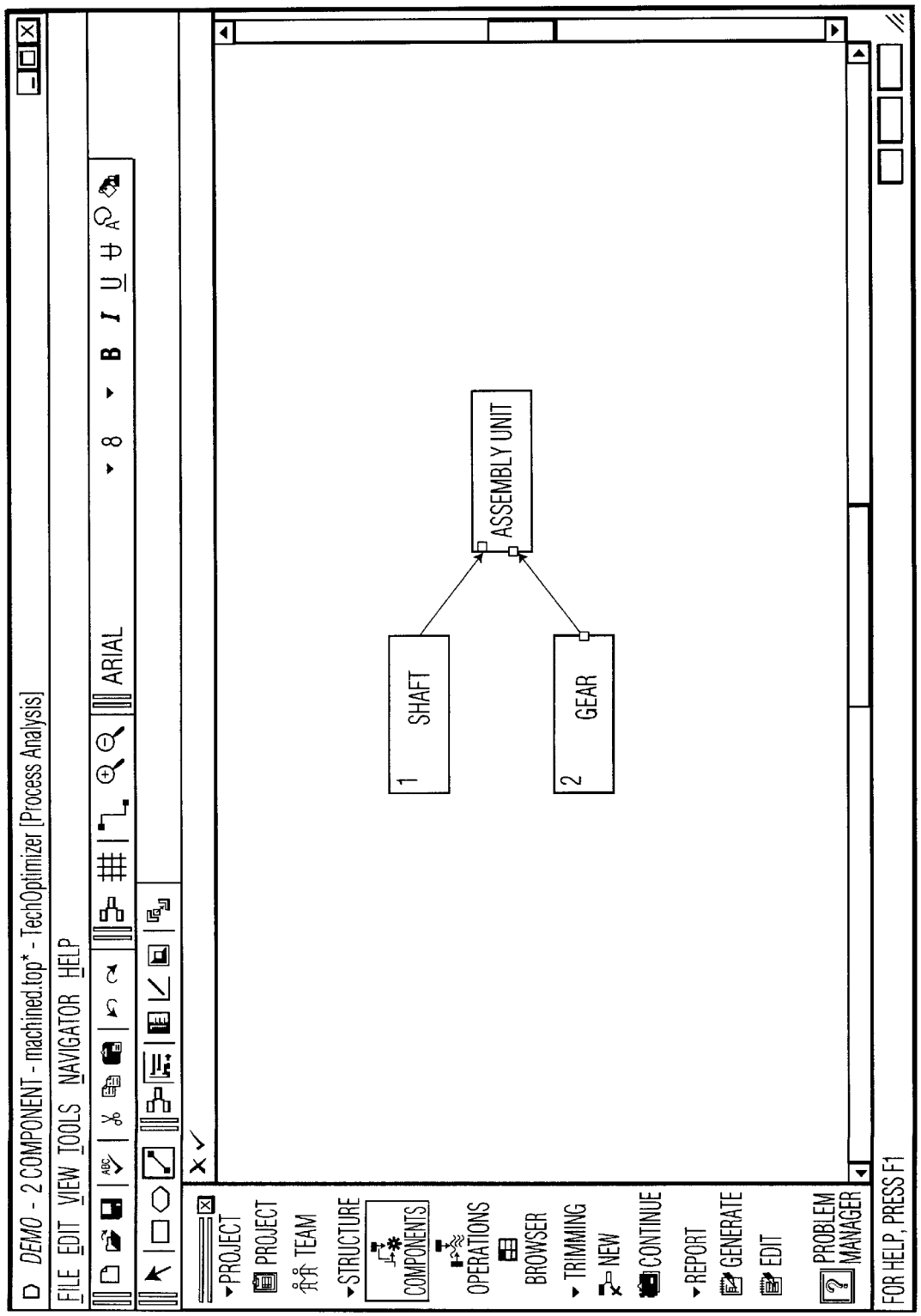

FIG. 49 is a PSA visual device screen illustrating a display for entering data and displaying component model data in graphic form.

FIG. 50 is a PSA visual device screen illustrating a display for entering data and displaying component model data in table form.

Figure 51A:
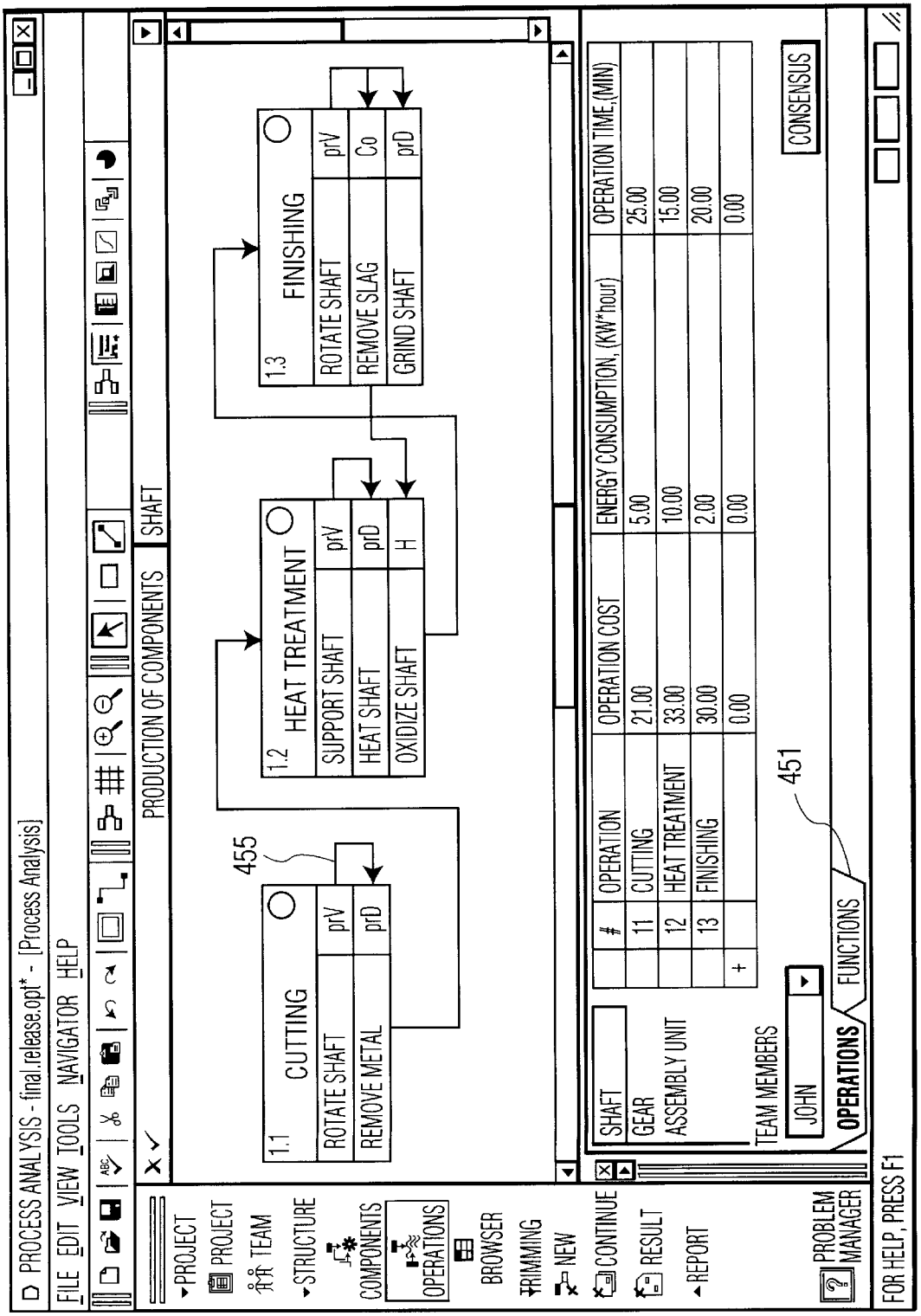

FIG. 51A is a PSA visual device screen illustrating a display for entering data and displaying Operations data.

Figure 51B:
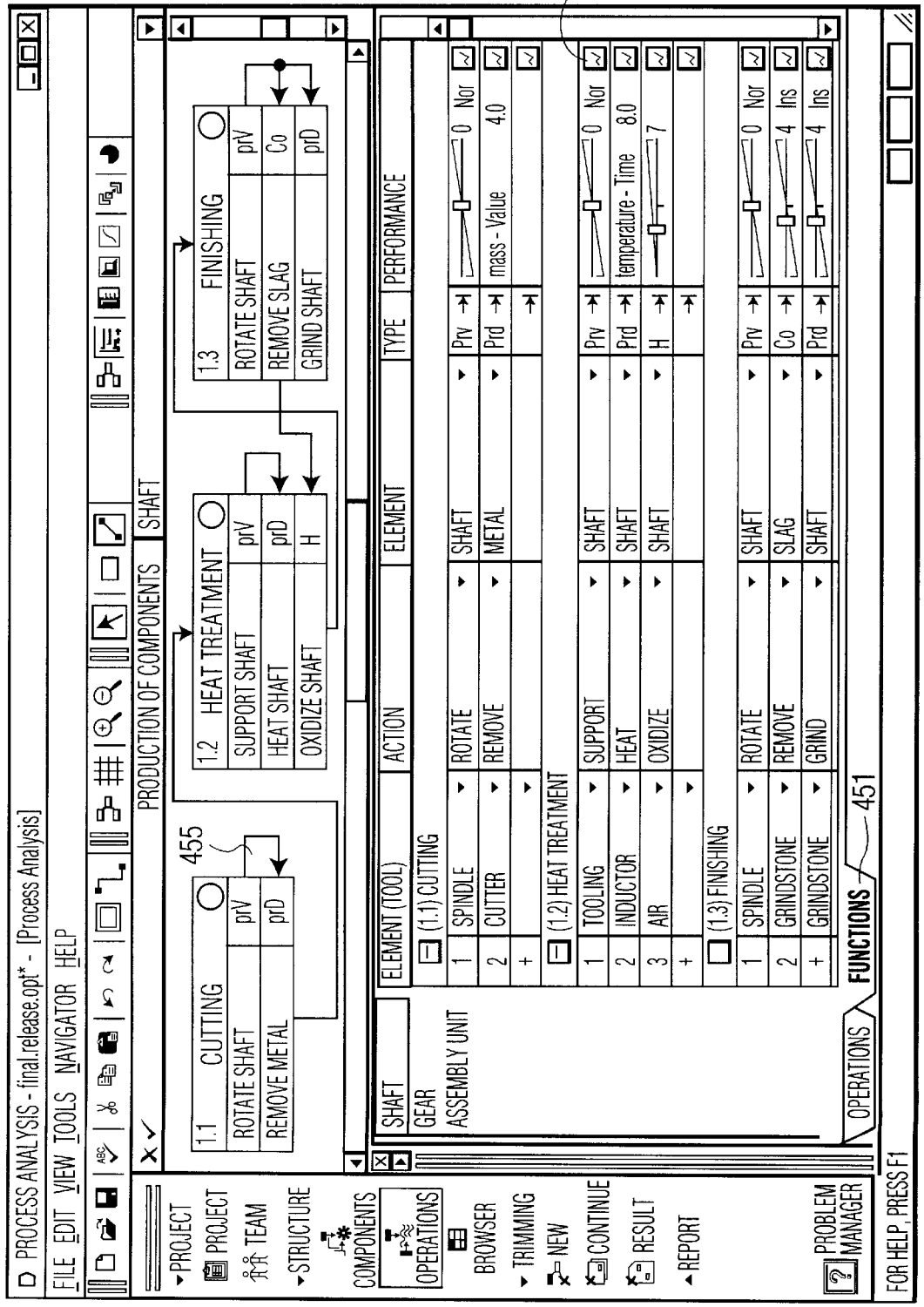

FIG. 51B is similar to FIG. 51A for entering and displaying Function data.

FIG. 52 is a PSA visual device screen illustrating a display for entering data and displaying function type and other function data.

FIG. 53 is a PSA visual device screen illustrating a display for entering data and displaying function type and other function data.

Figure 54:
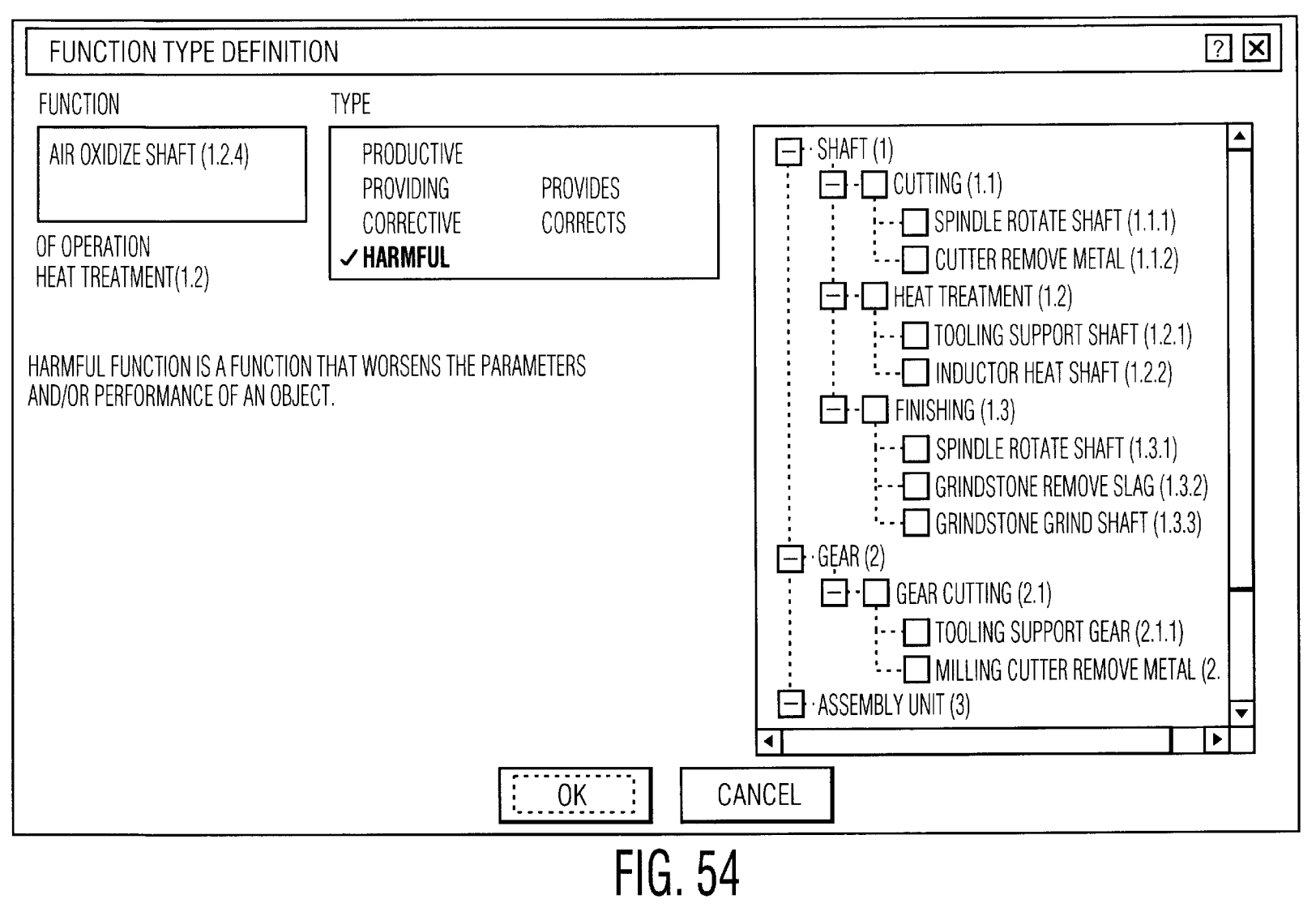

FIG. 54 is a PSA visual device screen illustrating a display for entering data and displaying function type and other function data.

FIG. 55 is a PSA visual device screen illustrating a display for entering data and displaying function type and other function data.

Figure 56:
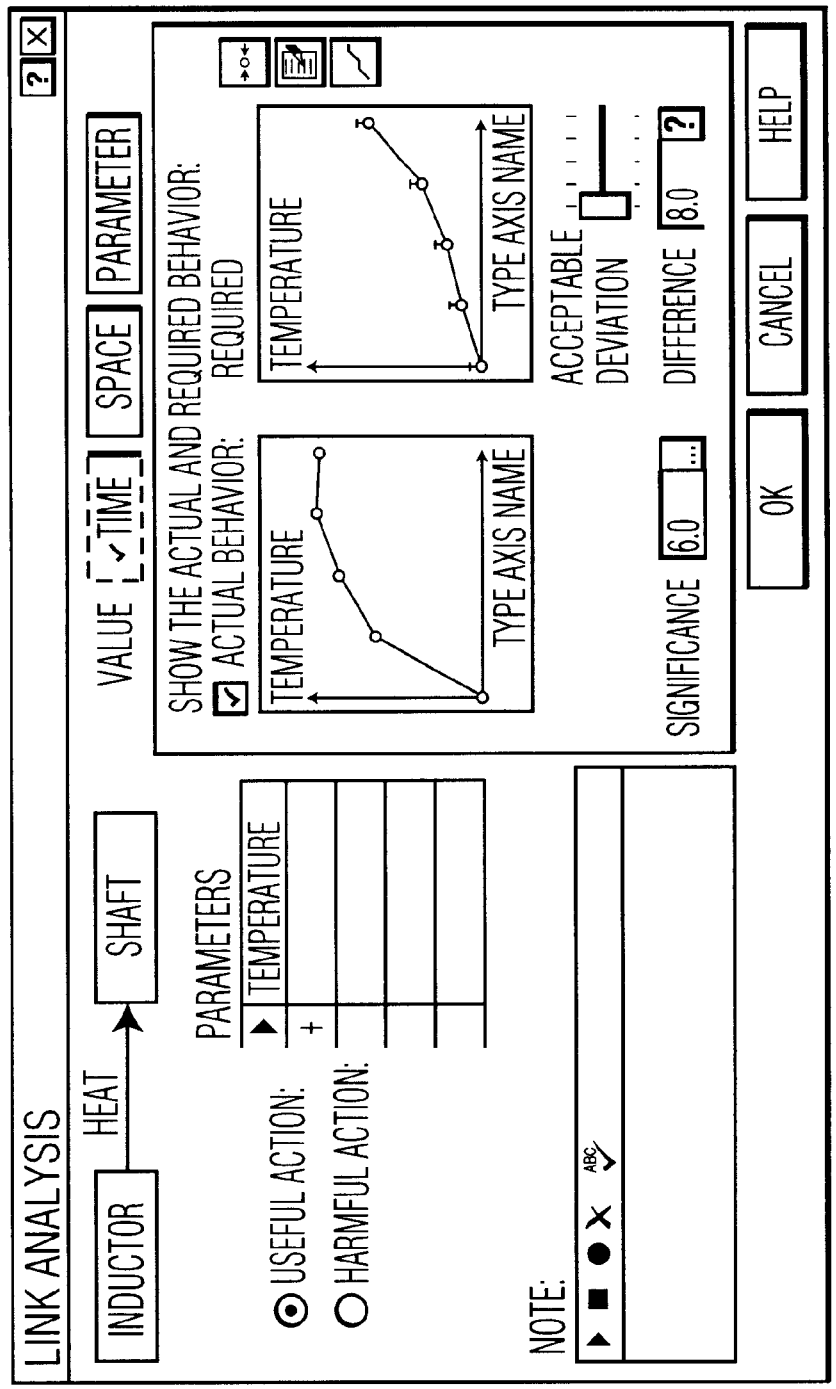

FIG. 56 is a PSA visual device screen illustrating a display for entering data and displaying Link Analysis data.

Figure 57:
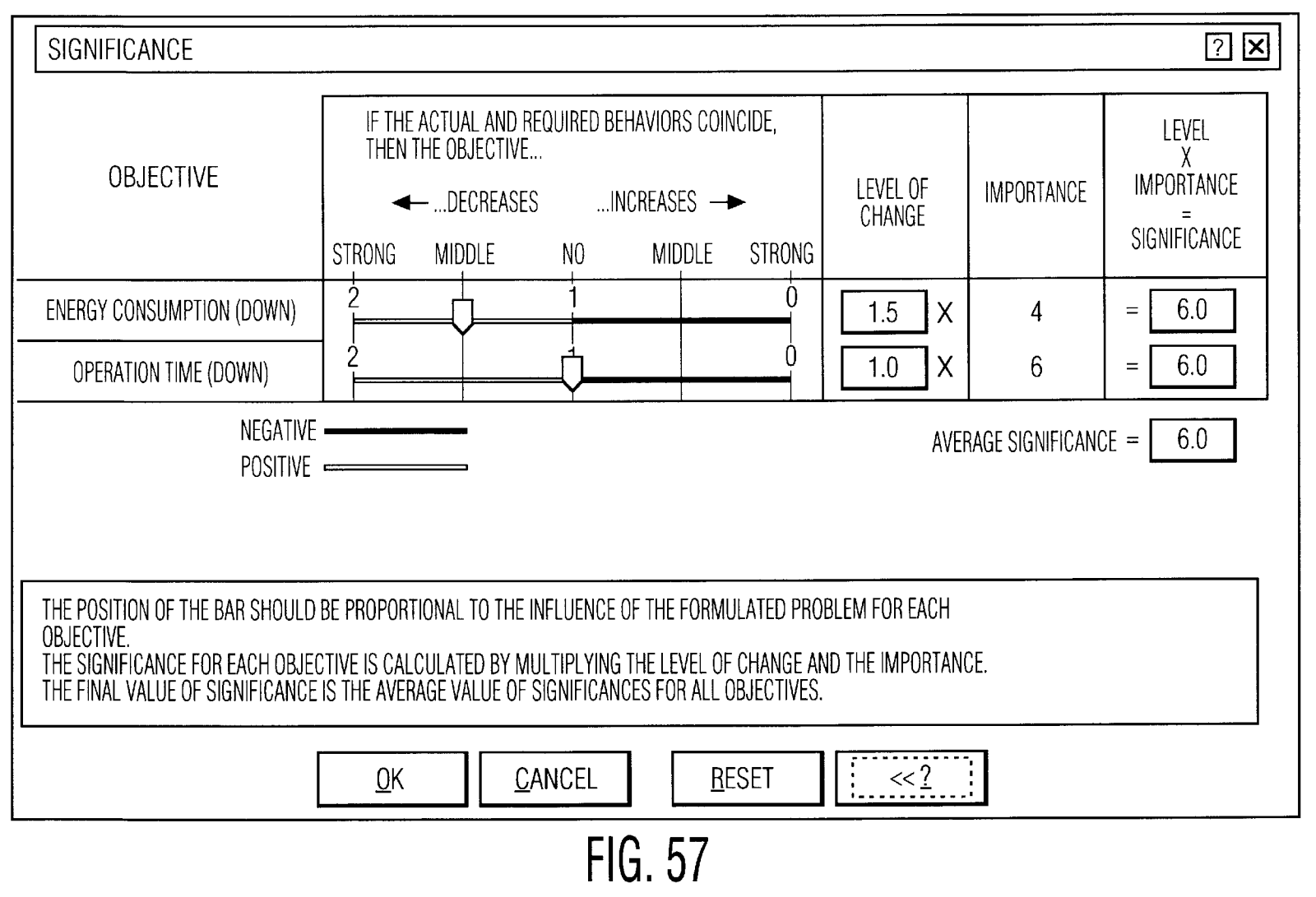

FIG. 57 is a PSA visual device screen illustrating a display for entering data and displaying Link Analysis significance data.

FIG. 58 is a PSA visual device screen illustrating a display for entering data and displaying Function Rank data.

FIG. 59A is a PSA visual device screen illustrating a display for entering data and displaying Problem Rank data.

FIG. 59B is a PSA visual device screen illustrating a display for entering data and displaying cost of each Operation.

Figure 60:
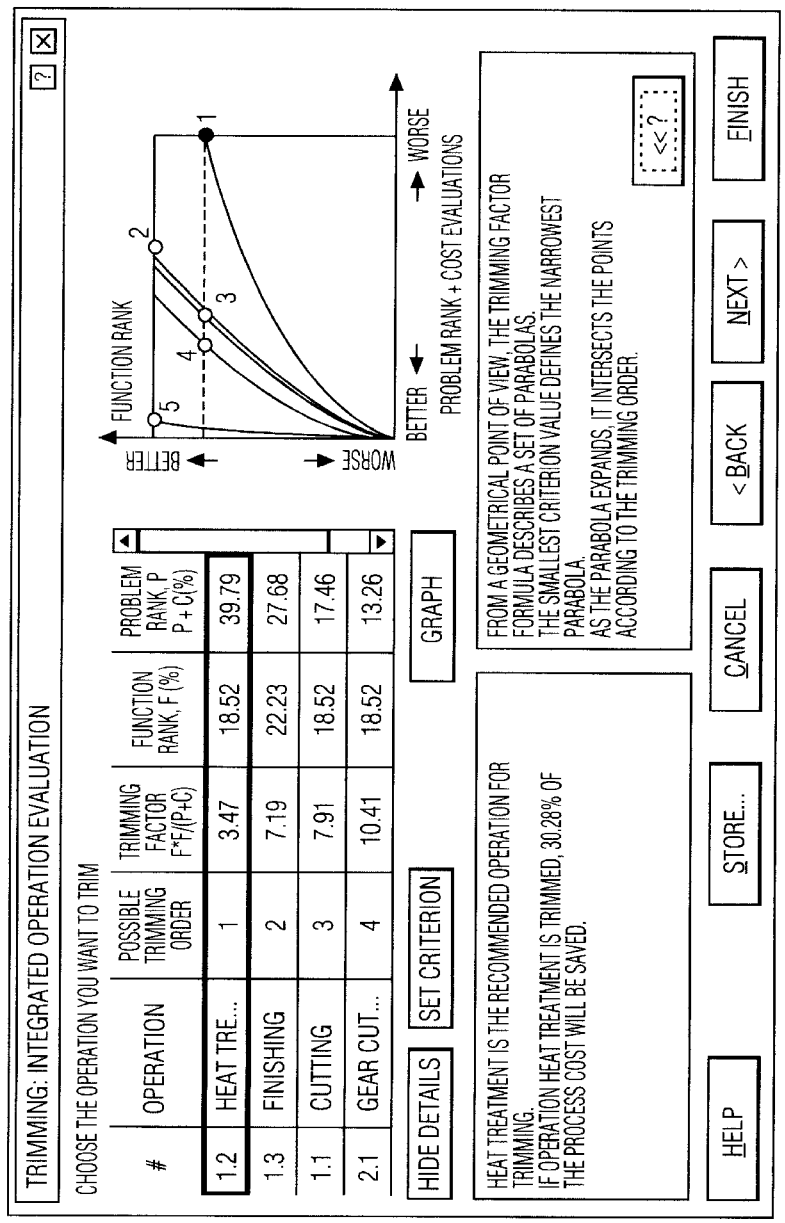

FIG. 60 is a PSA visual device screen illustrating a display for entering data and displaying Integrated Component Evaluation data.

Figure 61:
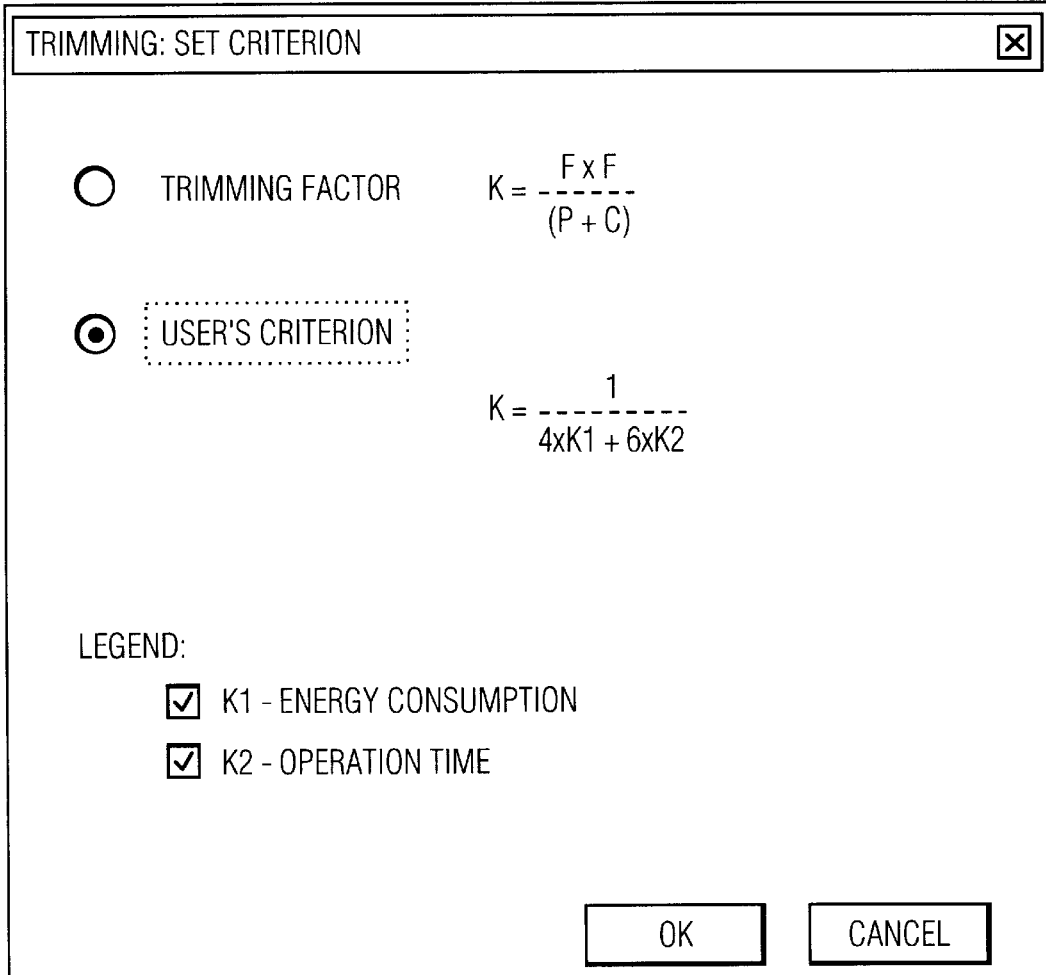

FIG. 61 is a PSA visual device screen illustrating a display for entering data and displaying default and user defined and entered trimming factor ranking algorithm.

FIG. 62 is a PSA visual device screen illustrating a display for entering data and displaying Trimming conditions data including function transfer.

Figure 63A:
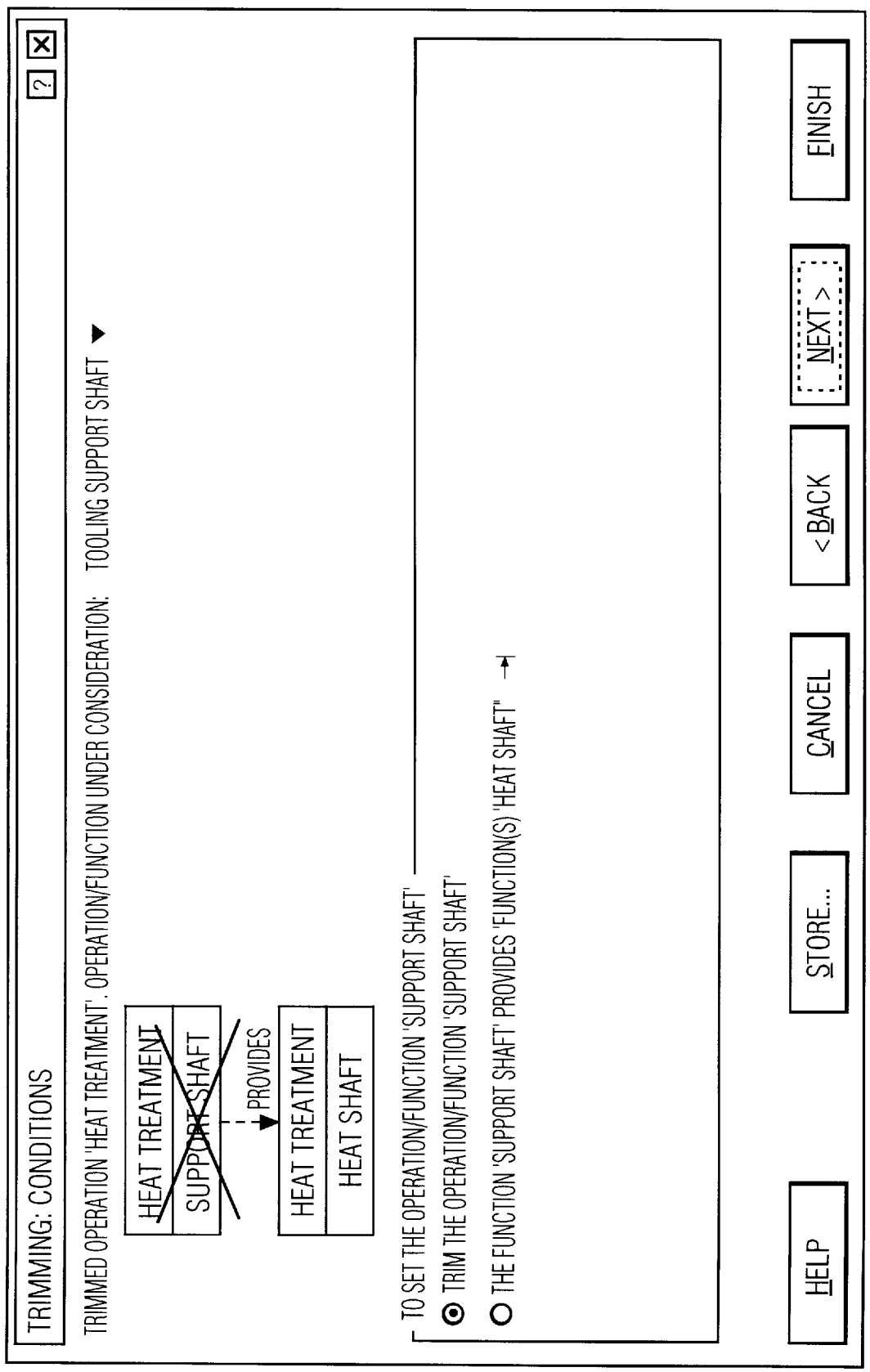

FIG. 63A is a PSA visual device screen illustrating a display for entering data and displaying Trimming conditions data including Trimming data.

FIG. 63B is a PSA visual device screen illustrating a display for entering data and displaying Trimming conditions data including Trimming data.

Figure 64:
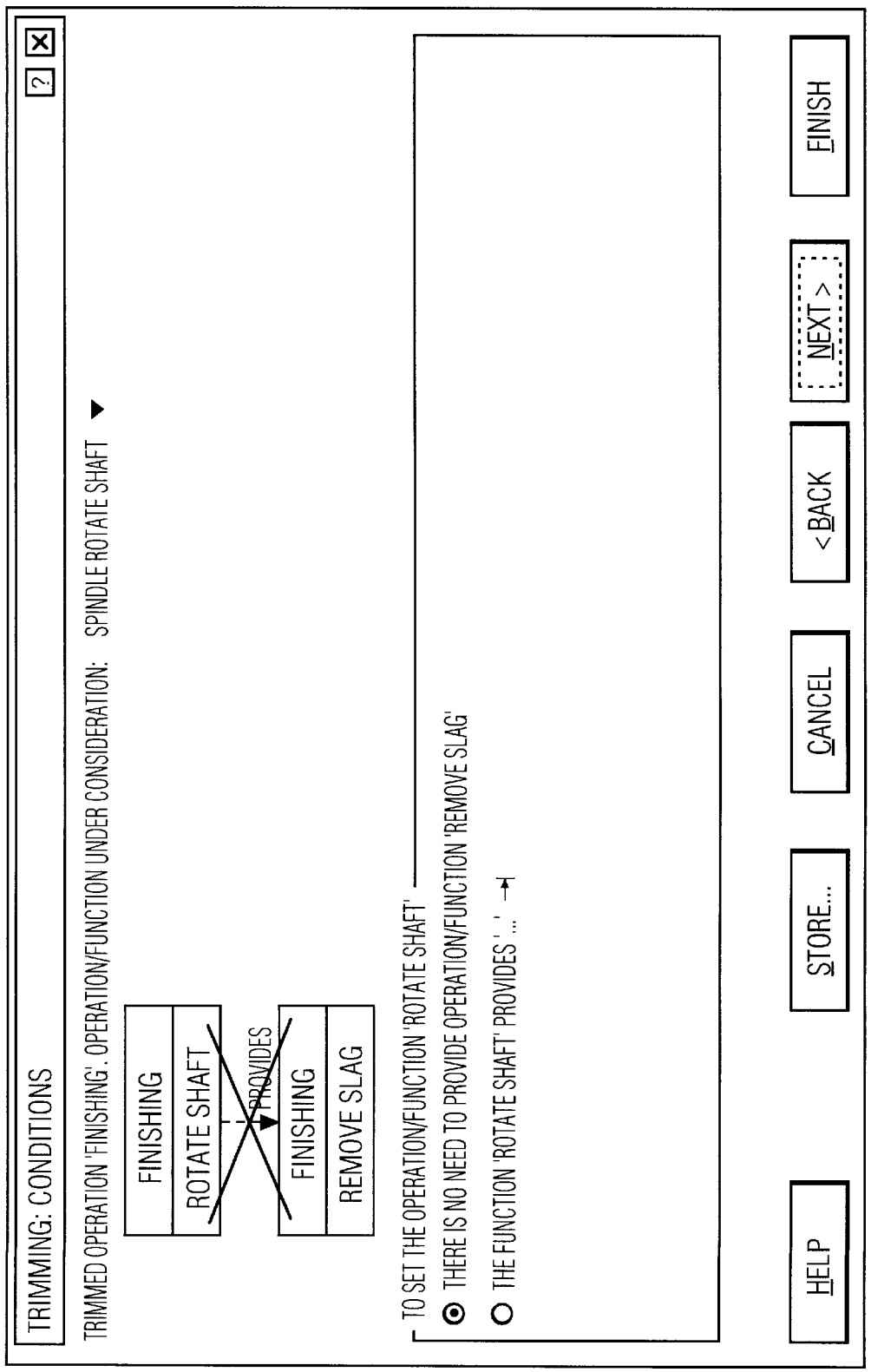

FIG. 64 is a PSA visual device screen illustrating a display for entering data and displaying Trimming conditions data including dropping an action data.

Figure 65:
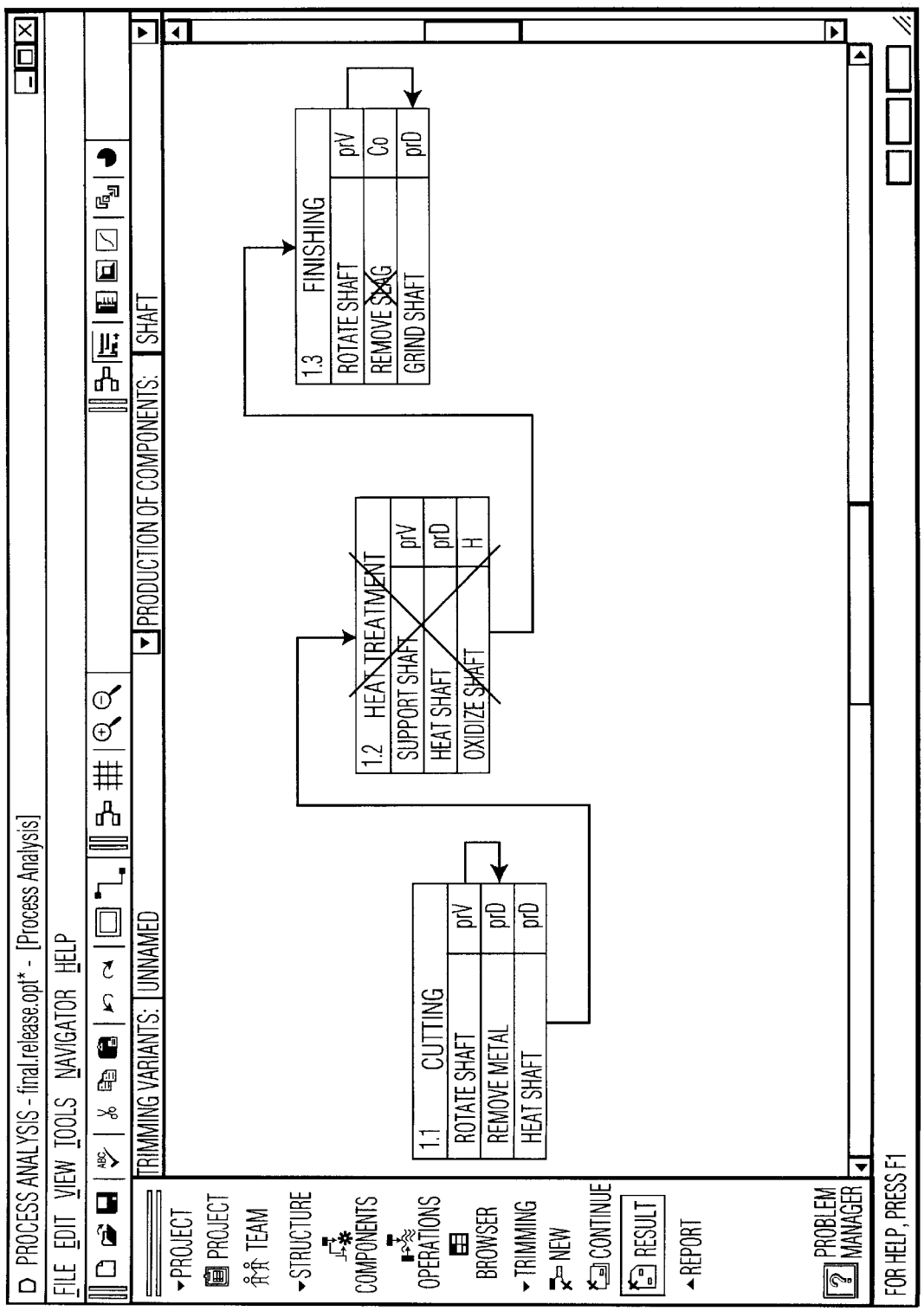

FIG. 65 is similar to FIGS. 51A and 51B illustrating the modified and improved process model with functions transferred, trimmed, and modified.

Figure 66:
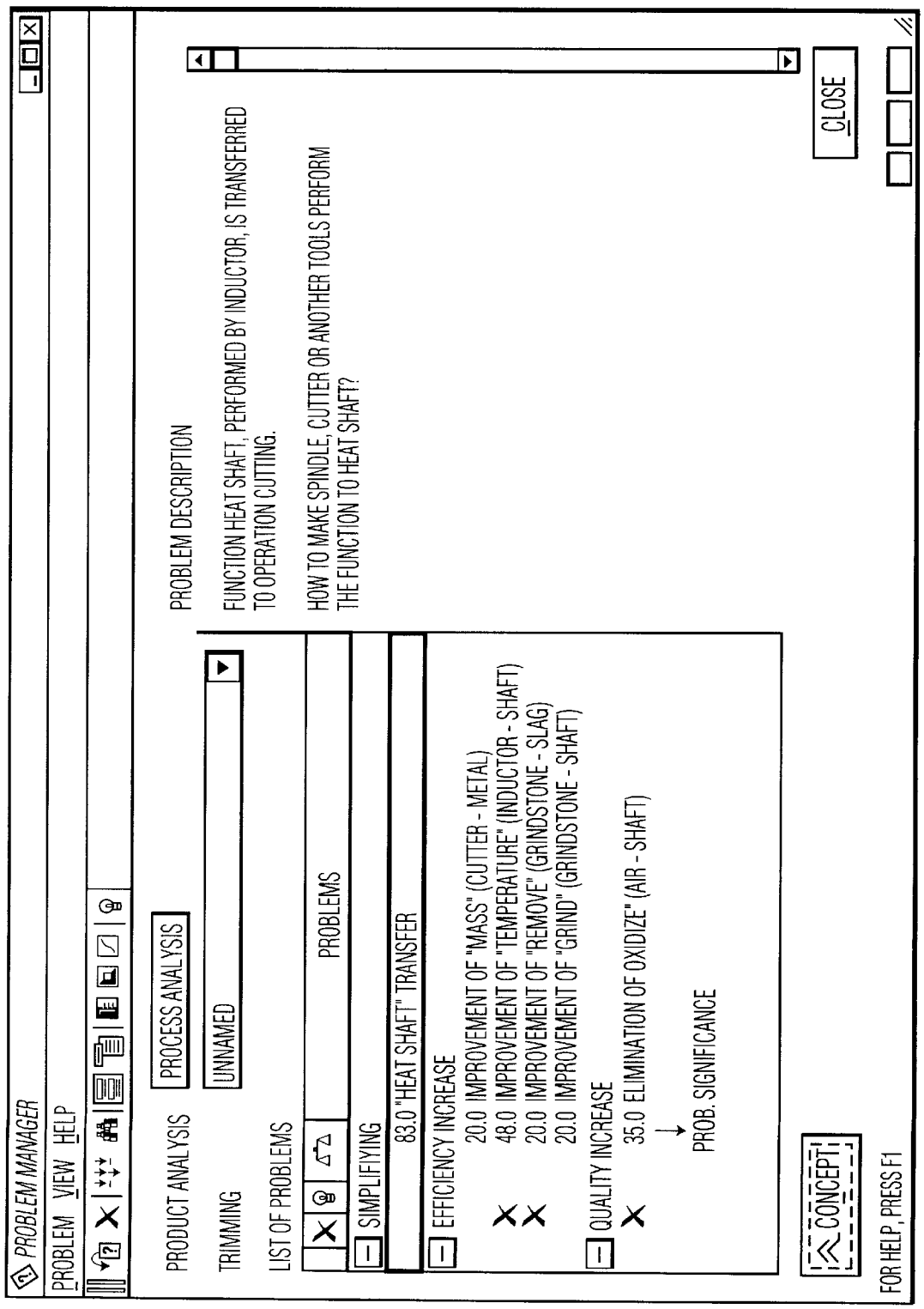

FIG. 66 is a PSA visual device screen illustrating a display for entering data and displaying Problem Manager including problem statements and problem significance data.

DESCRIPTION OF PREFERRED EMBODIMENTS

Figure 1:
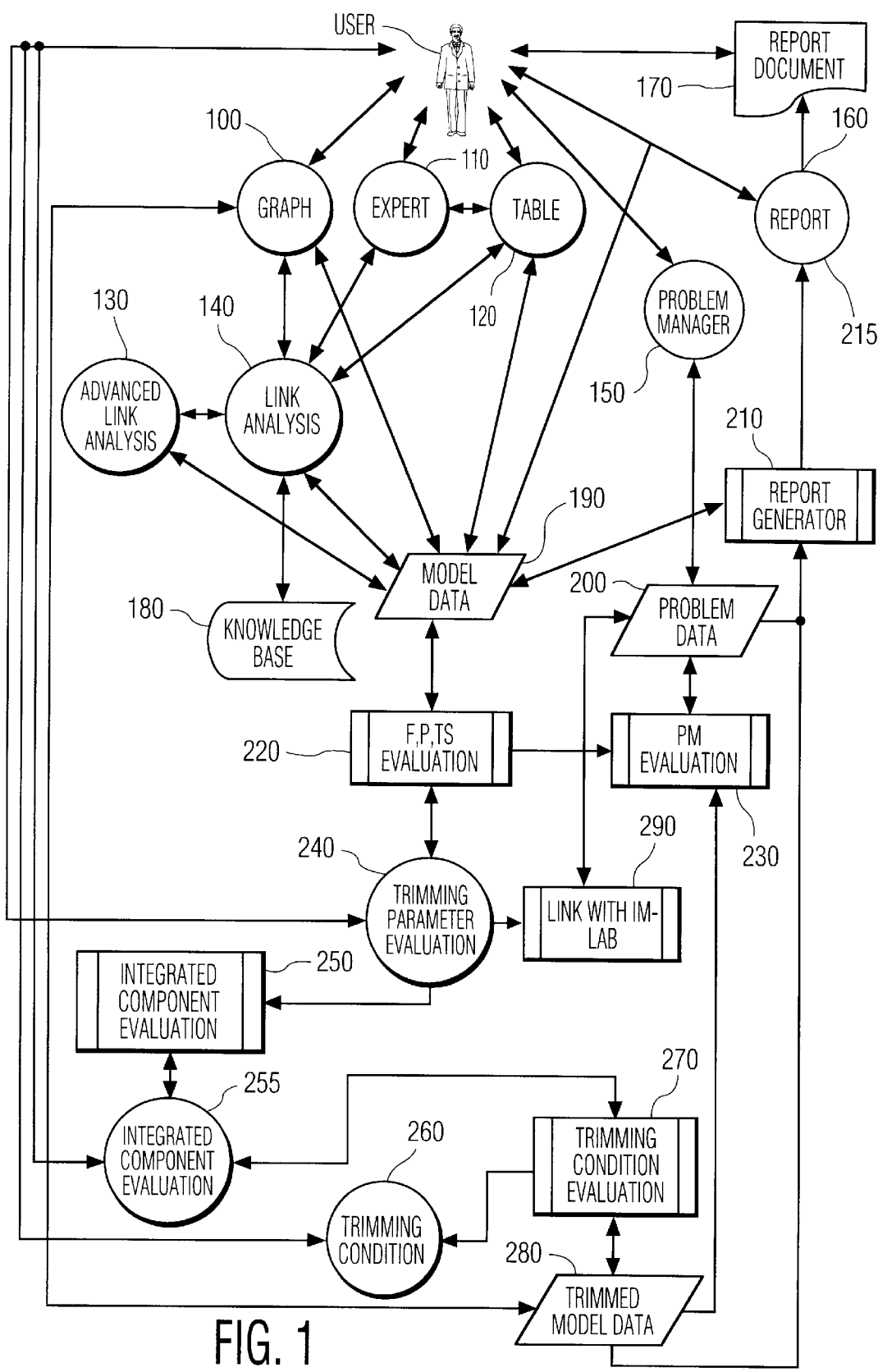
FIG. 1 is a block diagram of one exemplary embodiment of an engineering analysis system (EAS) according to the principles of the present invention.
Figure 2:
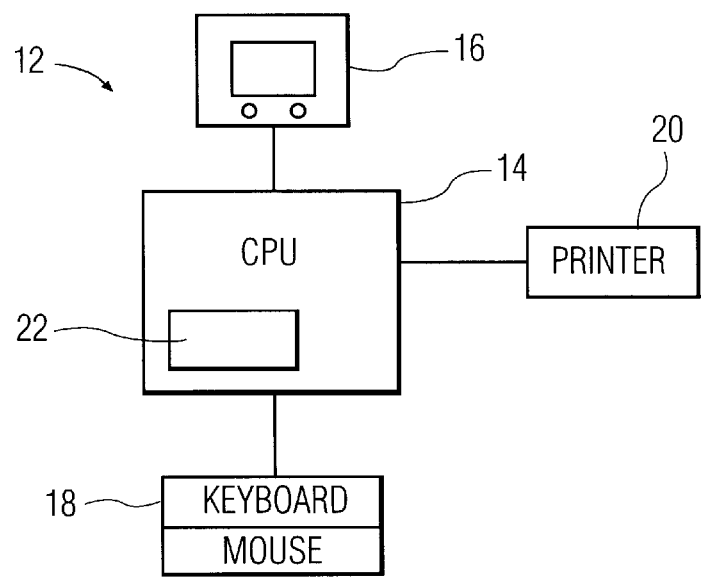
FIG. 2 is a diagrammatic representation of a personal computer which can form a part of the EAS and enable user interaction described below.

With reference to FIGS. 1 and 2, one preferred exemplary embodiment EAS 10 resides on a personal computer 12 that includes a CPU 14, monitor 16, keyboard, mouse 18, and printer 20. The EAS program may be stored on a portable disk and inserted in disk reader slot 22. Computer 12 can be conventional and be of any suitable make or brand. However, minimum performance specification for computer 12 should be Intel 486 with 20 meg Hard Disk available, 4 meg of RAM, 75 MH clock speed. If paper copy of the EAS session is desired, printer 20 should also be provided. Other peripherals and modem/network interfaces can be provided as desired.

Figure 3:
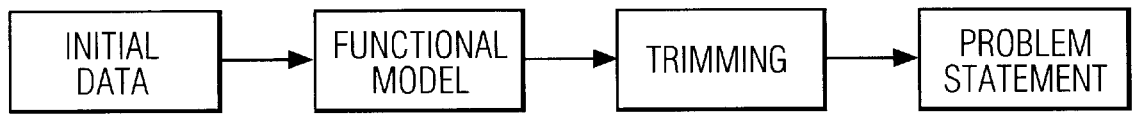
FIG. 3 is a flow diagram of the major sub-sessions or stages of EAS analysis.

With reference to FIG. 1 and the legend in FIG. 3, an EAS session has four main object system analysis stages termed Initial Data, Functional Model, Training, and Problem Solving. As the user develops the session, the user can return to and edit or modify any stage data at any time and the EAS will modify the entire project session accordingly.

The user starts a new session by accessing the EAS. The EAS prompts the user to enter the first stage "Project Data."

The user can enter initial data with use of the keyboard and/or mouse. During the Project Data stage the user enters initial project data to the report unit 215 and report generator 210. Report unit 215 functions to display elements of the final report on monitor 16 and enable the user to edit various parts of the report. Report generator 210 coordinates the project objectives and rank with model data unit 190 and processes the model data, problem data and trimmed model data into results, as described below, and generates the final report for display by report unit 215.

During the Functional Model stage, the user inputs data to graph unit 100. Unit 100 serves to display a graphic representation of the functional model of the object system under analysis. The user draws a symbol such as a box to represent each component of the object system functional model and a line between boxes to represent each interaction between components. Boxes and lines (links) can be labeled on screen and marked as useful or harmful as determined by the user. Supersystems, products, and their links with specific components are also drawn on screen.

If the user prefers, he/she can call up the expert unit 110 that presents a set of dialog boxes that lead the user through a set of table entries in table unit 120. The model data unit 190 will input data to the graph unit 100 and once the entries to table unit 120 are complete, graph unit 100 will automatically draw the functional model for the user.

Conversely, if the user draws the functional model using graph unit 100 and then accesses table unit 120, the functional model will be represented in table form automatically. The user can edit any data of the functional model in either the graph unit 100 or table unit 120 format.

Model data unit 190 is a data storage facility and obtains and feeds data to the many units generally shown in FIG. 1.

As described below, the user calls up a link analysis unit 140 as part of the Functional Model Stage. This unit 140 enables the user to select for each link in the functional model a short description of the action link, such as compress, move, heat as well as its characteristic such as harmful, insufficient, normal, or excessive. This is done for each link in the functional model and the data stored in model data unit 190.

The user can, for any link, implement an advanced link analysis routine in advanced link analysis unit 130 that enables the user to detail the character of the action by means of comparing actual values of an action with required values of the action. These values are also stored in model data unit 190. This advanced link analysis unit 130 enables four different types of data entry for the actual value and required value of an action parameter. These are Value, Time Dependency, Space Dependency, and Parameter Dependency. As described below, Parameter Value data can be represented either as qualitative relative ratio values or as quantitative values. For example, if the action link is "compress" between two components, the actual PSI and required PSI values can be entered in unit 130. In addition, the actual and desired tolerances can be entered such as ±2 psi and ±1 psi, respectively.

The Time Dependency data is entered to unit 130 by the user selecting the actual and desired parameter values over the desired duration of the action. Space Dependency data is entered to unit 130 by the user selecting the actual and required parameter value at various points in the space or distance through which the action occurs. Lastly, the user enters into unit 130 Parameter Dependency data for the actual and required link parameter as it relates to a separate other parameter in the object system functional model entered (named) by the user.

Although the above four detailed analyses are available, the user need not select them all and can select a "not defined" button which removes that analysis from consideration by the EAS.

All user entered Link Analysis and Advanced Link Analysis data is stored to the model data Unit 190.

Once satisfied, the user initiates the Trimming routine stage.

Trimming is a routine for elimination or simplifying a component or action from an object system while retaining its useful function.

An object system usually includes harmful actions or useful actions which are not optimally fulfilled. Every disadvantage presents a problem that should be solved. Also, distribution of functions among the elements might not be uniform. Some of them might perform insignificant functions and others are overloaded with functions.

The EAS Trimming routine provides analyses for the redistribution of functions and elimination of components from an object system while retaining the components useful functions. Components can be eliminated and their functions transferred to other components or supersystem elements. This process increases the function or decreases the cost of the object system or both, thus increasing the object system value.

The following benefits are provided by trimming:

1. If a component is eliminated, all the harmful actions connecting with this component are also eliminated.
2. Trimming the components lowers the cost of the object system since it is not necessary to produce this component.
3. If a component is not trimmed, but one or more functions are transferred to another component, the first component becomes simpler and less costly.
4. The object structure becomes more optimal and uniform.

Trimming conditions are methods of redistributing the useful functions of an eliminated element. Since it is not practical to remove a component performing some useful function, the action of this component should be transferred to another element.

A component can be eliminated if:

1) its action is performed by another component or supersystem element;
2) its action is performed by the component which receives the action;
3) the component which receives the action is also eliminated.

If the trimmed component was affected by another component or supersystem element this action must also be transformed.

There are two ways to transform an action applied to a trimmed element:

1) action can be applied to another element;
2) action can be deleted.

To trim an element, the EAS enables the user to:

1) choose an element for trimming;
2) apply trimming conditions;
3) transform the action.

EAS Trimming routine provides two procedures for choosing an element to trim:

1) use of component evaluation
2) open choice of component

Open choice of component allows the user to choose the component based on the component statistics, analyze the information given by EAS and recommend a decision as to which component should be trimmed. FIGS. 44A–E shows various EAS rules for elimination and transformation and how the trimmed or transformed component or action would be displayed on the functional model and trimmed functional model.

With use of component evaluation EAS suggests the component for trimming. This is based on its standard evaluations of the problem rank (P), function rank (F), and cost (C), of the components, as entered by the user. EAS then creates a graph to illustrate its calculations. When it plots the components on the graph, EAS places the component with the highest functional rank at the top of the vertical axis. The functional ranks of all the other components are calculated as a percentage of this maximum rank. The procedure is the same for the horizontal axis, which shows the combination of problem rank and cost.

As seen below, the user accesses Trimming: Parameter Evaluation unit 240 and inputs data that ranks the importance of the function (for example, on a scale of 1 to 10) of each functional model component and ranks the problem or harmful effect (for example, on a scale of 1 to 5) associated with each component. The cost of each component in terms of the percentage of the overall cost of the object system under analysis is also entered to unit 240. If more than one project team member was entered during the Initial Data routine stage, then all team members (users) must input to unit 240 their concurrences or agreements to this data. Once a consensus is reached, Function, Problem Rank, Task Significance (TS) Evaluation routine unit 220 accepts this data from unit 240. Unit 220 also receives constantly the Functional Model Data from unit 190. Unit 220 calculates and determines the EAS Functional Rank of each component, its EAS Problem Rank and EAS Task Significance as described below and transmits these values to Integrated Component Evaluation routine unit 250. Unit 250 calculates the EAS functional contribution of each component as a percentage relative to the others and the EAS problem and cost ranking again as a percentage. Lastly, unit 250 determines the ranks of candidacy for trimming (elimination) and represents its recommendation for each component, such as "A" "B" "C" or "D", D being the highest ranking for trimming and A being the lowest candidate rank for trimming. Detailed ranking can be represented in graph form with F on one axis and P+C (problem+cost) on the other. The component trimming candidacy rank can be represented by a dot on the graph located anywhere in or on the line between any of four quadrants A–D as described below.

Figure 7:
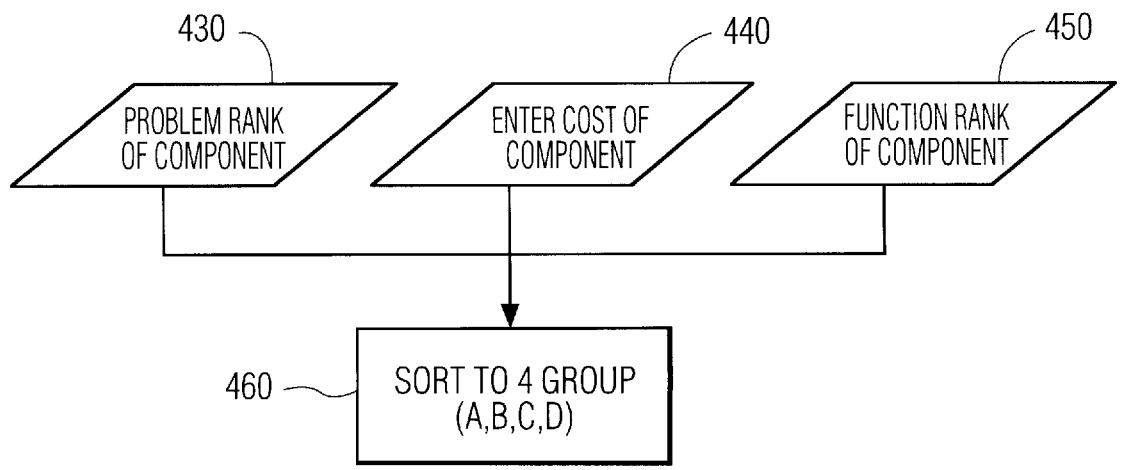
FIG. 7 is a block diagram of the routine for generating the EAS component trimming recommendation.

The Integrated Component Evaluation routine is seen in FIG. 7. Problem rank from unit 220 is entered to unit 430. The user enters the component cost in unit 440 through unit 240. Function rank is calculated in unit 220 as described below and entered to unit 450. Unit 460 receives this data and standardizes the values of F, P and C as a percentage or ratio summing to 100%. The P+C value is then standardized again.

Then EAS unit 250 sorts all components in the object system in accordance with the following table.

|  |  | Level of P + C | |
| --- | --- | --- | --- |
|  |  | Low level of P + C | High level of P + C |
| Level of F | High level of F | A group | B group |
|  | Low level of F | C group | D group |

The unit 250 then recommends to the user ranked components for trimming first from D group, than from C, B, A. If there are several components inside one quadrant, EAS unit 250 suggest first the component with the smallest relation F/P+C.

This information is represented on screen at unit 255 and enables the user to edit the F, P, TS information as desired. The information is also provided to Trimming Condition Evaluation routine unit 270. Unit 270 analyzes the action between two components one of which is to be trimmed and suggests another component to which the trimmed function might be transferred. This recommendation can be edited by the user or accepted or represented further as described below.

Function rank of a component is designated as follows:

Every object system interacts with a supersystem or product. The graphic or table representations of the functional model will display one or a chain of components and links or interactions. The component linked to the product or supersystem has the highest rank and the component furthest from the product or supersystem has the lowest rank. If a component performs several useful actions (such as a piston that both compresses and functions as a valve) the function rank will be calculated as the sum of the action ranks. Harmful actions are ignored in calculating function rank.

Figure 4:
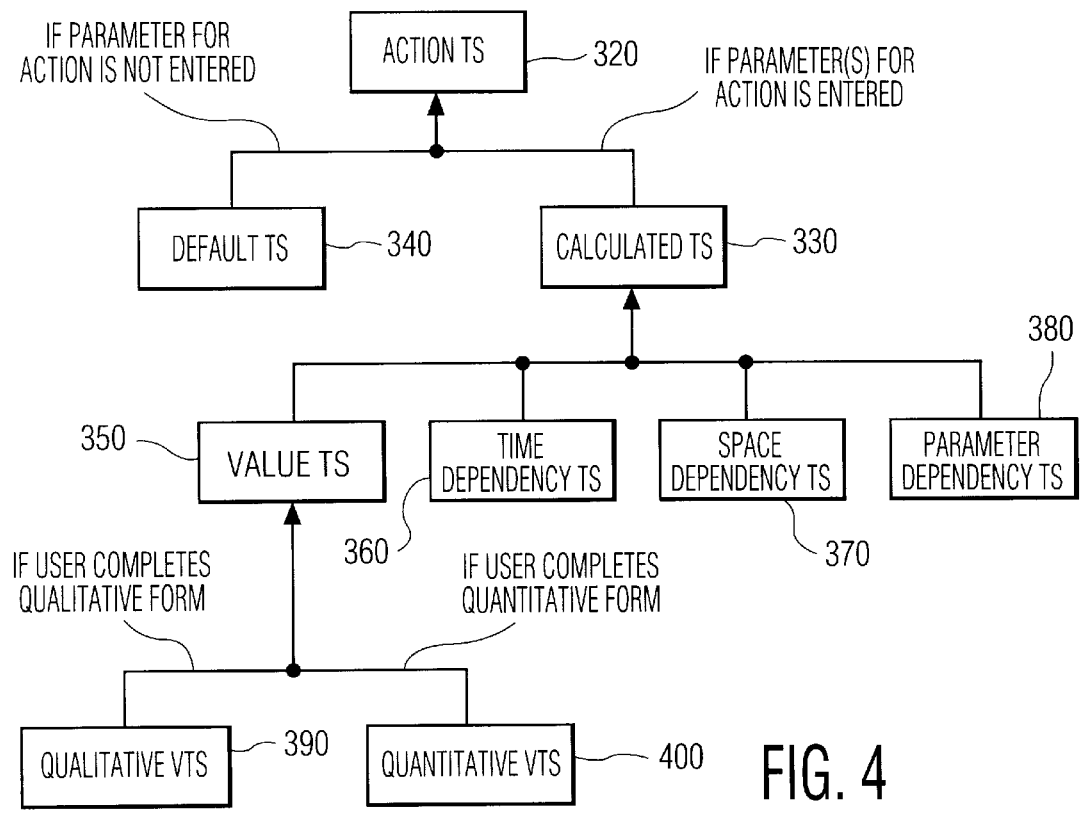
FIG. 4 is a block diagram of the Action Task significance routine.

Task Significance (TS) is automatically calculated in a subroutine of unit 220. The result of this calculation is termed Action Task Significance, see FIG. 4. As seen below, each action can be described by several parameters entered by the user, namely Value TS 350, Time Dependency TS 360, Space Dependency TS 370, and Parameter Dependency 380. When accessing unit 350 the user can select to enter qualitatively through Qualitative VTS (Value TS) unit 390 or quantitatively through Quantitative VTS (Value TS) unit 400. The calculation by unit 350 of Value TS is provided in accordance with the following formula:

$$VTS = k_i \frac{|V_r - V_a|}{IV_r}$$

VTS—value task significance, $k_1$—coefficient of objective importance (If problem is associated with objective, that has high importance, value of coefficients high);

$V_r$—required value of parameter $V_a$—actual value of parameter $IV_r$—admissible deviation of required value.

The calculation by unit 360 of Time Dependency TS, Space Dependency TS and Parameter Dependency TS is provided in accordance with the following formula:

$$DTS = k_i \frac{\sum_{i=1}^{n}(|D_{ri} - D_{ai}|)}{nID_r}$$

DTS—dependency task significance (the formula is similar for all kinds of dependencies);

$k_i$—coefficient of objective importance (If problem is associated with objective, that has high importance as entered by user in Initial Data stage, value of coefficient is high);

$D_{ri}$—value of i-point of required dependency for parameter;

$D_{ai}$—value of i-point of actual dependency for parameter;

$ID_r$—admissible deviation of required dependency;

n—number of point.

The above calculations are for useful actions. For harmful actions, the formulas will be the following:

$$VTS = k_i \frac{|V_{ac} - V_a|}{IV_{ac}}$$

VTS—value task significance, $k_1$—coefficient of objective importance (If problem is associated with objective, that has high importance, value of coefficient is high);

$V_{ac}$—acceptable value of parameter $V_a$—actual value of parameter $IV_{ac}$—admissible deviation of acceptable value.

$$DTS = k_i \frac{\sum_{i=0}^{n}(|D_{aci} - D_{ai}|)}{nID_{ac}}$$

DTS—dependency task significance (the formula is similar for all kinds of dependencies);

$k_i$—coefficient of objective importance (If problem is associated with objective, that has high importance as entered by user in Initial Data stage, value of coefficient is high);

$D_{aci}$—value of i-point of required dependency for parameter;

$D_{ai}$—value of i-point of actual dependency for parameter;

$ID_{ac}$—admissible deviation of required dependency;

i=0 . . . n—current point of dependency;

n—number of point.

Figure 5:
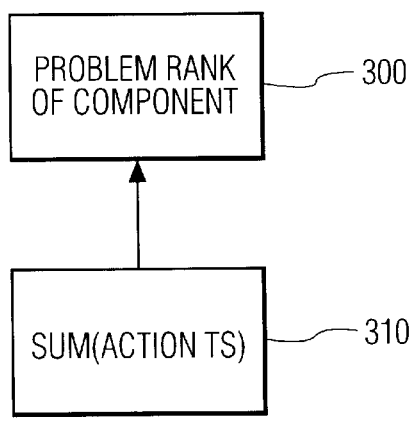
FIG. 5 is a block diagram of the component Problem Rank routine.

Unit 220 also includes a subroutine for calculating the action Problem Rank (P), see FIG. 5. Problem rank is calculated in accordance with the following formula:

$$P = \sum_{i=1}^{n} TS_u + \sum_{i=1}^{m} TS_h$$

P—problem rank;

$TS_u$—task significance for useful action;

$TS_h$—task significance of harmful action;

n—number of useful actions performed by component;

i=0 . . . n;

m—number of harmful actions performed by component;

i=0 . . . m.

The original user-entered Functional Model Data is also entered to Trimmed Model Data Storage unit 280. This Trimmed Model data is modified by or edited by the results data of unit 270. Unit 280 applies trimmed model data to Report Generator 210 that generates Trimming Results data and applies it to Report Unit 160 that presents it on screen to the user. Since unit 210 receives and processes both the Model Data from unit 190 and the Trimmed Model Data from unit 280, the Trimming Result report shows a variety of characteristics of the session object system before trimming and after trimming and a percentage improvement of each characteristic after trimming.

These characteristics can include, for example, the number of components in the session object system, number of harmful actions, total component costs, number of links, number of useful actions, and useful action components.

The EAS anticipates that certain technical problems will need solution in order to trim one or more components from the session object. The EAS automatically formulates and accumulates the problems that should be solved. The number of problems can be rather large. So the EAS calculates their significance and sorts them accordingly. To accomplish this, the Problem Manager routine unit 150 enables the user to input data related to the functional model and the action or components desired to be trimmed. The Problem Manager unit 150 prompts the user to enter a full and short description of the problem and select the problem type such as deviate negative effect or increase useful effect. Further, the user enters the significance, if the component can be trimmed, and the group or type of benefit objective of trimming, such as simplify, efficiency, or quality increase. Each component and action of the functional model is assigned an identifying number by unit 150. Problem Manager data is stored in Problem Data unit 200 and processed by Problem Management (PM) Evaluation unit 230 that receives trimmed model data from unit 280 and task significance data from unit 220.

The Problem Manager routine also aids the user in evaluating different designs of the same component to optimize the design of that component in the object system functional model. For this purpose, unit 150 and unit 230 include a Feature Transfer: Object Data prompt that enables the user to enter the quantitative parameters of two or three different models of the same component (such as the actual and two additional known piston designs) as well as the technical and theoretical limits of each parameter. Unit 230 processes the trimmed model data, F, P, TS data, and problem data and calculates an index or quantitative ranking number for each design model and recommends one of the component design models for analysis and improvement and lists the characteristics to be improved. Unit 230 also generates a Feature Transfer: Recommendation on how to begin the problem solution. For example, a piston leakage parameter is to be improved and a piston with better leakage characteristic had been analyzed, the unit 230 recommends to the user to define the technical effect that enabled the leakage resistance to be improved in the alternate piston. If the user needs help in considering a number of technical effects associated with pistons, the user can select a box that will represent on screen a number of technical effects related to pistons and select the one that contributed to the better parameter achievement by the alternate piston. The unit 150 then formulates the technical problem statement for the user, as described below. This technical problem statement is presented to the user through unit 150 and it and all problem data is entered in Report Generator unit 210. Problem data is also conveyed to a problem solving model interface 290. The technical problem solving module can be the above mentioned Invention Machine Software.

Figure 6:
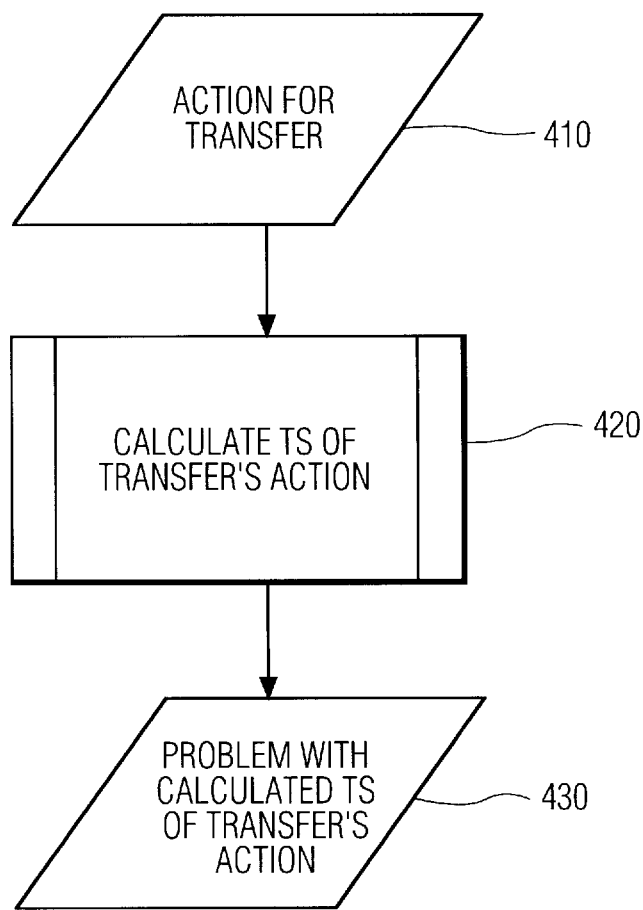
FIG. 6 is a block diagram of the routine for calculating a task significance for a new technical problem arising from a EAS recommended Action for Transfer.

With reference to FIGS. 1, 6 and 7, Problem Manager routine unit 230 can process two types of problems:

1—problems related to actions between elements (action problem)

2—problems associated with trimming procedure (trimming problem)

Action problems are processed in unit 230 using the Action TS data from unit 220 as described above. Trimming problems are identified or connected with a trimmed component. If the component is trimmed the problem connected with that component should not be solved.

The following rules apply to component trimming in unit 270:

Component can be eliminated if:
1. its action is performed by another component or supersystem element;
2. its action is performed by the component which receives the action;
3. the component which receives the action is also eliminated.

If the trimmed component was affected by another component or supersystem element this action also must be transformed. There are two ways to transform an action applied to a trimmed element:
1. action can be applied to (transferred) another element;
2. action can be deleted.

The user chooses one of the trimming conditions through unit 150.

If the Action can be transferred, then the subroutine of FIG. 6 is run in unit 230. Here unit 230 calculates the sum of the problems of I group associated with the component (box 420) and generates a new problem of action transfer with significance equal to this sum (box 430).

Figure 8:
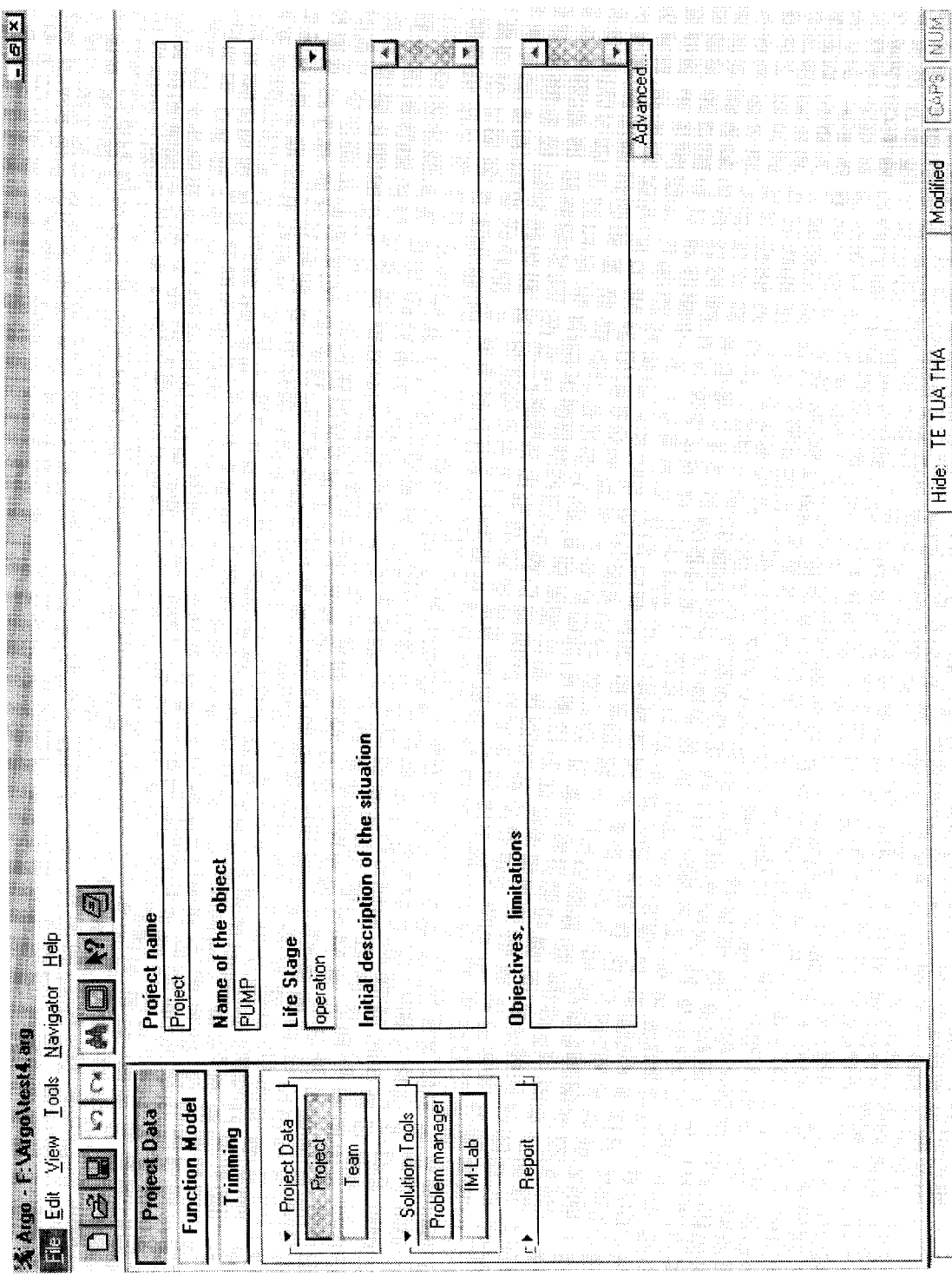
FIG. 8 is a visual display device screen illustrating a display for inputting data and displaying initial project data.

The detailed process steps for a typical EAS session will now be described using a water pump as an example of an object system. As stated above and with reference to FIG. 8, a session begins with EAS prompting the user to enter certain basic information into a Project Data File, such as Project Name; Name of engineering system for re-design, such as "PUMP" in this example; Life Stage of the Pump, selected from a menu such as developmental, operational, or maintenance; Initial Situation Description, such as "Pump has low value because of high maintenance from frequent clogging and corrosion;" and Objectives, Limitations, such as "reduce clogging and corrosion without significant increase in pump cost."

Figure 10:
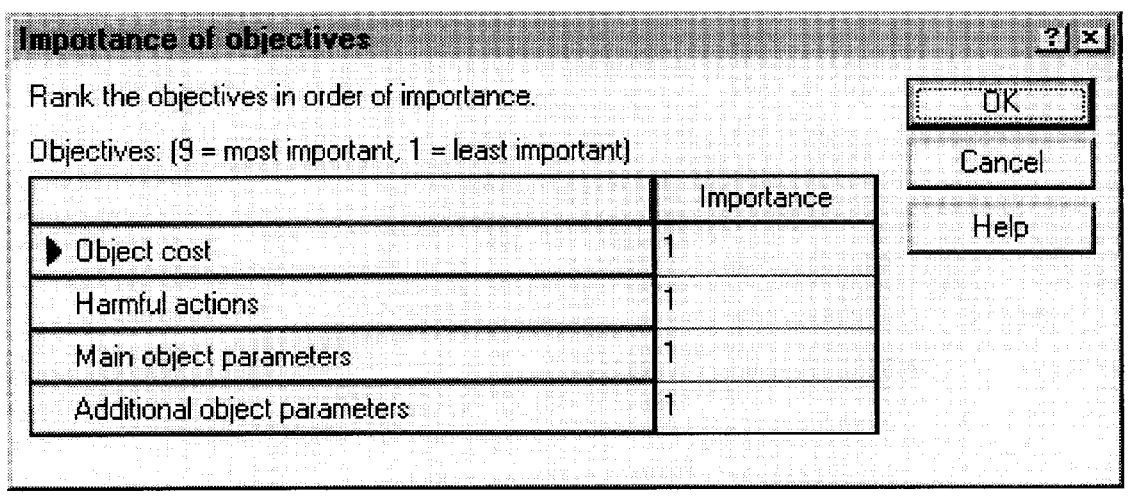
FIG. 10 is a visual display device screen illustrating a display for inputting data and displaying further advanced project data.

If Advanced button is selected, FIGS. 9 and 10, the EAS will prompt the user to optionally enter detailed objectives such as the unit of measurement, the current value, the desired value, and whether the value should increase or decrease as a session objective. This Project Data field provides a list of possible objectives and limitations. The user may select the items from this list which apply to the current project. This list may also be customized by the user using add and remove buttons. Each of the categories for the objectives and limitations should be ranked according to their importance. EAS will use this ranking later when it calculates which problems are most urgent and which components can be trimmed.

Figure 11:
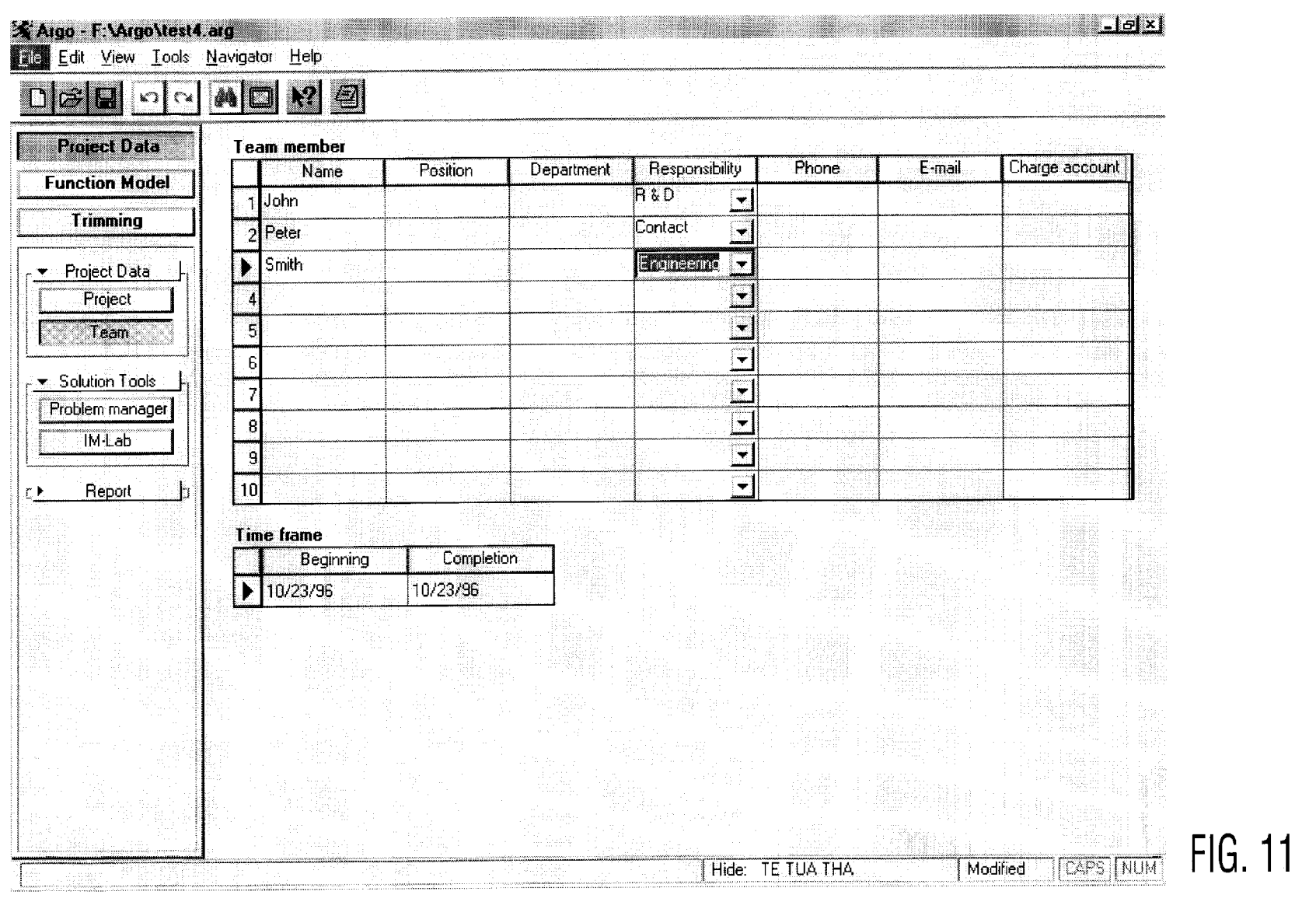

If team members are to work on the project, they can be listed in the team file, FIG. 11, and a final report can only be generated with the computer concurrence of all these members.

The first step in using EAS to analyze an object system is to draw an object structure. The components (parts of the object) will be shown on screen. Each object system has a hierarchy and is decomposed into units; the units are decomposed into parts and so on. It is preferred to start the analysis on the highest level of the hierarchy. If necessary, EAS can analyze the lower levels of the hierarchy simply by breaking components into sub-component. The interaction of the object with the elements of the environment, products and supersystem elements, should also be shown.

Accordingly, the EAS prompts the user to open a second file called Functional Mode in which the user can input data and the EAS will display the object system functional model. The user can select a Graph mode FIG. 12 or Expert step-by-step mode. In the graph mode, the user defines (draws boxes and labels them) every subassembly or component in the object system, such as the cylinder, piston, valve and lever of the pump. The pump product "water" 14 is also identified along with the supersystem "Air" 10 and "Dust" (meaning dirt) 12.

Once all such elements are represented, the user enters all useful interactions between elements such as "compress" between piston image and water image and "direct" between the cylinder and piston images and "move" between the lever and piston images. Also, the EAS enable the user to represent harmful effects of element interaction such as "clogging" between the dust and valve images and "corrode" between the supersystem air image and the cylinder image. The interactions can be represented in different colors such as blue or black for useful and red for harmful.

Figure 27:
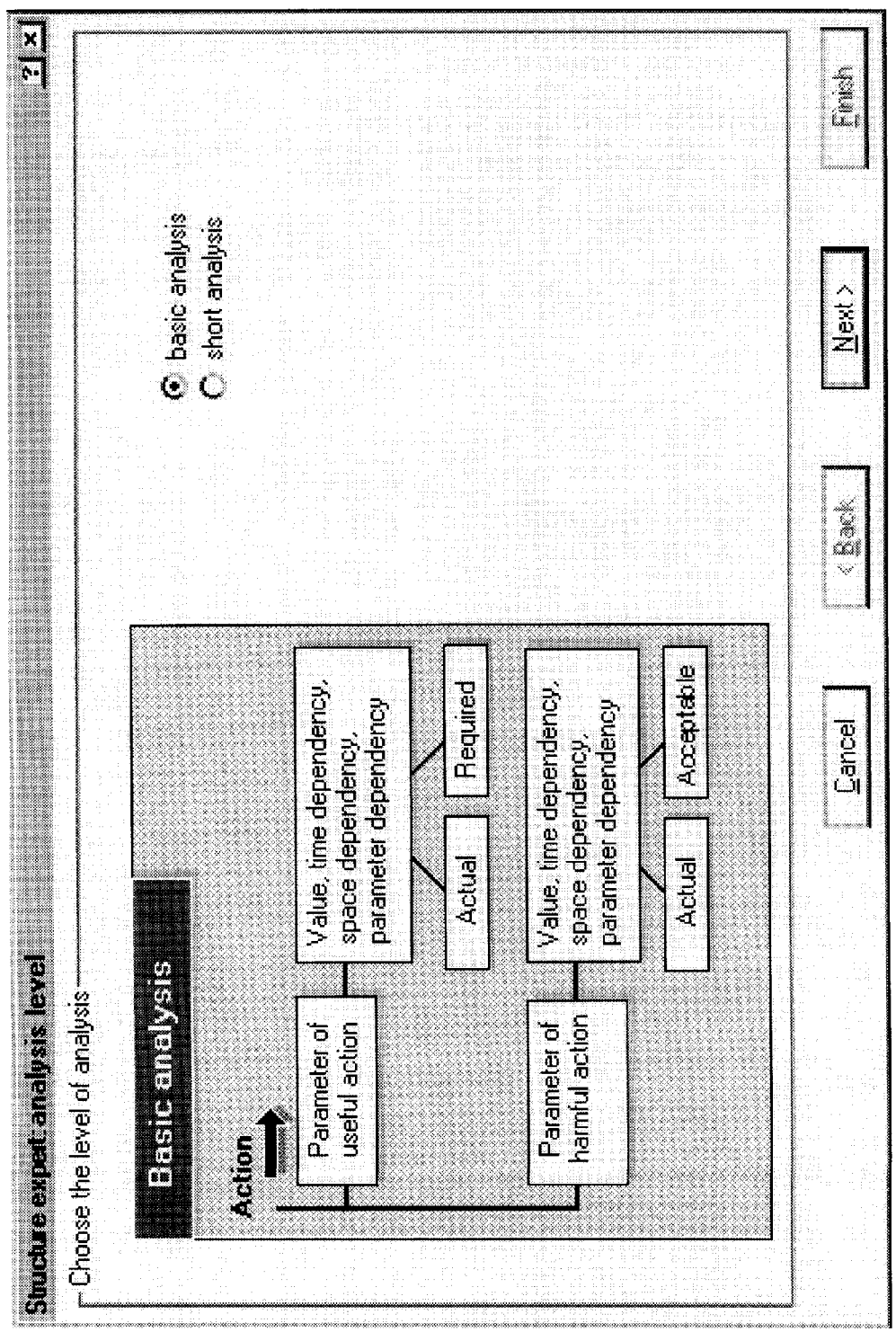
FIG. 27 is a visual display device screen illustrating a display for inputting data and displaying the expert mode analysis level.
Figure 28:
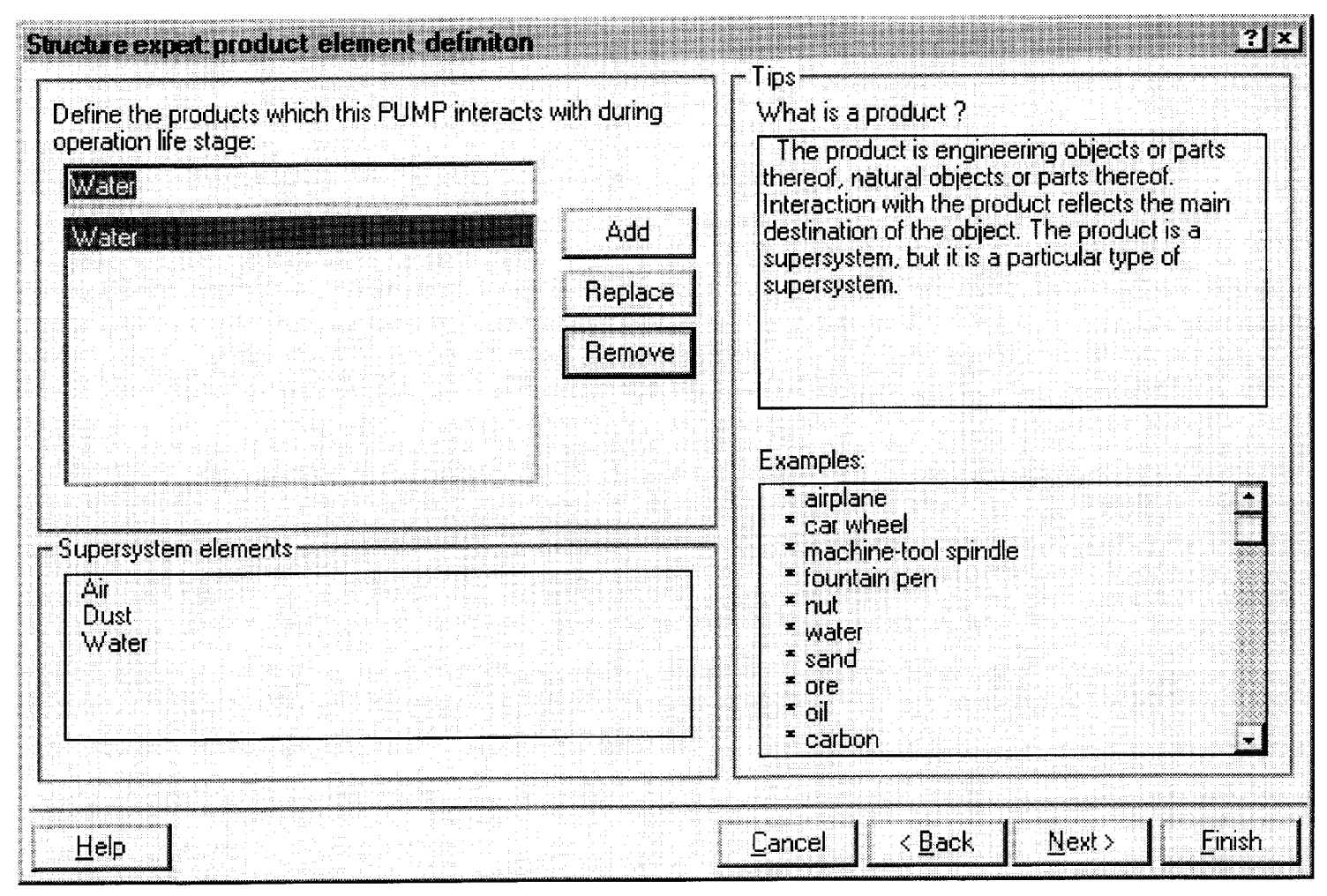
Figure 29:
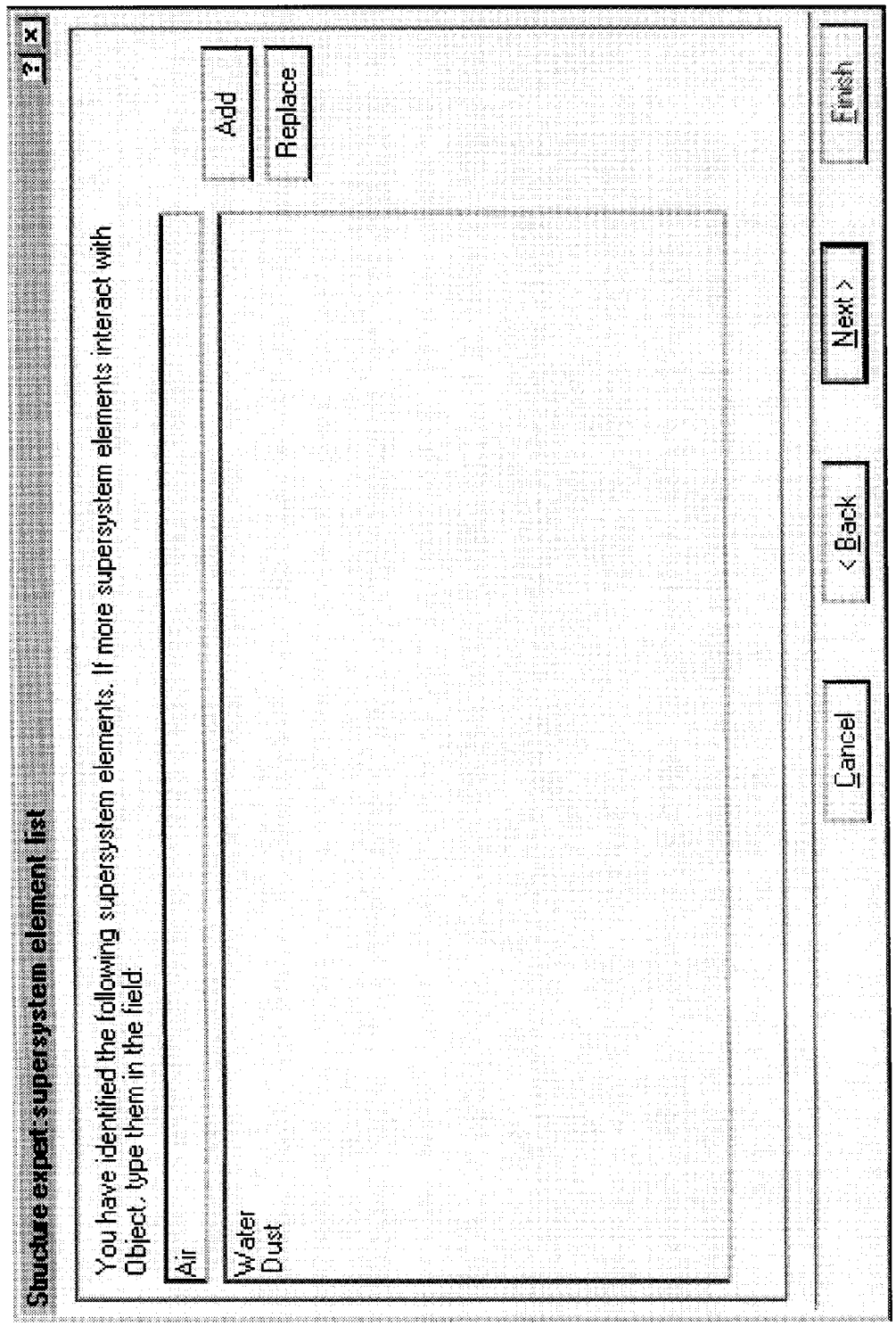
FIG. 29 is a visual display device screen illustrating a display for inputting data and displaying the expert mode supersystem element list.
Figure 30:
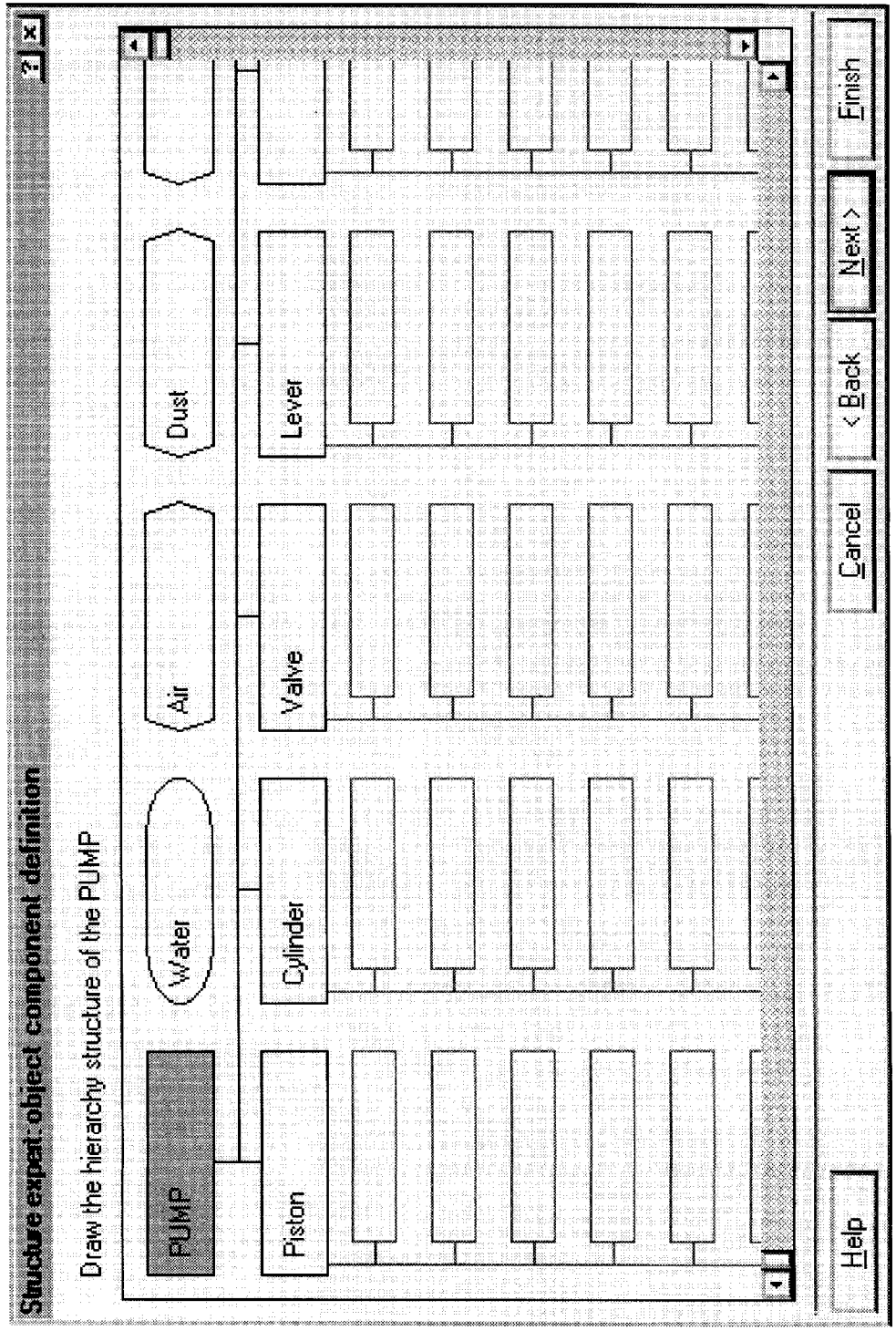
FIG. 30 is a visual display device screen illustrating a display for inputting data and displaying the expert mode object component definition.

If the user is a beginner in analysis or if the user likes a step-by-step analysis, then the user can select the Expert mode and the EAS units 110 and 120 will initiate a routine to provide a series of dialog boxes in table form that leads the user through the data entry steps described above. This routine enables an alternate method of inputting the functional model data as described above. The first dialog box displayed for Expert is shown in FIG. 27 in which the user can select a "basic" or detailed and advanced analysis or a "short" or less detailed analysis. If the short analysis, no information about harmful actions will be permitted by the EAS, but parameters, values and dependencies can be entered for useful actions. Once the analysis mode is selected a dialog box, FIG. 27 enables the user to enter the supersystem product or media with which the object system produces or interacts. In the example below the object system (pump) interacts with the product "water" so water would be entered. Next the Expert routine displays a dialog box, FIG. 28 calling for entry of additional supersystem elements, such as air, dirt, or other environmental elements which interact with the object system. Each element is added to the dialog box by the user. Next, the Expert routine displays a dialog box showing boxes arranged in a hierarchy, see FIG. 29. The names of the object system and product and call other supersystems automatically appear in the top row of boxes. The user enters each major component in the next row of boxes and, if desired, each sub-component in the boxes below a component. All data in this dialog box can be edited as desired and previous screen data will be changed accordingly.

Figure 31:
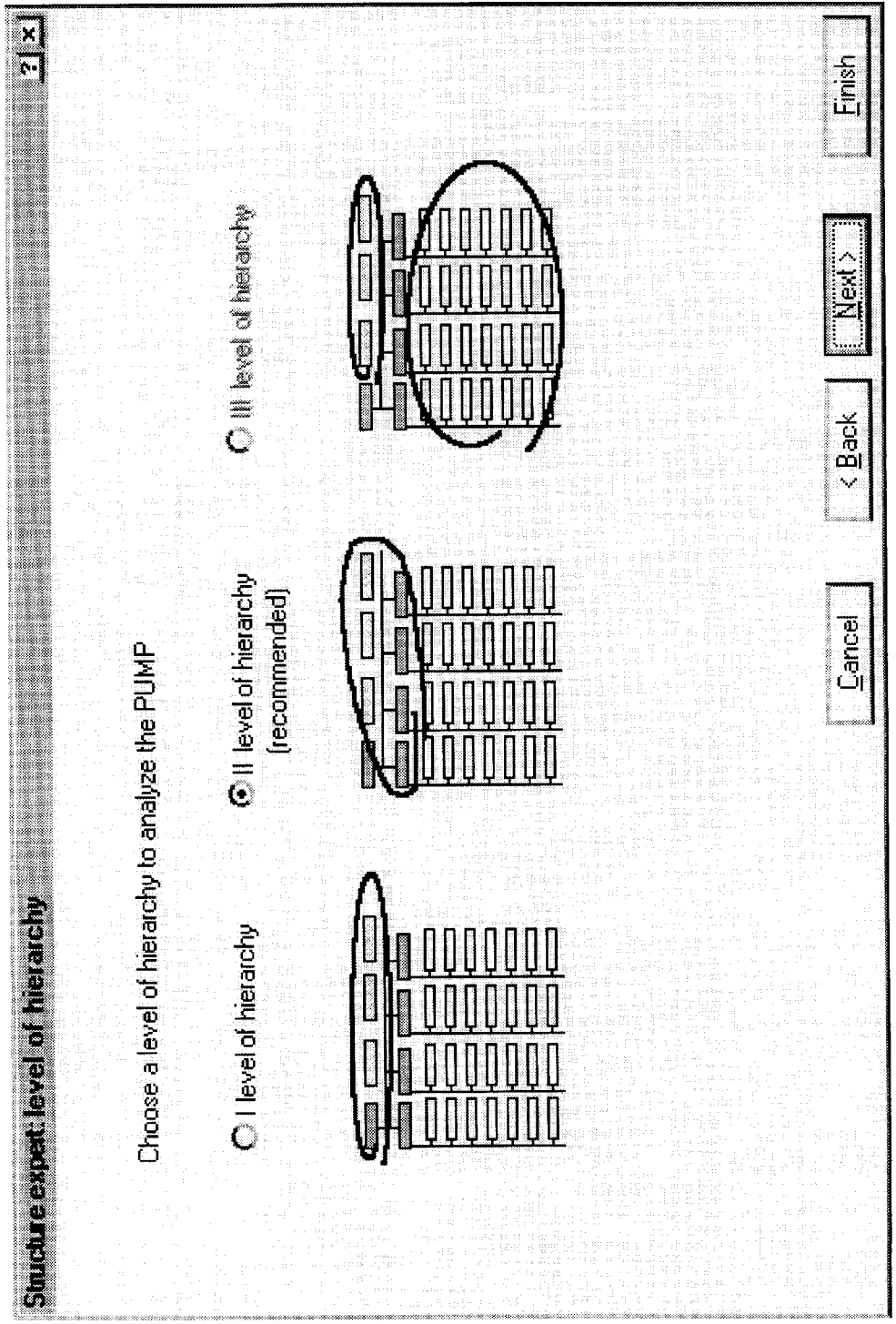
FIG. 31 is a visual display device screen illustrating a display for inputting data and displaying expert mode level of analysis hierarchy.

Next the user chooses a level of hierarchy to be analyzed. The I level simply enables the EAS to analyze the level above the component level. The II level enables a first component level analysis and the III level enables all levels to be analyzed. See FIG. 31.

Figure 32:
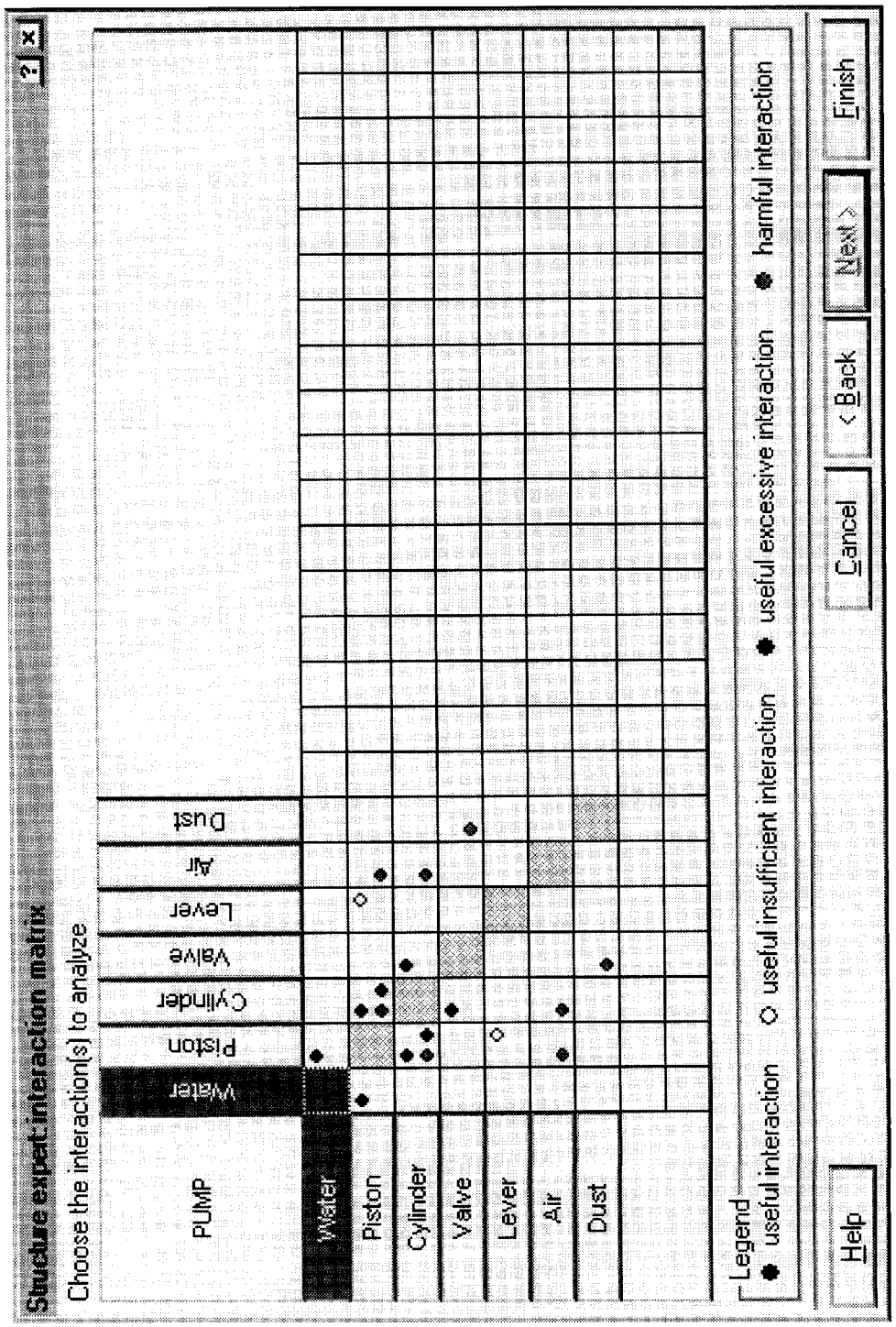
FIG. 32 is a visual display device screen illustrating a display for inputting data and displaying expert mode matrix of interaction.

The Expert routine next displays a legend of interaction among all components, elements and products and displays a legend of four interactions across the lower portion of the matrix. See FIG. 32. Note all components, elements, and products appear along both X and Y axis. The user can click on any intersection, box for X and Y entries, select any ones of the four interactions along the bottom and then click on one of the element names to save the interaction selections. These selected interactions will appear in the respective box intersection as shown in FIG. 32. Interactions can be deleted (edited) from a box by clicking on one of the axis entry names, then clicking on the action to be deleted. All interactions within all boxes can be entered in the same way. Note the four interactions include "useful", "useful insufficient", "useful excessive" and "harmful", each being associated with a different symbol or color, preferably red for harmful.

Figure 12:
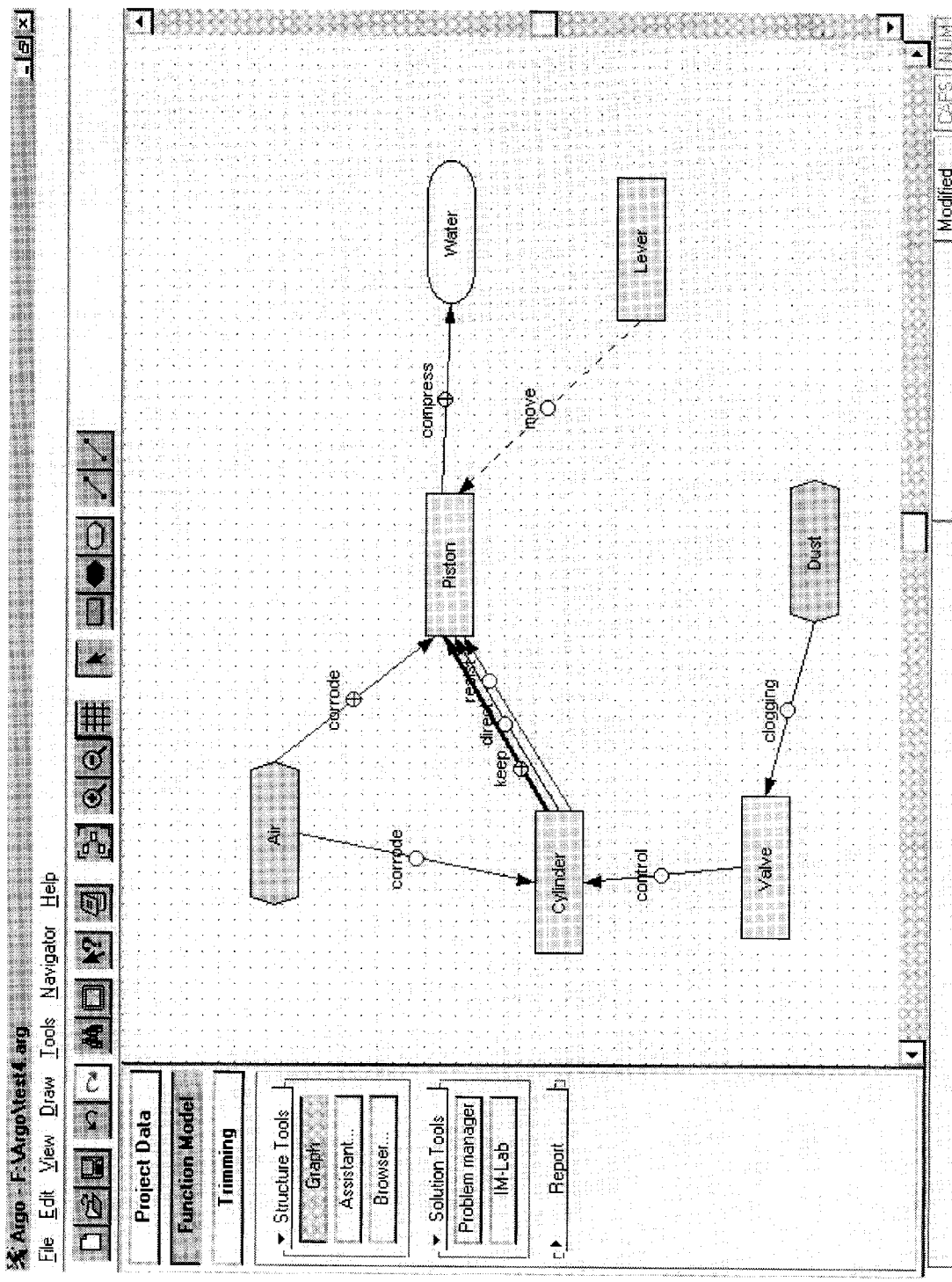
FIG. 12 is a visual display device screen illustrating a display for inputting the data and displaying the graph mode functional model of a water pump as the object system.

Once the above data is entered, the user can click on Finish to save to Model Data unit 190 and click on Browser that displays the table of FIG. 33. Here the user can enter each action name between each product, component, and/or supersystem and enter the Rank of interactions as harmful (H) or basic (B), auxiliary function rank $A_1, A_2 - - - A_n$, enter the parameter to be analyzed as described below and the value or dependency discrepancy as described below. This data is stored in unit 190 and at this point the functional model can be displayed by the EAS via unit 100, see FIG. 12, and the user is ready to implement the Link Analysis and Advanced Link Analysis described below. After entering the data on tables and the like, the EAS will automatically draw the diagram of the object system as shown in FIG. 12. It will be noted that more than one action can be entered between components, such as the three different actions shown in FIG. 12 between "cylinder" and "piston".

Figure 13:
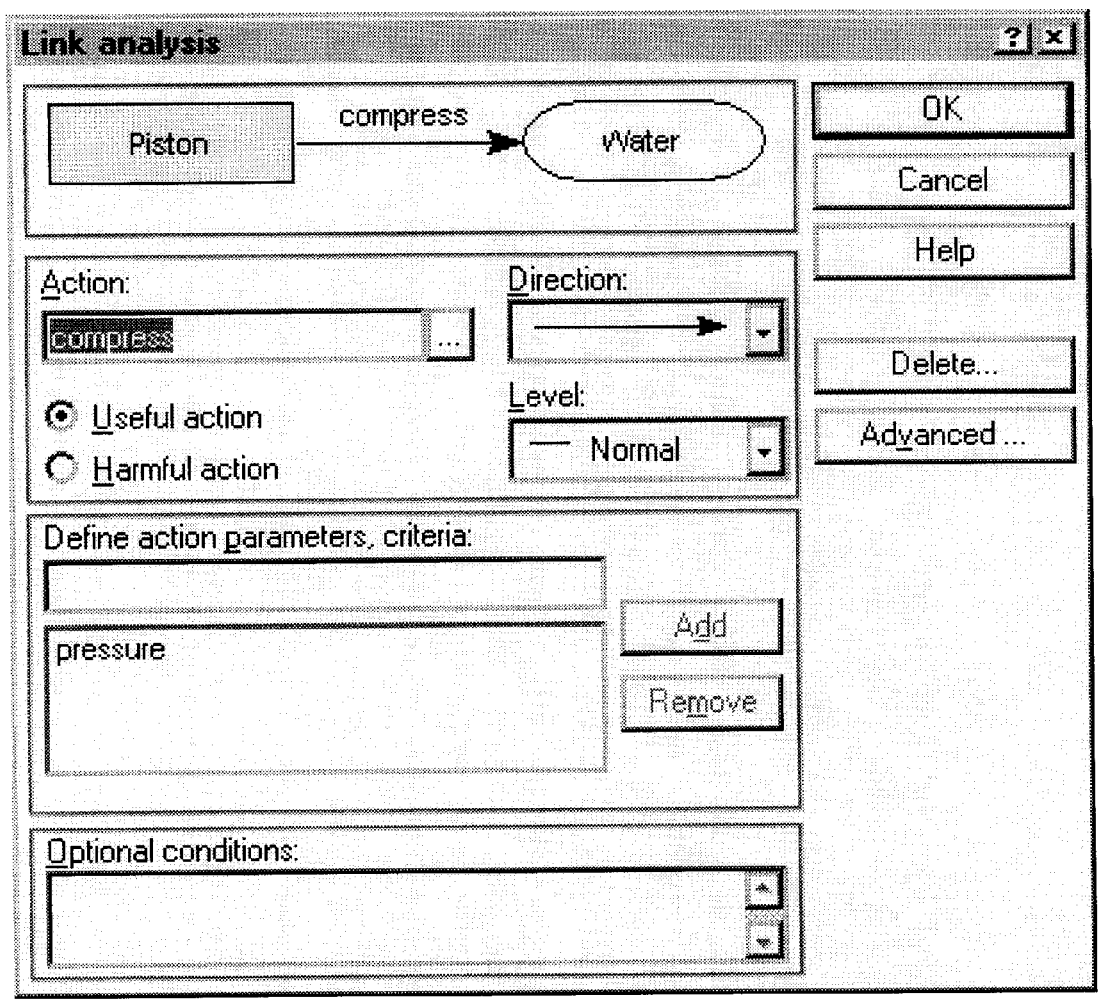
FIG. 13 is a visual display device screen illustrating a display for inputting data and displaying link analysis for the functional model of FIG. 12.

The EAS Functional Model can then prompt the user to perform a Link Analysis followed by an optional Advanced Link Analysis, so that each link or interaction between all elements are examined one at a time. The Link Analysis presents to the user the image of two elements and the selected link or interaction between them. See FIG. 13 that shows the user data input capability for the analysis of the "compress" interaction between piston and water of the present session. The Link Analysis prompts the user to identify the link as harmful or useful, the level rank of the function of the interaction to the overall function of the object system. This Level includes the user choices Excessive, Normal, and Insufficient and represents the first or basic level of link analysis. If more detailed analysis of the link is desired, the user enters the parameter(s) to be entered and selects Advanced. See FIGS. 13 and 14. The Advanced Link Analysis lists each parameter, e.g. "pressure", and prompts the user to initiate data entry for the following EAS analysis:

Quantitative Value
Time Dependency
Space Dependency
Parameter Dependency

Figure 14:
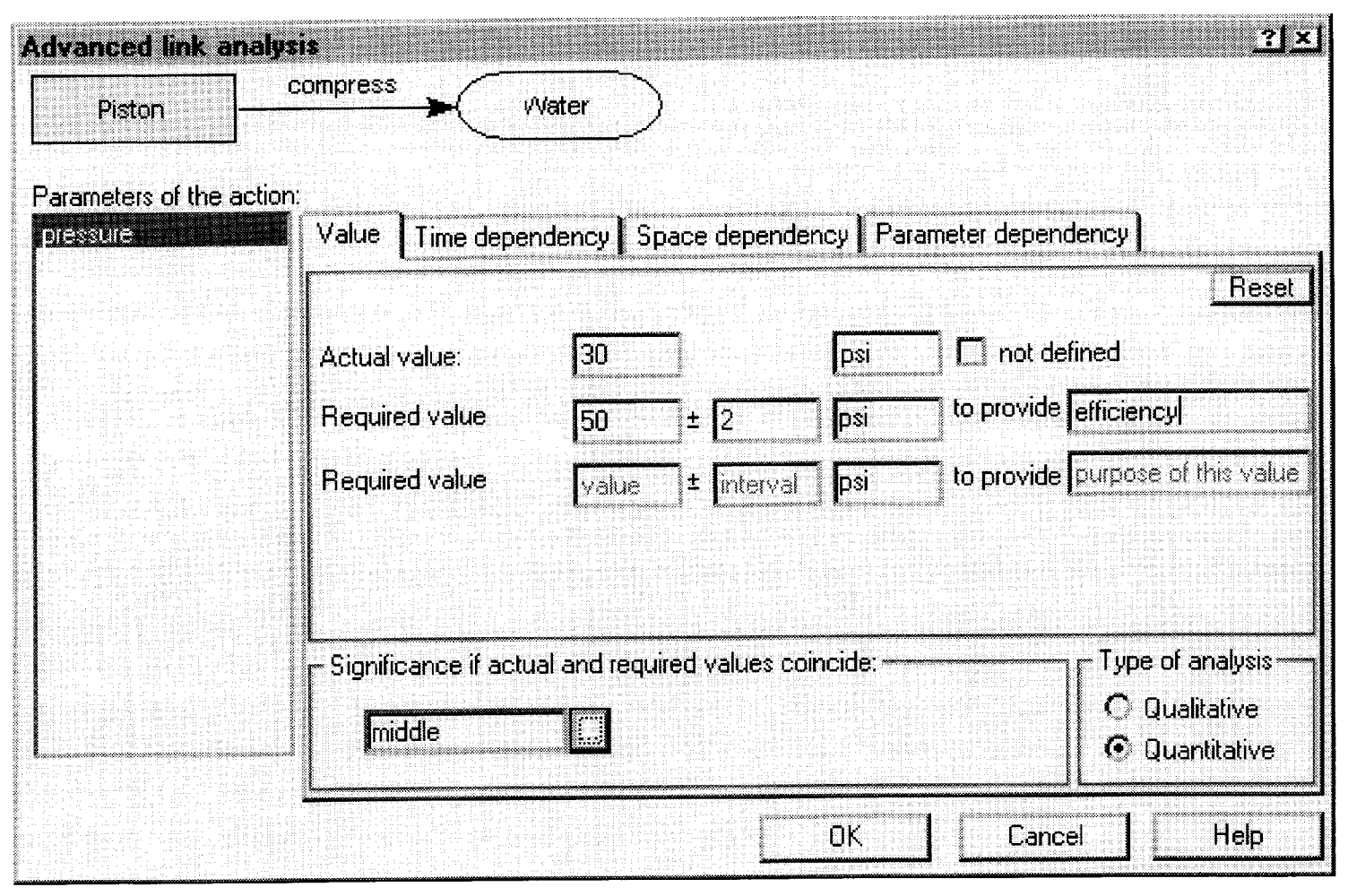

In the example session, see FIG. 14, Value screen prompts the user to indicate the qualitative or quantitative nature of the value and input the actual pressure value, the required pressure value plus or minus the tolerance. High, middle, or low significance of this value can also be selected.

Figure 15:
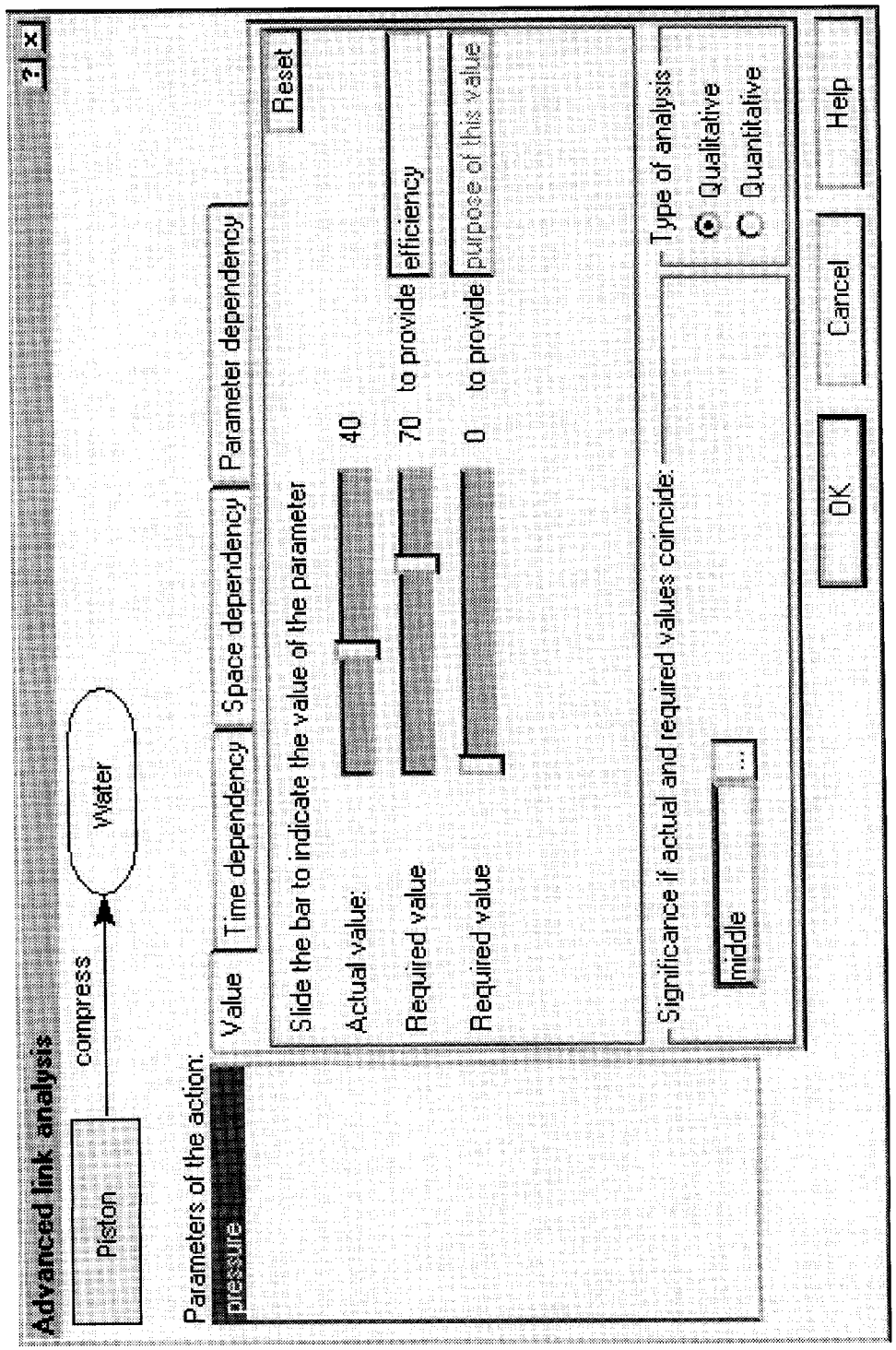
FIG. 15 is a visual display device screen illustrating a display for inputting data and displaying parameter qualitative value link analysis.

Alternatively, if actual numbers are not known, the qualitative value can be selected and the user indicate actual and required pressure value by a relative slide button adjustment, see FIG. 15.

Figure 16:
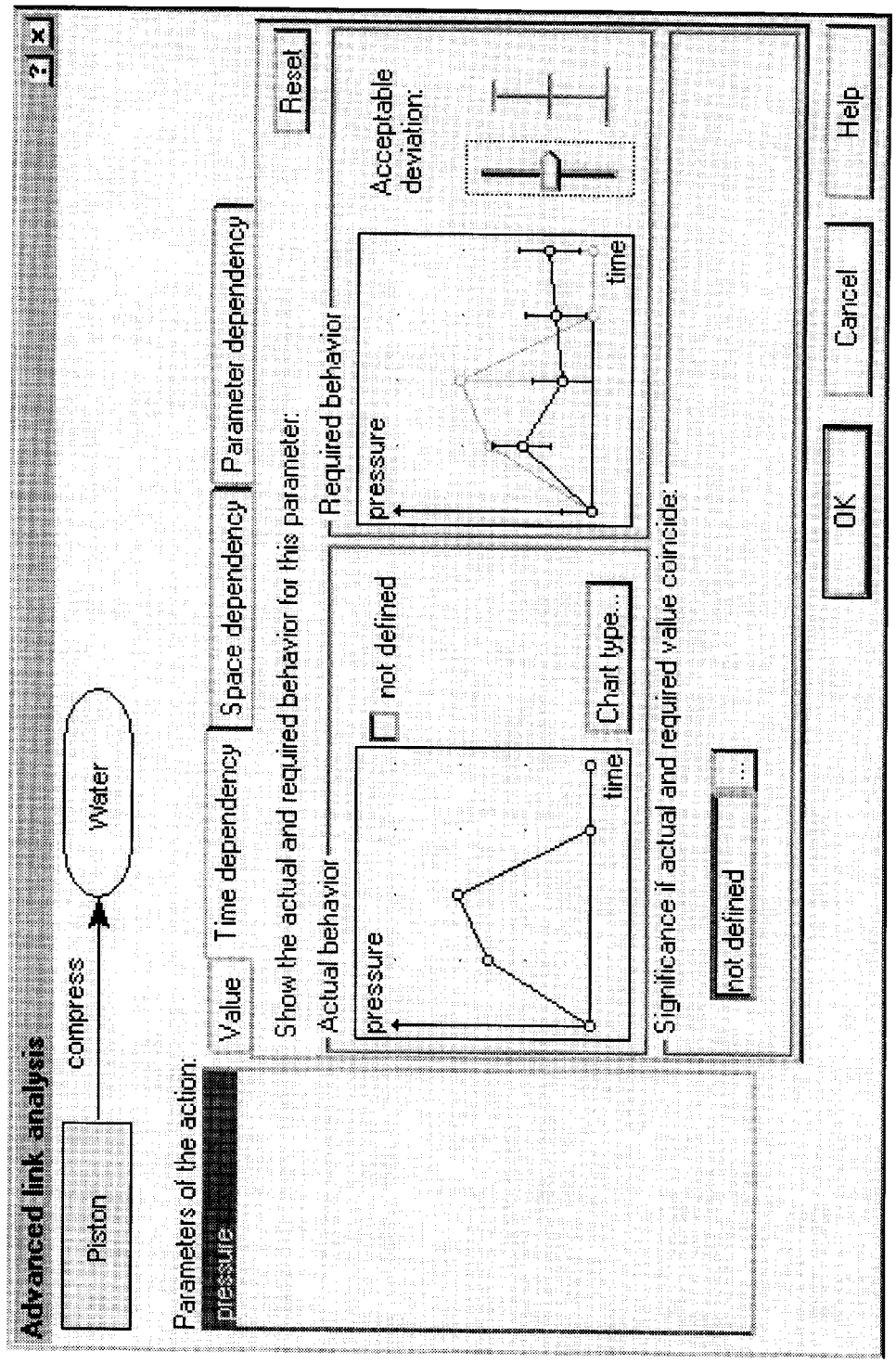
FIG. 16 is a visual display device screen illustrating a display for inputting data and displaying time dependency link analysis.
Figure 17:
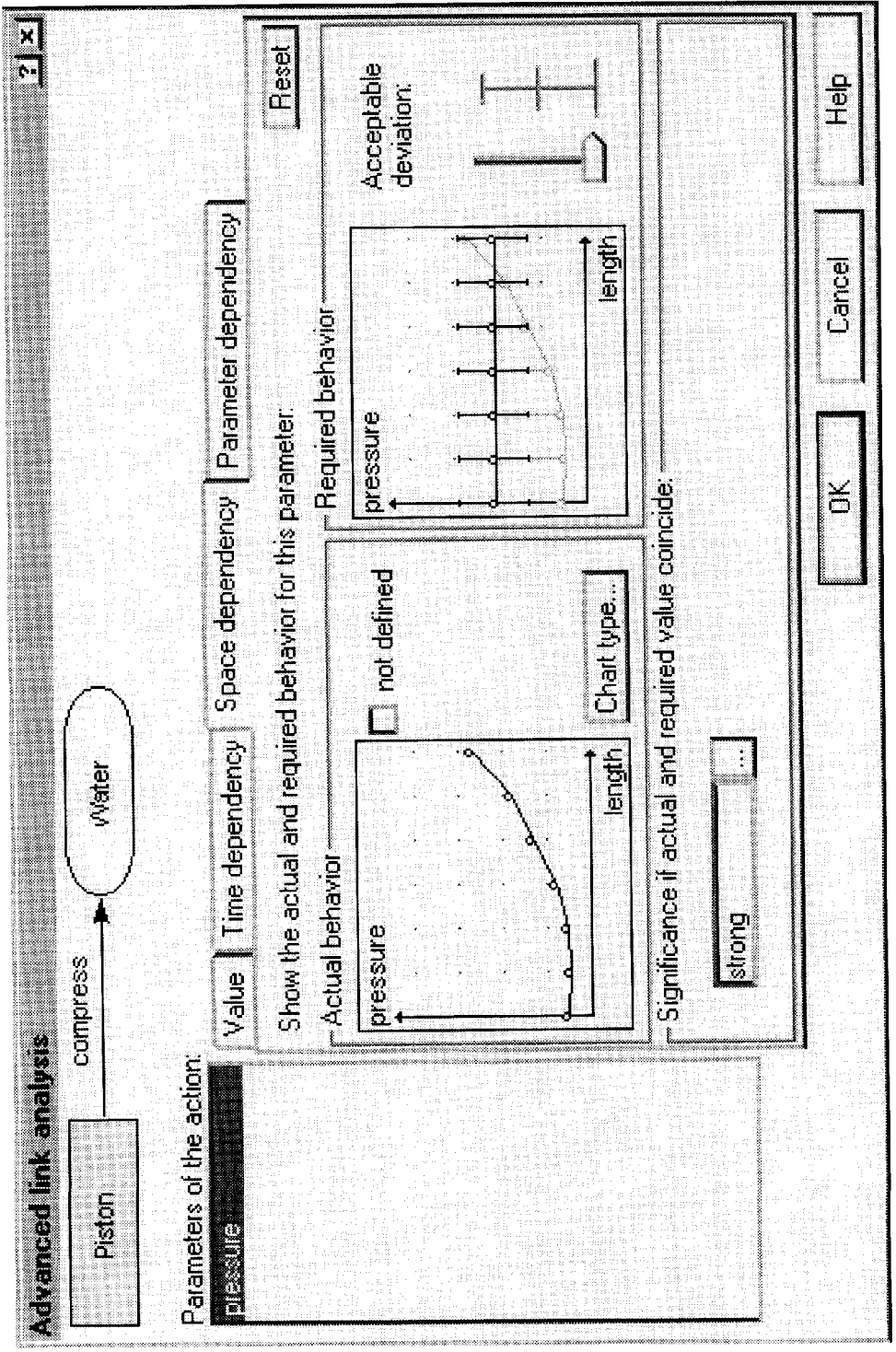
FIG. 17 is a visual display device screen illustrating a display for inputting data and displaying space dependency link analysis.
Figure 18:
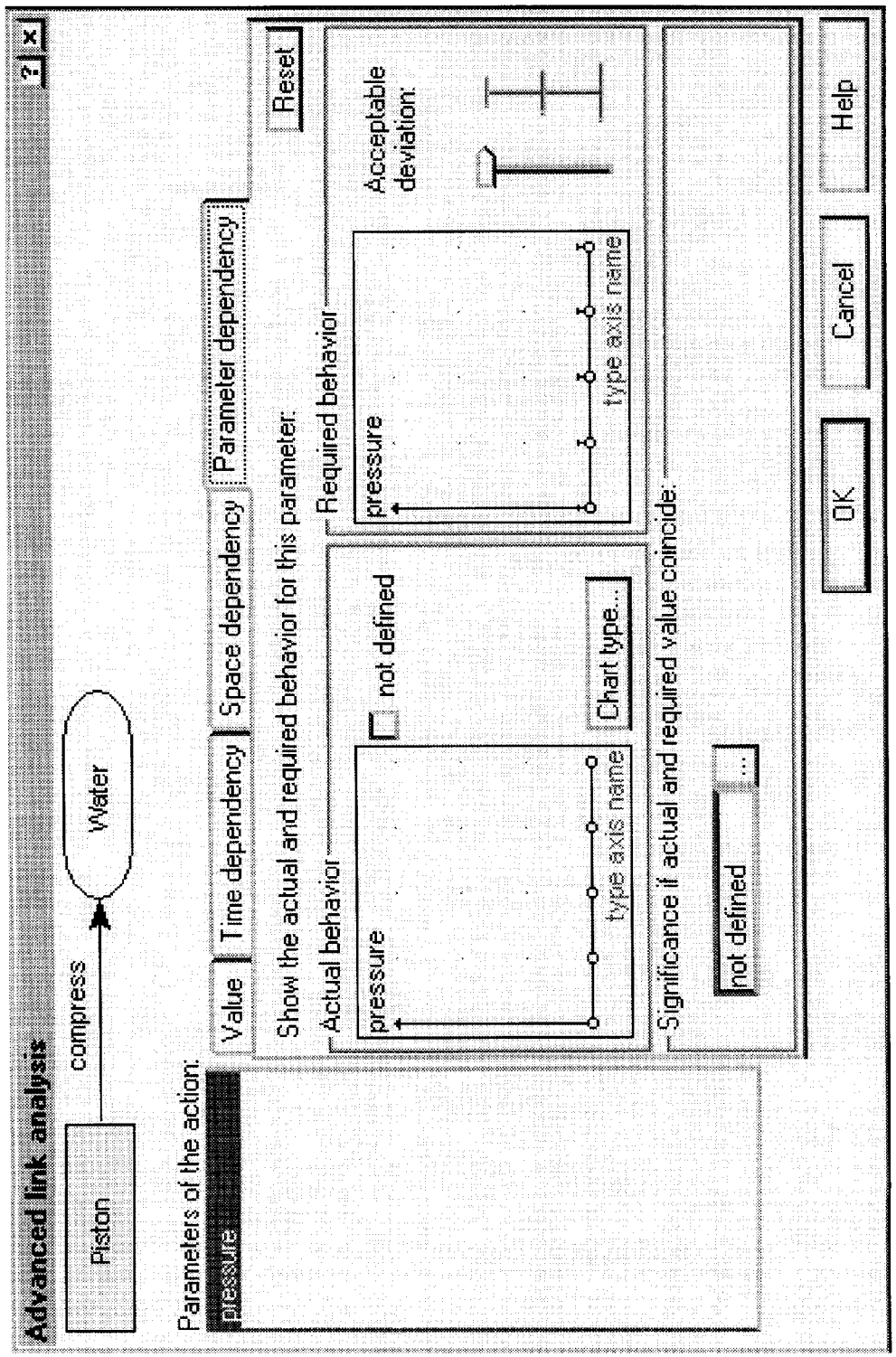
FIG. 18 is a visual display device screen illustrating a display for inputting data and displaying Parameter dependency.

Further analysis and data input is achieved for time, space and parameter dependency, see FIGS. 16, 17, and 18. In each of these screens, two graphs are presented both with "pressure" forming the X axis and a user named axis as the Y axis. The left graph is the actual behavior of the link parameter and the right graph is the Required Behavior. An Acceptable Deviation slide button allows the user to set this factor for the required Required Behavior chart. The user enters data by placing the cursor on each graph circle on the Y axis and raising it to the desired level on the X axis. As seen in FIG. 17, the pressure actually rises with, for example, respect to the cylinder length whereas the user requires a constant pressure over the cylinder distance. In FIG. 16, a different pressure duration of stroke characteristic is desired with a set deviation than actually present in the object system.

Figure 19:
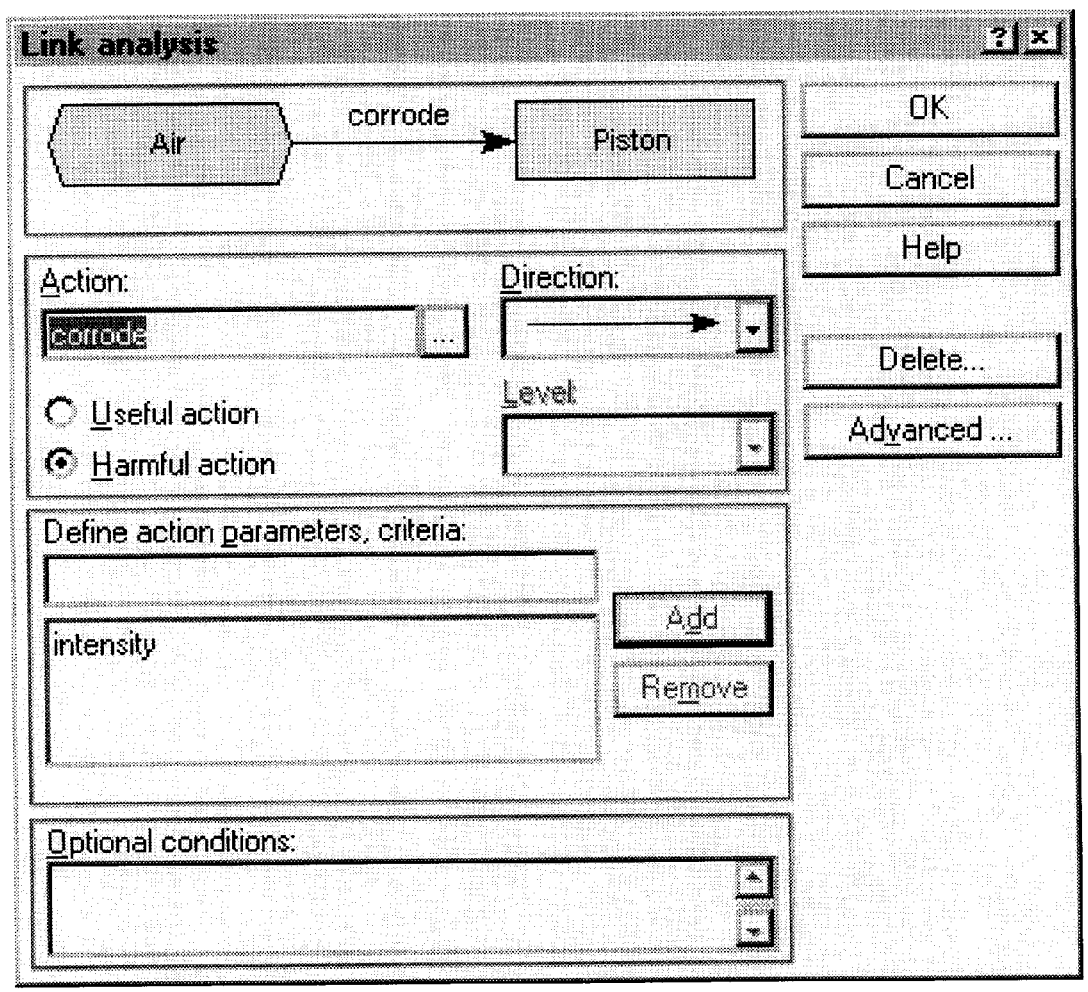
FIG. 19 is a visual display device screen illustrating a display for inputting data and displaying data similar to FIG. 13 but for a different, harmful action analysis.

In each of these cases, there may be a parameter that has no fixed value and the value depends on the circumstances. In this case, the user would select "not defined" such as seen in FIG. 18 for Parameter Dependency. When the user completes each step of the Link and Advanced Link Analysis, the ""OK"" button is selected. Regardless of the type of data entered, the data is stored, but can be edited at any time as described above in relation to FIG. 1 description. The above Link Analysis can be done and screens are provided for each link or interaction between components. For example, FIG. 19 shows the Link Analysis for "corrode" between the supersystem "Air" and the "Piston." Note that the "Harmful" button has been selected. The Value, Time, Space and Parameter dependencies analyses screens (not shown) are the same as for FIGS. 14–18 enabling the user to enter data for a harmful action.

Figure 20:
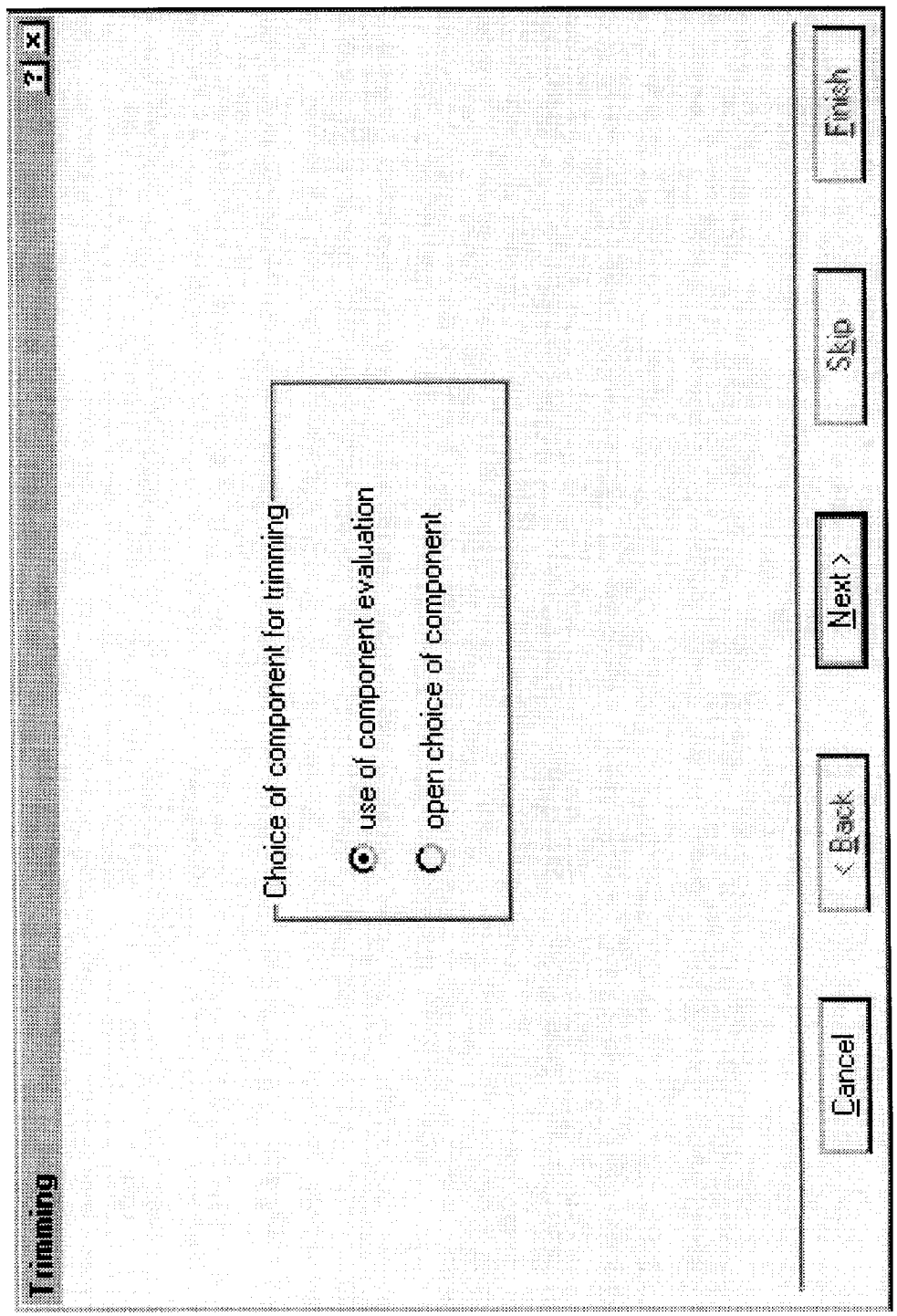
FIG. 20 is a visual display device screen illustrating a display for inputting data and displaying the user choice of component trimming.

The EAS enters the Trimming Stage, FIG. 3, by presenting the screen of FIG. 20 in which the user can select to have the EAS recommend the component or components to be trimmed using cost, problems, and functional evaluations of the components from unit 220 or "open choice" meaning the user will decide which components to recommend to trim.

Figure 21:
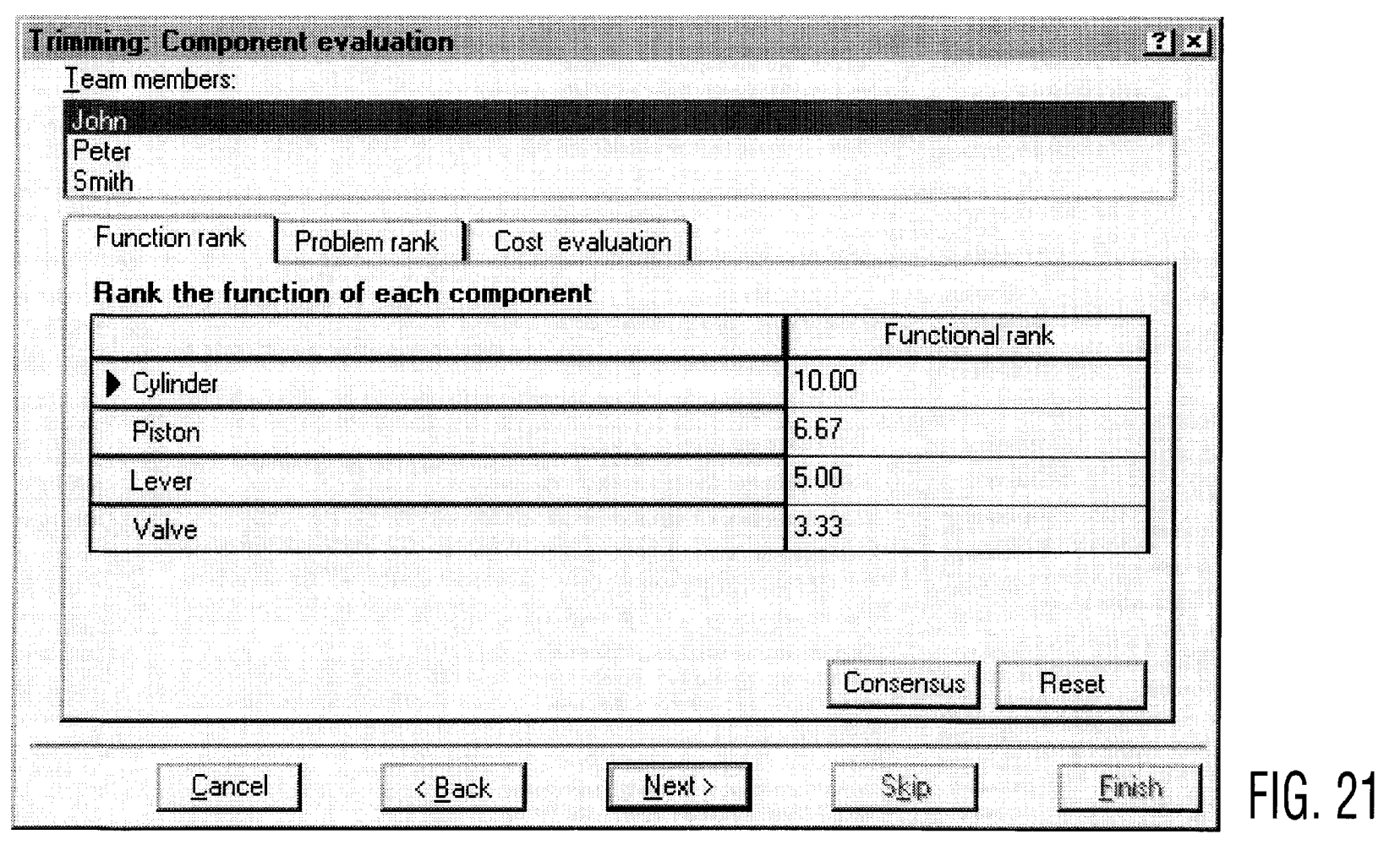
Figure 22:
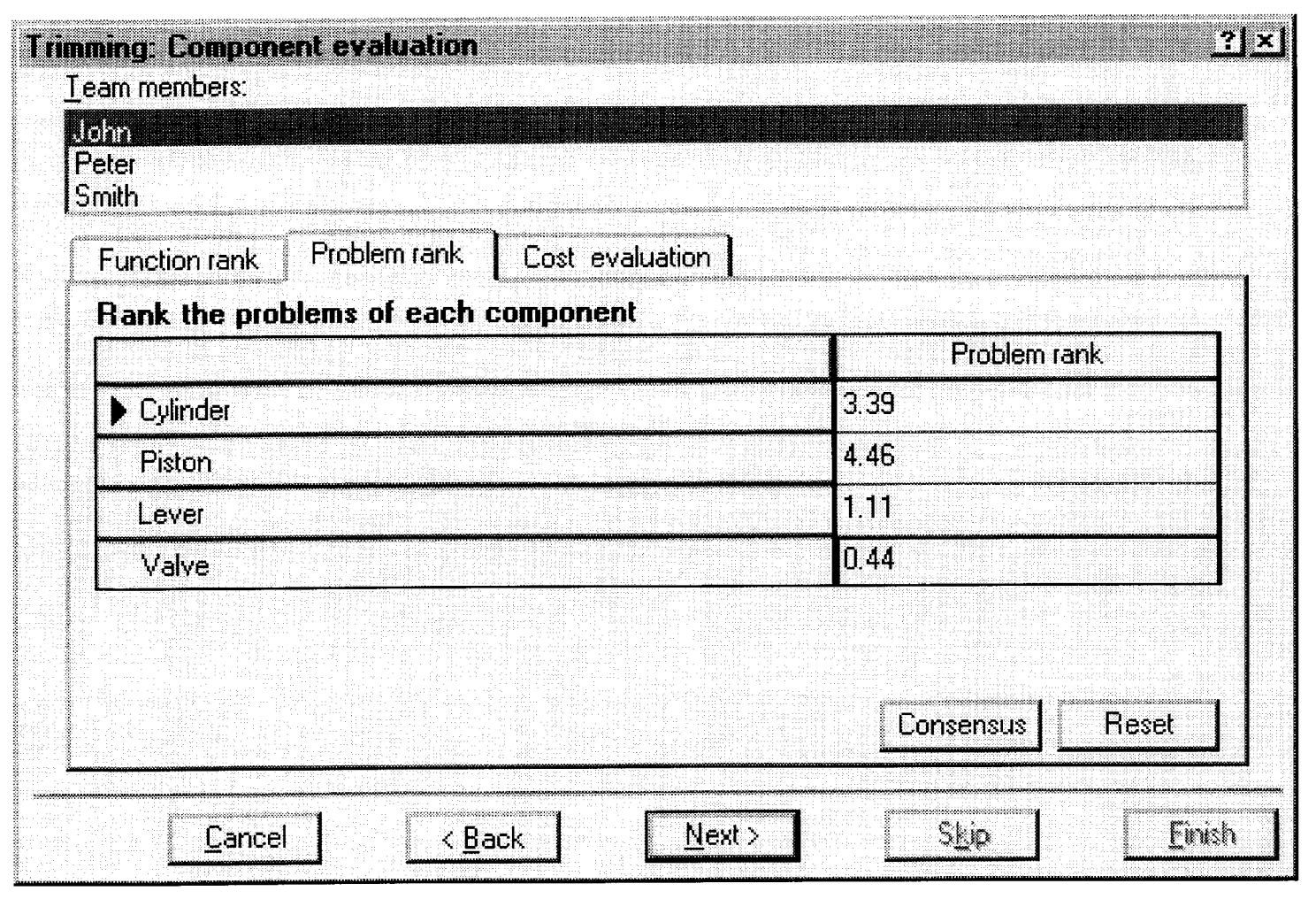
Figure 23:
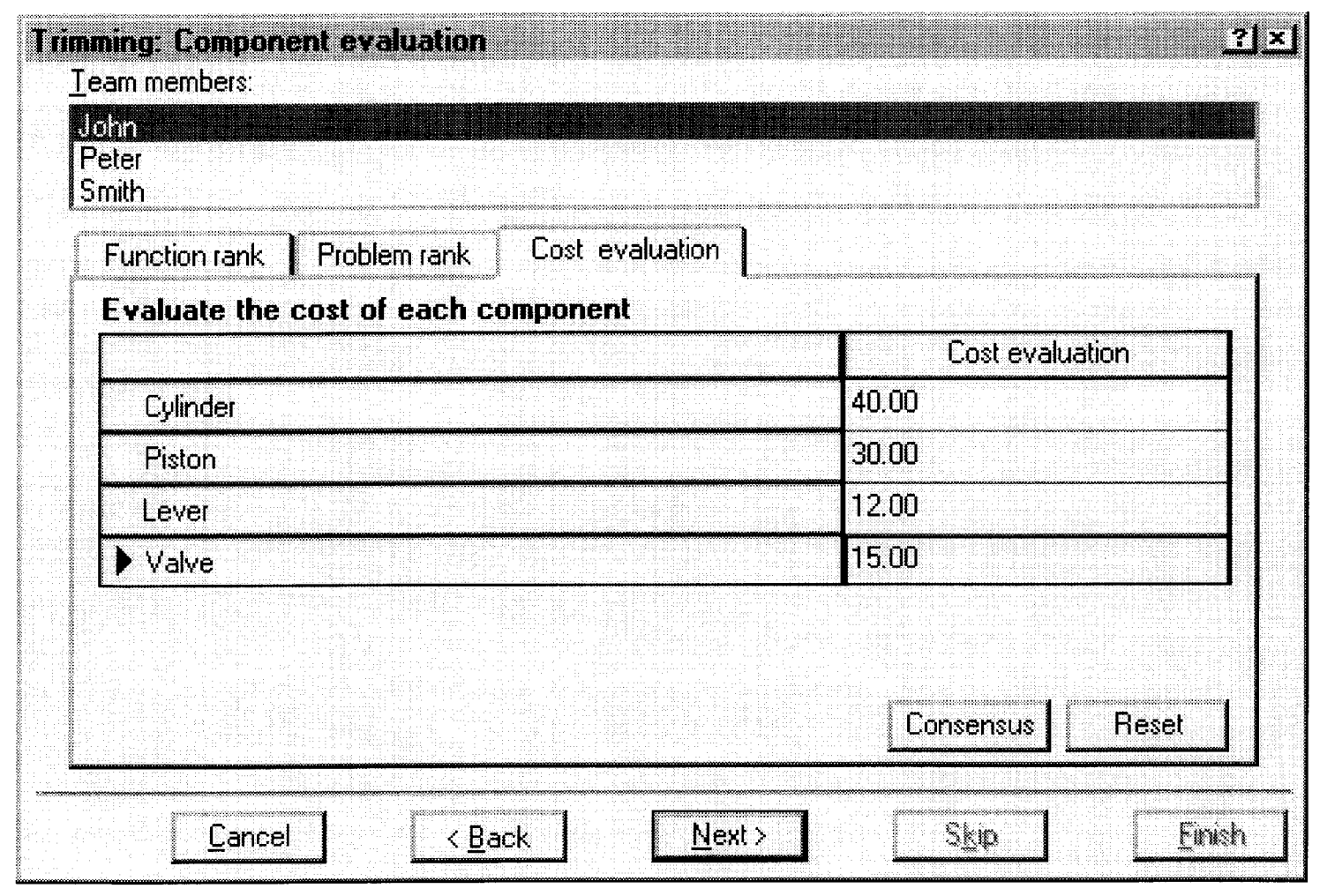

If the EAS Trimming recommendation is selected, the Trimming: Parameter Evaluation screen, FIG. 21, displays through unit 240 the Problem Rank for each component of the object system. Team members are also listed and when each member reviews and concurs with the data displayed the user selects the consensus button. Next the Problem Rank is displayed for each component, FIG. 22 and unit 220, FIG. 5 and the calculation of Problem Rank above, and again the consensus selected. Lastly the Cost Evaluation is displayed, FIG. 23, for each component as a percentage of the entire cost of the object system, and again the consensus indicated. It should be understood that the data displayed in FIGS. 21, 22, 23 can be edited and all previous EAS calculations will be changed accordingly. This editing capability will contribute to the team consensus being reached.

Figure 24:
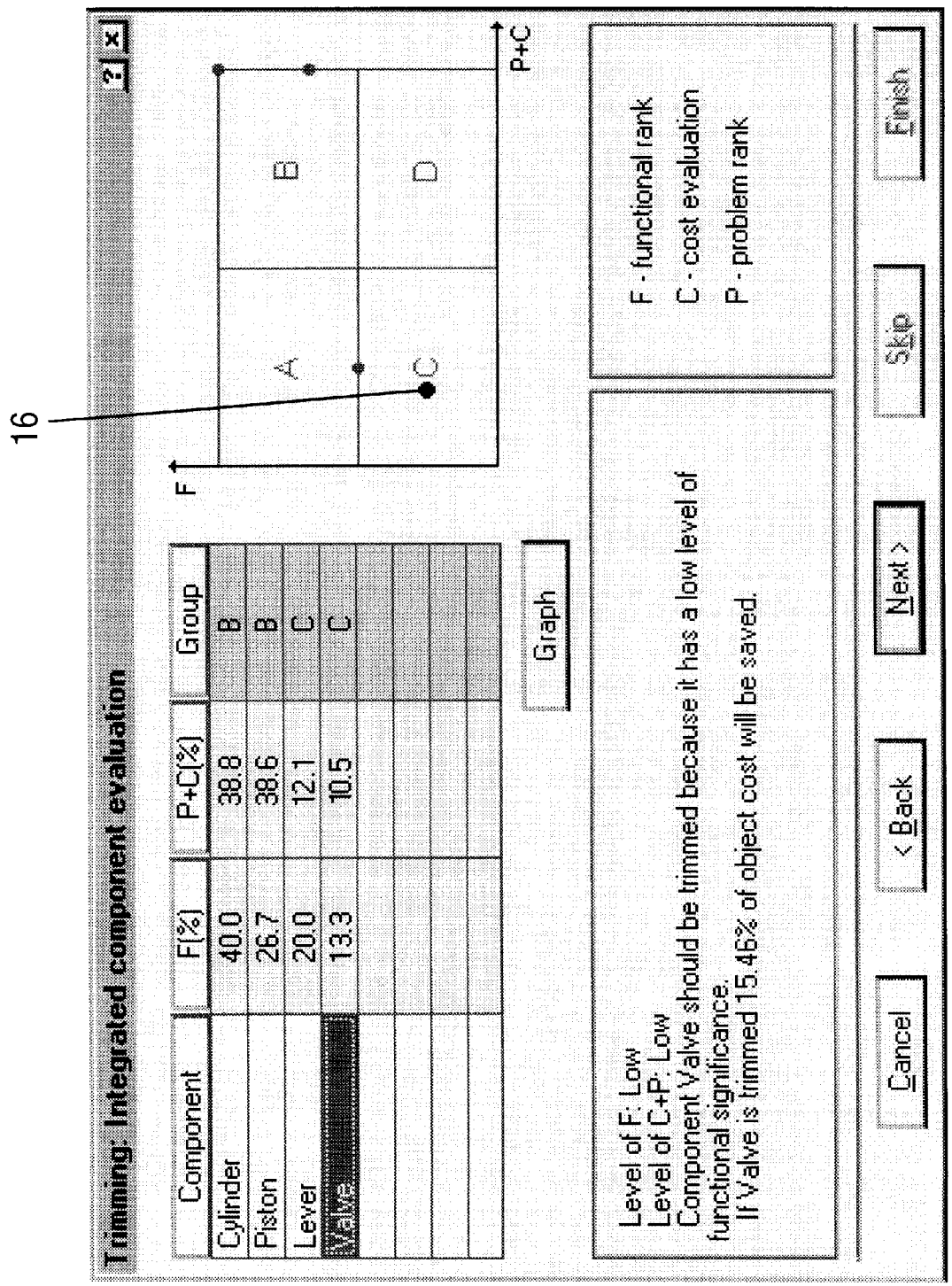
FIG. 24 is a visual display device screen illustrating a display for inputting data and displaying trimming integrated component evaluation.

Next, the EAS displays the Integrated Component Evaluation Table and/or graph of FIG. 24 where each component has its Function and Problem+Cost rated as a percentage relative to the other components, as described above, then EAS assigns an A–D ranking or dot location on a 4-quadrant graph as shown. Each component can be highlighted for highlighting its dot on the graph while other dots for other components remain light. This display is associated with unit 255 of FIG. 1. As seen in FIG. 24 the valve has the lowest ranking and lowest position 16 in the lowest quadrant "C" and is the best candidate for Trimming. No components fall in the "D" quadrant.

Figure 25:
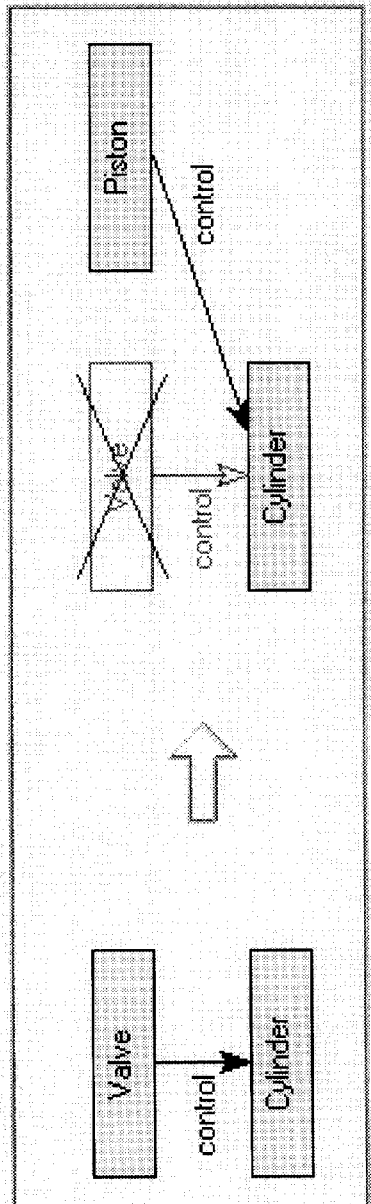
FIG. 25 is a visual display device screen illustrating a display for inputting data and displaying trimming condition.
Figure 26:
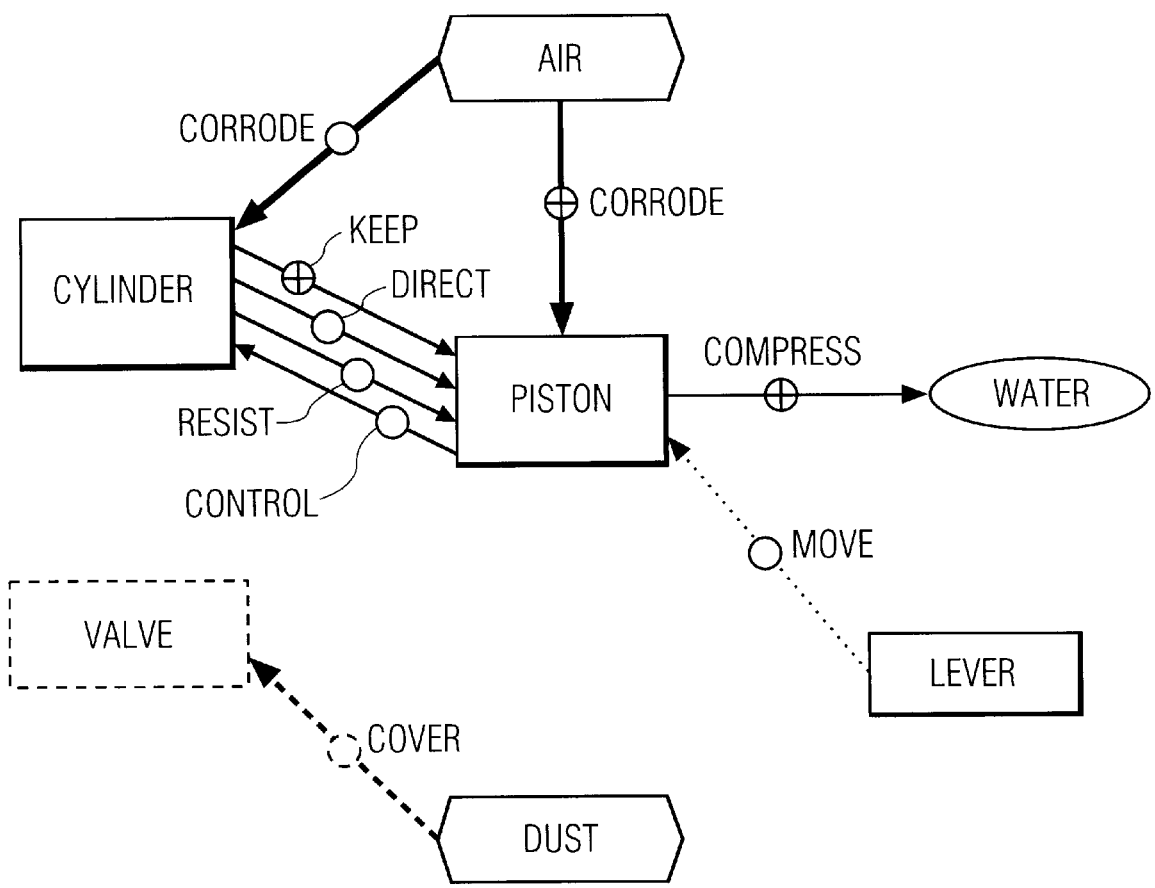
FIG. 26 is similar to FIG. 12 and displays the trimmed functional model of the object system.

The EAS next displays the Trimming Condition for the recommended or selected Trimmed component, e.g. the valve and the possible trimming variant, e.g. the piston. See FIG. 25, where the related action "control" is also selected. The transfer of this action to another component, and in this example, "control" of the cylinder is transferred to the action between "piston" and "cylinder." This selection is accomplished by clicking on the upper button 20 and selecting "piston" from the menu bar 22. The trimming condition data was entered via unit 260 in FIG. 1 that applies this data to unit 270 as described above. Unit 270 then modifies the original Functional Model data stored in unit 280 with the trimmed Model Data stored in unit 280 is displayed via unit 285 and fed to the Problem Manager unit 230 and Report Generator 210. FIG. 26 shows the trimmed functional model generated from the data stored in unit 280. Note the valve box is drawn in phantom because it was eliminated and no interaction exists between valve and cylinder. Note also that cylinder "control" has become an interaction between piston and cylinder. Cover and dust (harmful elements) also disappeared and are shown in phantom.

It is important to understand that the user and the EAS to this point in the session have encountered any psychological inertia that may prevent innovative thinking. The object system has been dissected, evaluated and analyzed in it purest sense. The EAS, after analysis, has recommended to the user that the greatest valve of redesign will result if the cylinder control action is transferred to the piston and the valve eliminated. How the piston itself can perform this added function becomes the problem statement to be managed by the EAS, Problem Manager.

The user now enters EAS Problem Manager that automatically generates a list of problems to be solved. Problem Manager is a tool that helps the user browse through all the problems associated with the trimmed functional model and to sort them based on value priority. Since the number of problems can be rather large, EAS calculates their significance and sorts them accordingly.

Figure 34:
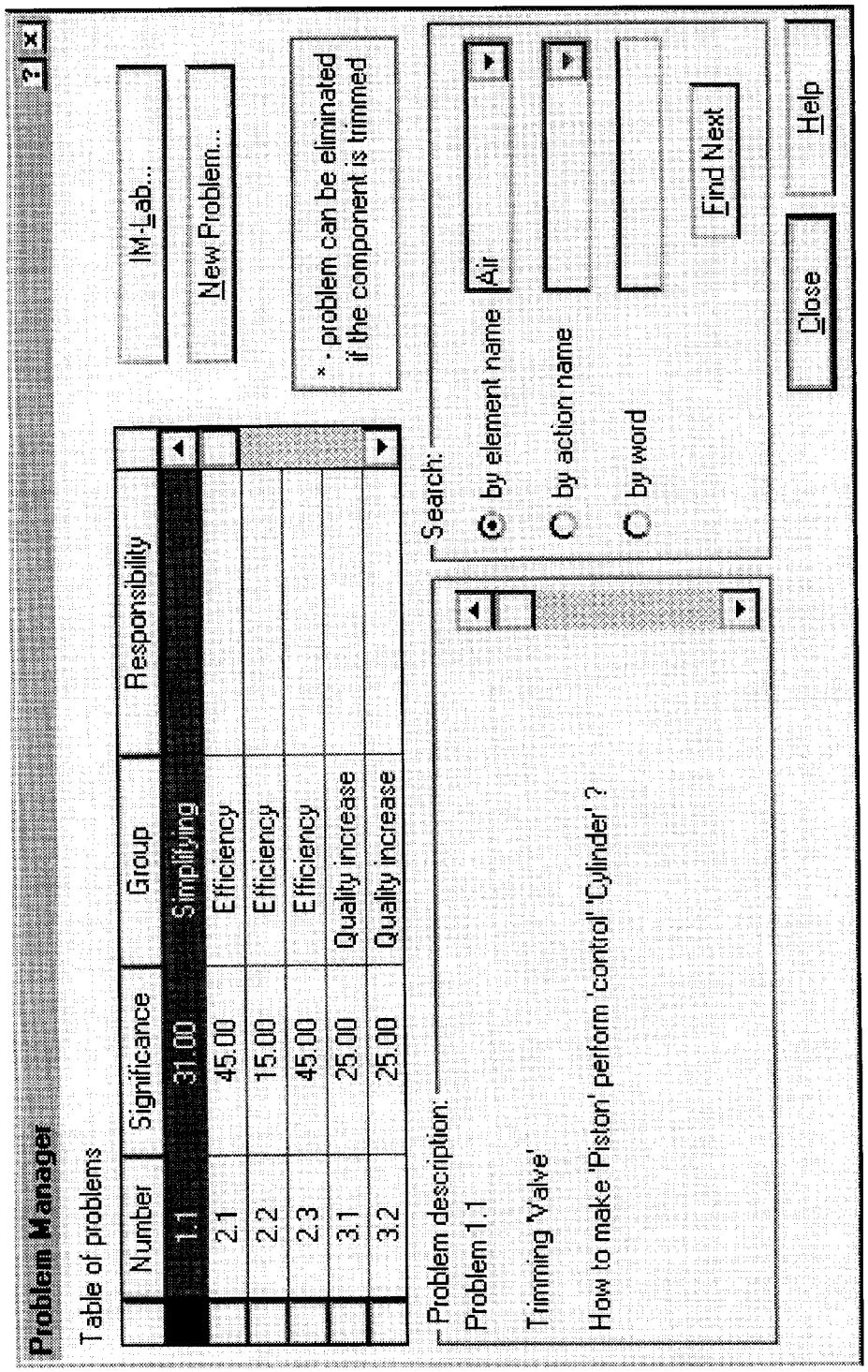
FIG. 34 is a visual display screen illustrating a display screen for inputting data and displaying the Problem Manager task.

To start Problem Manager, the user clicks Problem Manager under Solution Tools in the Navigation window and the Table of Problems of FIG. 34 is displayed. This table includes the problem Number assigned by Problem Manager, the significance generated by EAS of the problem, that is relative value if solved, the EAS generated group or type of problem solution objective and the team member responsibility to be entered by the user if desired. The star 26 in the left hand column is placed by the EAS and means that this problem need not be solved if an element or function were trimmed. The user can highlight each problem number and the EAS lists the problem statement in box 28. FIG. 34 lists the problems by problem number, but if the column heading "significance" is clicked upon, then the EAS will sort and list all table entries in order of "significance", not shown.

The EAS enables the user to search for problems associated with actions, components or supersystems of the functional model. For example, FIG. 34 shows "by element name" selected and "air" entered and problem 1.1 highlighted. If the menu arrow 30 were clicked, other components and elements would be listed and any one of those selected and entered with the entered element problem data being displayed and highlighted in the table selection "by action name" can also be selected by the user. Problem data and evaluation take place in units 220, 200, and 230 of FIG. 1 as described above.

The EAS also includes a Feature Transfer routine that enables the user to analyze the best feature or functions or alternate elements or alternate systems and compare those desirable alternate functions or elements to the function or element in the user's functional model function or element This enables the user to analyze the alternate system to determine why specific elements yield better performance or parameters and identifies those features and operating principles that provide the better performance. With this understanding, the user then formulates problems in an attempt to transfer the better performing feature to the object system being designed or redesigned by the user.

The first Feature Transfer screen, FIG. 35, is displayed when Feature Transfer is selected from the "Tools" icon on the menu bar. The user enters the object or component to be analyzed such as piston 1, 2 and 3 as shown. One of these, e.g. piston 2, may be the piston from the current object system under evaluation by the EAS. The other pistons may be from other known pump models. User then enters the important parameters 1, 2, and 3 (or more), such as leakage resistance, etc., that user wants to improve in his/her pump. The arrow buttons in the objective column 30 enables user to indicate the increase or decrease objective for each parameter. Parameter units are entered by the user and the user enters the importance rank (10=most important; 1=least important) in the right column for each parameter. User clicks to the next screen, FIG. 36, where user completes the table by entering numerical values for each parameter of each object. The Technological limit of a parameter is the value that the parameter could achieve if every modem technological achievement was used in designing the object. The Theoretical limit of a parameter is the best value that the parameter could achieve according to scientific theory. To finish the analysis and save the information to a report, the user clicks next button which brings up FIG. 37.

Figure 37:
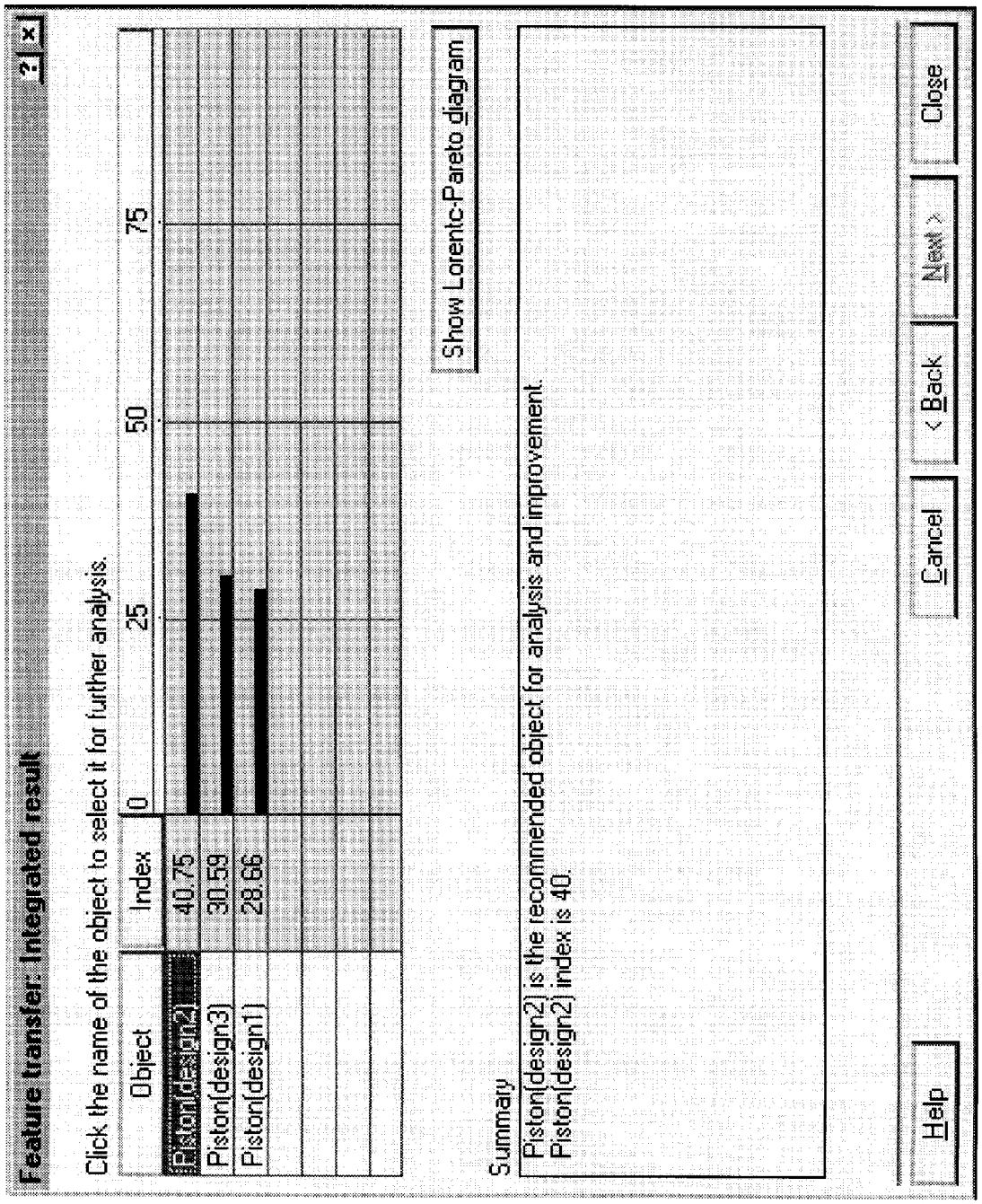
FIG. 37 is a visual display screen illustrating a display screen for inputting data and displaying feature transfer Integrated Result.

The EAS Feature Transfer Routine analyzes the feature transfer data for piston 1, 2 an 3, integrates, displays the integrated results in FIG. 37 by listing piston 1, 2 and 3 and assigning an EAS calculated relative performance index for each based upon a 100% total. The algorithm for Feature Transfer calculation is:

$$I = \frac{(K_i * P_i) * 100}{\sum (K_i * P_i)}$$

I—index;
$K_i$—parameter importance;
$P_i$—parameter value that is calculated as a percentage of sum of all parameter values.

Figure 38:
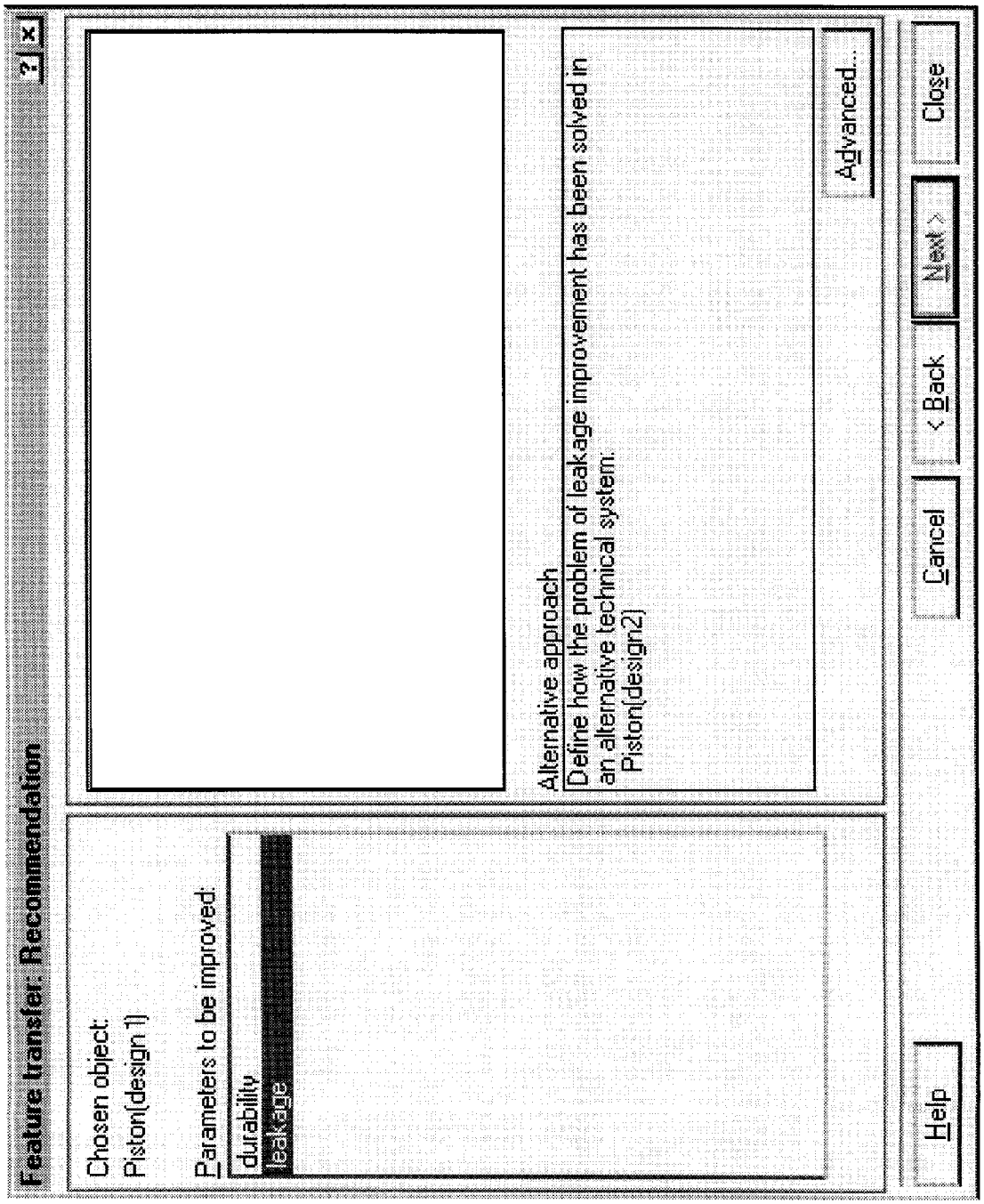
FIG. 38 is a visual display screen illustrating a display screen for inputting data and displaying feature transfer Recommendation.

Objects can be sorted by object number or index number by clicking the "Object" or "Index" box at the top of the column. User clicks next to get to the feature transfer recommendation screen, FIG. 38. This screen provides short recommendations about how to improve the parameters of the chosen object using two different approaches: leading domain of technology and alternative system approach. The user clicks the name of the parameter to be improved, e.g. leakage, and EAS displays the short recommendations for the leading domain of technology and the Alternative approach. To get advanced recommendations for the alternative approach, the user clicks Advanced . . . near this recommendation.

Figure 39:
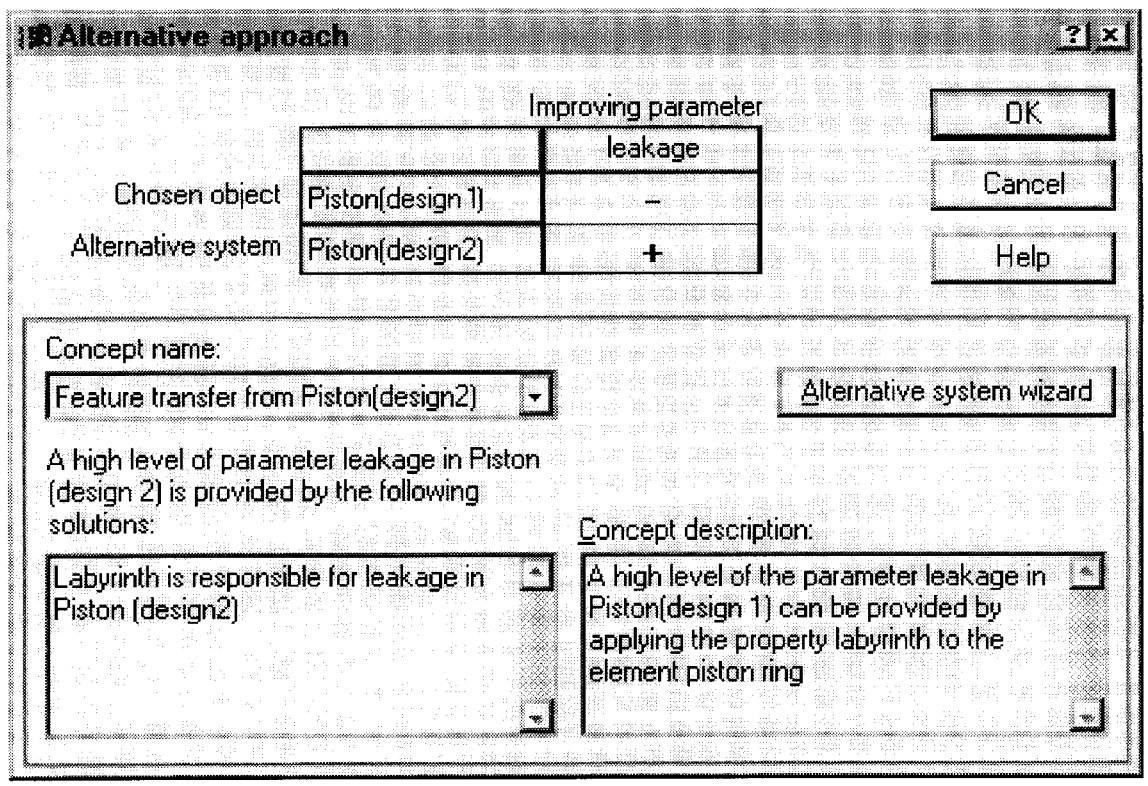
FIG. 39 is a visual display screen illustrating a display screen for inputting data and displaying feature transfer advanced alternative approach.
Figure 40:
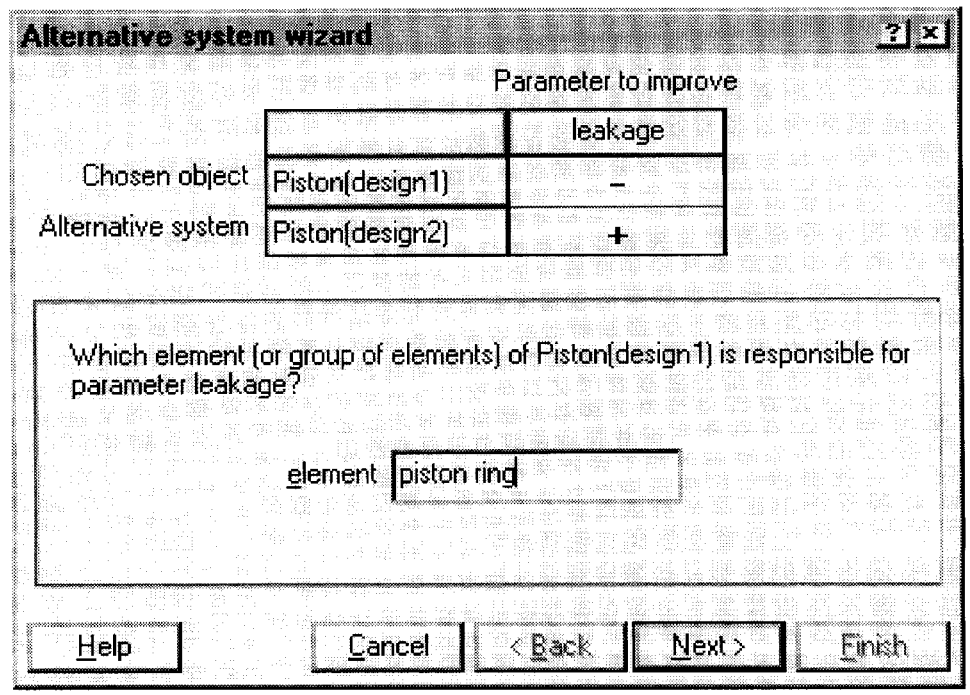
FIG. 40 is a visual display screen illustrating a display screen for inputting data and displaying feature transfer alternative approach parameter analysis.
Figure 41:
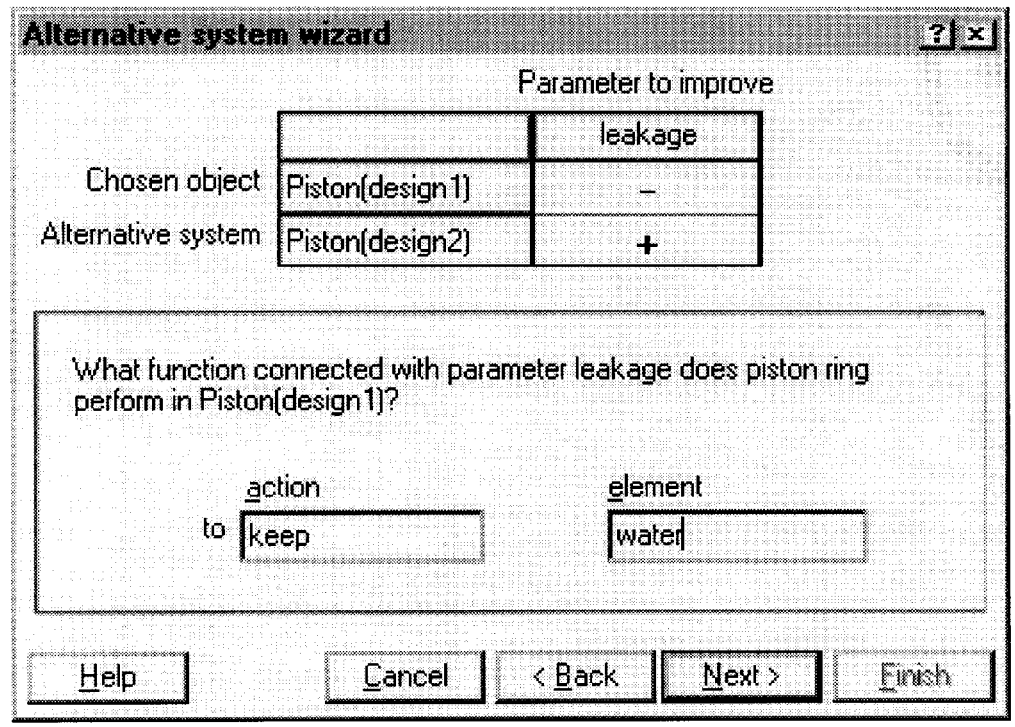
FIG. 41 is a visual display screen illustrating a display screen for inputting data and displaying feature transfer alternative approach function analysis.

If the user wants the EAS to undertake a more detailed analysis of feature transfer, then the "Advanced" button is selected to initiate an Alternative Approach subroutine and bring up FIG. 39. On this screen the user can formulate several concepts using the alternative approach by first choosing the name of the concept from the Concept name list box. A short description of the alternative solution is entered in the field below the concept name list box. Express a technical reason why the alternative object has a better level of the considered parameter. See FIG. 39. Next, a short description is entered in Concept Description of how to apply the alternative system approach to the considered object. See FIG. 39. A series of dialog boxes is displayed to lead the user through the steps of analyzing a solution in an alternative system by clicking on Alternative system wizard box. To close the dialog box and save the information to a report to memory, click "OK". This will initiate a subroutine that presents four screens in sequence each asking a detailed question about the recommended object and listing the parameter to improve. For example, FIG. 40 asks which element(s) is responsible for leakage. User enters the name of the initial or current object system element "piston". To check the entry the user can note that if piston is trimmed, leakage is also deleted. There can be no leakage without a piston. Selecting next brings the FIG. 41 display asking user to enter the element of the original object system that performs the function connected with leakage. Here the user entered "piston ring." Selecting next displays a screen that prompts user to enter the element(s) of the alternate system (piston 2 as recommended above) that performance the desired function.

Figure 42:
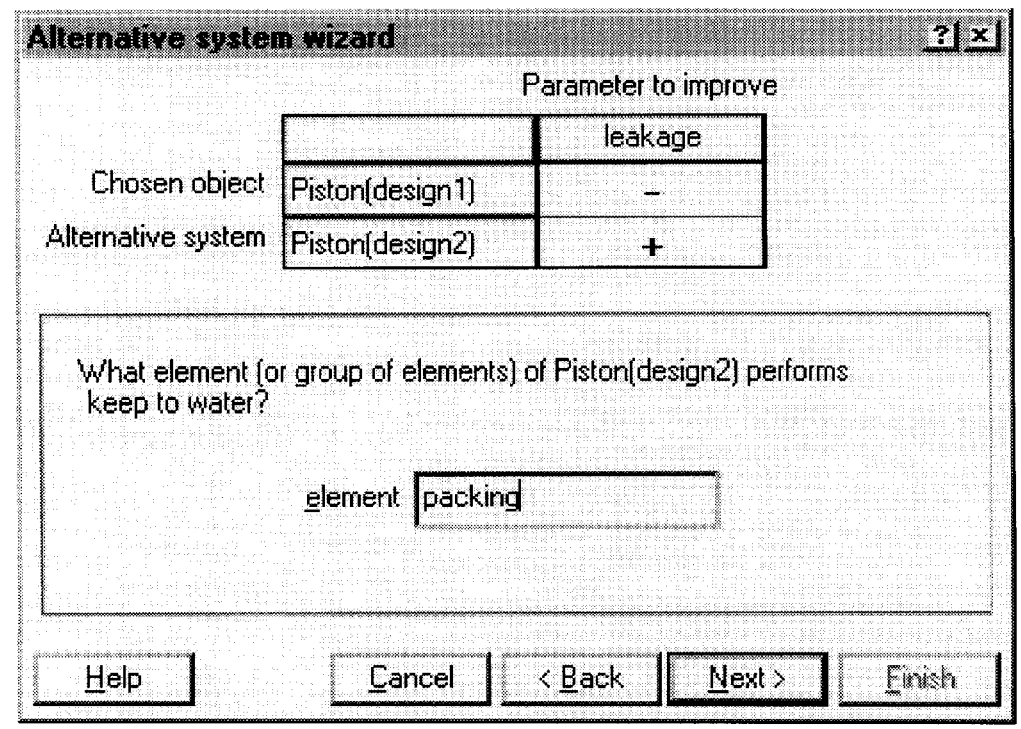
FIG. 42 is a visual display screen illustrating a display screen for inputting data and displaying feature transfer alternative approach element analysis.
Figure 43:
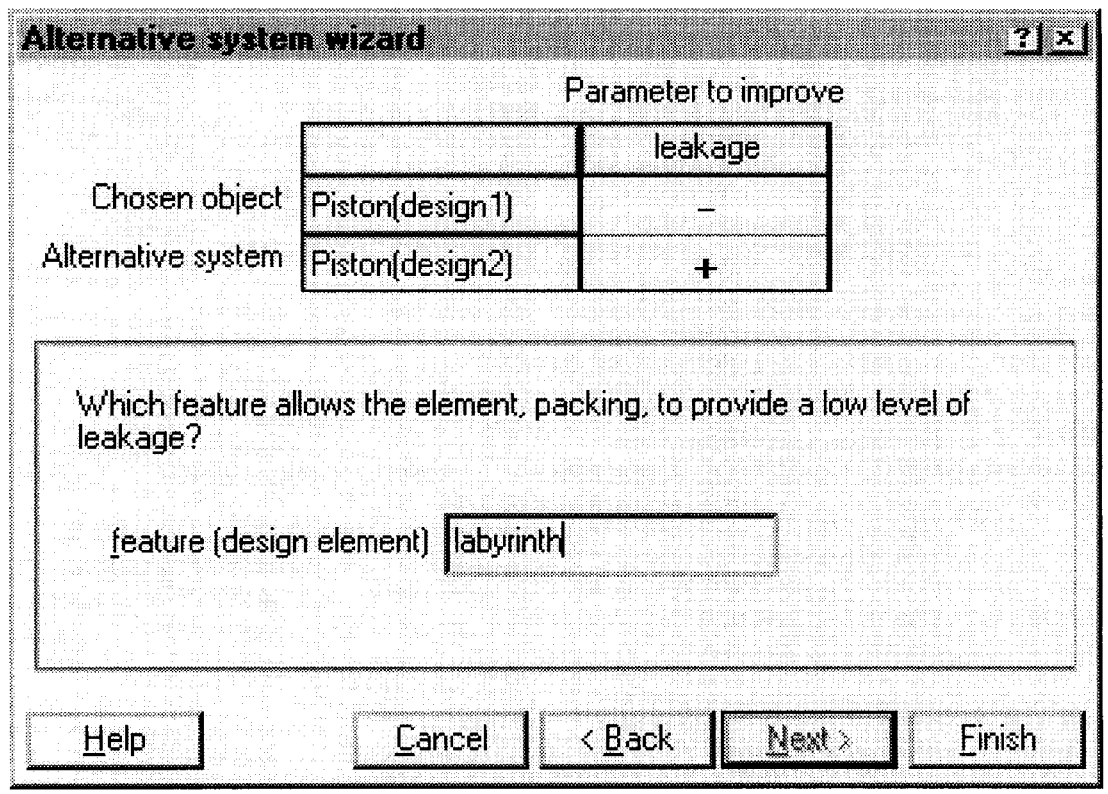
FIG. 43 is a visual display screen illustrating a display screen for inputting data and displaying feature transfer alternative approach feature analysis.
Figure 44A:
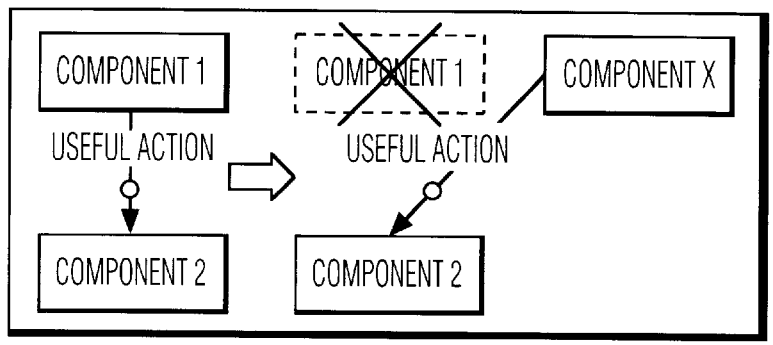
Figure 44B:
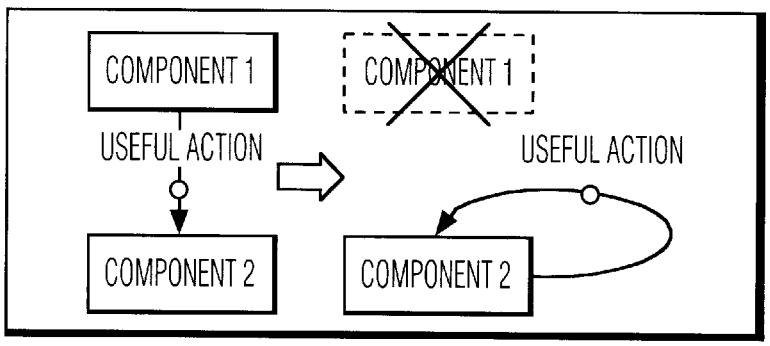
Figure 44C:
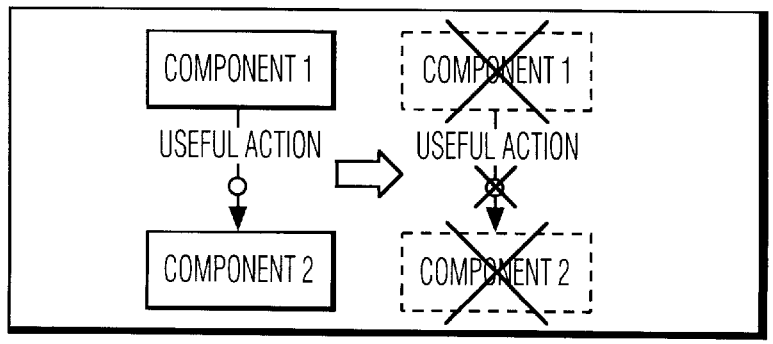
Figure 44D:
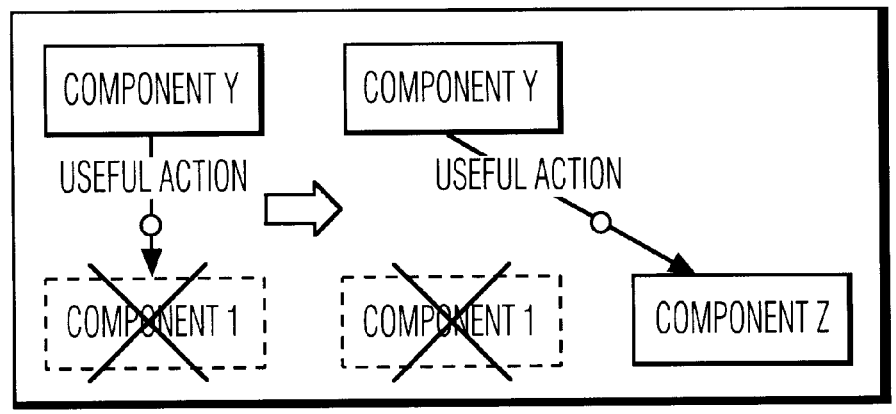
Figure 44E:
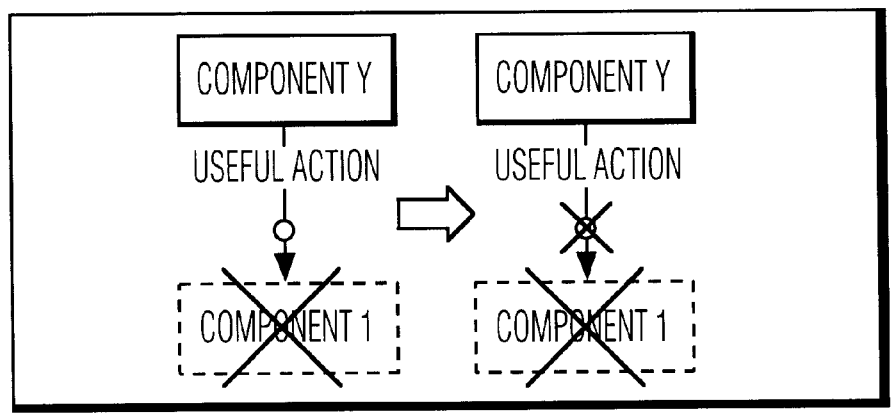

Piston 2, in this example, used packing so user enters "packing" as the "element" in FIG. 42. Selecting next displays the FIG. 43 screen prompting entry of the specific "property" of the element "packing" in the alternative system (piston 2) to achieve a high level of "leakage" meaning high level of leakage control. User entered labyrinth in the feature box.

Whether or not feature transfer is used, the EAS unit 210 can generate a report by organizing and managing the information from the various and predetermined subroutines in the usual manner. Preferably a Report icon is displayed as part of the EAS navigation window and includes a "Generate" command that can be clicked to initiate the report. Parts of a report can be edited just as any word processing program can be edited.

The EAS hereof can be programmed by one of ordinary skill in the art using the following commercially available tools:

1. Borland C++, Development Suite for Windows 95 NT, 3.1 and DOS V 5
2. NeoAccess Developers Tool Kit V 4
3. TGRID V 1.4 and 1.5 Henry PICOT, Inc.
4. TE Developer Kit WIN 32 V 5.0 Subsystems, Inc.
5. SPELL TIME V 2.0 Subsystem, Inc.

It should be understood that the screens have cancel and finish buttons and allow user editing of displayed data function in the usual manner. If the user do not want to save the entered data to a related file in the memory unit, the user selects "cancel", and, if the user wants to save the entered data, the user selects "Finish".

An exemplary embodiment of the Process System Analysis module of the EAS will now be described with reference to FIGS. 2, 45, and 46 and the legend and glossary at the end of this specification. The user accesses this Process System Analysis module when it is desired to analyze, design or redesign a manufacturing or treatment process, method or technique. With reference to FIG. 45 and the legend and glossary at the end of this specification, an EAS Process System Analysis session has five main Process System analysis stages termed Initial Process Data, Component Model, Process Functional Analysis, Operation Trimming, and Problem Statement. As the user develops the session, the user can return to and edit or modify any stage data at any time and the EAS will modify all stages of the entire project session accordingly.

The user starts a new session by accessing the EAS-Process System Analysis module. The Process System Analysis prompts the user to enter the first stage "Initial Data." The user can enter initial data with use of the keyboard and/or mouse, such as project name, objectives, and objective ranking. During the Initial Data stage the user enters initial project data to the report unit 217 and problem manager 155. Report unit 217 functions to display elements of the final report on monitor 16 and enable the user to edit various parts of the report. Report generator 218 coordinates the project objectives and rank with model data unit 195 and processes the model data, problem data and trimmed model data into results, as described below, and generates the final report for display by report unit 217 and/or print report document 175.

During the Component Model stage, the user inputs data to Component graph unit 410. Unit 410 serves to display a graphic representation of the Component Model of the Process System under analysis. The user draws a symbol such as a box to represent each Component of the Process System model and a line between boxes to represent each Component added and its manufacturing sequence during the Process System. Boxes can be labeled on screen and the sequence number added. Color coding can be used to designate which Components result from process Operations or which are simply added to the Process System. See FIG. 49 which is further described below.

During the Process Analysis stage, the user enters data to Operation graph unit 420 and Function table. Units 420 and 450 develop displays of the sequence of Operations (one or more) entered by user, that act on or produce each Component. The user also enters the identity and sequence of Functions that contribute to each Operation. As better seen in FIG. 51, user clicks on Operations table 451 to display and enter the Component Operation and related data used to produce the respective Component (see FIG. 50). Next user enters the links between Operations on an Operations links graphic. As further described below, data can be entered or edited in unit 420 in graphics form and/or in unit 450 in table form. Function table unit also enables entry of a description of each Operation Function and the specification of the Functions, such as a Functions action, source or tool, target object or Component class of function, such as, useful or harmful and type of useful Function contributing to the Operation, such as productive, providing, or corrective.

The Process System Analysis further includes a Function Link Analysis unit 440 that receives data from unit 450 or directly from user input and unit 430 to analyze qualitative or quantitative values of detailed linking parameters between Functions and Operations. Each action can be represented on a parameter level with parameter behaviors on graphic diagrams displayed.

Model data unit 195 is primarily a data storage facility and obtains and feeds data to the many units generally shown in FIG. 46.

As described below, the user calls up a link analysis unit 440 as part of the Functional Analysis Stage. This unit 440 enables the user to select for each link in the Operation Model a short description of the link, as well as its characteristic such as insufficient, normal, or excessive. This is done for each link in the Operation Model and the data stored in model data unit 195.

The user can, for any link, implement a more detailed link analysis that enables the user to detail the character of the action by means of comparing user entered actual values of an action with required values of the action. These values are also stored in model data unit 195. This detailed link analysis enables four different types of data entry for the actual value and required value of an action parameter. These are Value, Time Dependency, Space Dependency, and Parameter Dependency. As described below, Parameter Value data can be represented either as qualitative relative ratio values or as quantitative values. For example, if the action link is "compress" between two Operations, the actual PSI and required PSI values can be entered in unit 440. In addition, the actual and desired tolerances can be entered such as ±2 psi and ±1 psi, respectively.

The Time Dependency data is entered to unit 440 by the user selecting the actual and desired parameter values over the desired duration of the action. Space Dependency data is entered to unit 440 by the user selecting the actual and required parameter value at various points in the space or distance through which the action occurs. Lastly, the user enters into unit 440 Parameter Dependency data for the actual and required link parameter as it relates to a separate other parameter in the object system functional model entered, i.e. named, by the user.

Although the above four detailed analyses are available, the user need not select them all and can simply not enter data which removes that analysis from consideration by the EAS-Process System Analysis.

All user entered Link Analysis and detailed Link Analysis data are stored to the model data Unit 195.

A Process System usually includes harmful operation Functions and useful operation Functions which are not optimally fulfilled. Every disadvantage in a Process System presents a problem that should be solved. Also, distribution of process benefits among Operations are usually not uniform. Some Operations contribute greatly and others are insignificant to the process objective.

In addition, each Function within each Operation had data entered, inter alia, including its action, element type and performance. The type of Function includes harmful and useful, and the useful Functions can be further classified as Productive, Corrective, and Providing. See the Glossary for a further definition of each type. Although the user selects the Function type for each Function of each Operation, the PSA also stores a value or score associated with a specified Function type designation. For example, Productive is given a 3 value, Providing 15 given a 2 value, Corrective is given a 1 value and Harmful is given a zero value. These values are also stored in model data unit 195 and used in subsequent evaluation algorithms.

Once satisfied with data entry, the user initiates the Operation Trimming stage. This routine enables the user to evaluate and determine which Functions and/or Operations, if trimmed would yield the greatest value toward the project objective.

The PSA uses an operation evaluation algorithm to choose the recommended order in which to trim operations. The algorithm uses standardized values of the problem rank (P), function rank (F), and cost (C) as entered by the user at unit 245. The evaluation unit 225 then generates a graph to illustrate its calculations.

Model data unit 195 communicates continuously with F, P, C Evaluation unit 225 which includes internal processing routines that apply the model data from unit 195 to the following default criterion algorithm:

$$\frac{F^2}{P+C} = \text{Trimming Factor}$$

where

F=function rank of Operation

P=problem rank of Operation

C=cost of Operation

Unit 225 then calculates the highest to lowest scores for each Operation and feeds this data to units 245, 195, and 235. Unit 245 plots and displays the operations on the graph and places the Operation with the highest functional rank at the top of the vertical axis. The functional ranks of all the other operations are calculated as a percentage of this maximum rank. The procedure is the same for the horizontal axis, which shows the combination of problem rank and cost. From geometrical point of view the criterion formula, preferably, describes a set of parabolas or other lines. The least value of criterion means the narrowest parabola. PSA trimming recommendation for each Operation depends on where it falls on the graph. In the illustration above, the PSA would recommend trimming the Operation with the lowest function rank and highest problem rank and cost. Of course, the user can always quickly and visually analyze the information presented by PSA and make his/her own decision.

If desired, the PSA enables the user to enter a customized trimming parameter or algorithm in unit 245. If user selects this option, unit 245 presents a dialog box displaying the following:

$$K = \frac{\sum (kB)}{\sum (kW)}$$

K=user criterion

B=standardized value of objectives that should be increased

W=standardized value of objectives that should be decreased k=value of importance of each object Operation User selects which Operation(s) should be applied to this formula to thereby customize the trimming criterion.

Unit 245 then feeds unit 225 for modifying the output thereof which is fed to unit 235.

If user enters no data to unit 245, the unit 225 output is fed unmodified to unit 235 and unit 255 in which the data is processed to search for the priority of Operation trimming candidates.

Unit 265, in response to unit 245 data, presents (displays) a set of rules for trimming conditions for the trimming candidate Operations generated by unit 255. For example, one preferred set of rules can be:

Productive function:

Function can be trimmed if:

1. the function is performed during another operation;
2. there is no object of function;
3. there is no need to perform function;
4. the function is performed during the new operation.

Providing function:

Function can be trimmed if:

1. there are no "provided" operations (functions);
2. the function is performed during another operation;
3. there is no need to perform function;
4. the function is performed during the new operation.

Corrective function:

Function can be trimmed if:

1. there are no corrected operations (functions);
2. the function is performed during another operation;
3. the corrected operations do not create defect;
4. defect does not impede design work;
5. there is no object of function;
6. the function is performed during the new operation.

Each trimming conditions requires a formulated problem.

Unit 255 data is also fed to unit 275 where the trimming condition is evaluated. User can interact and modify the Process System Analysis object structure through unit 265.

One exemplary analysis of a process system will now be described with reference to FIGS. 2, 45–66. In this example, the user desires to analyze and improve a manufacturing process for producing an assembled shaft and gear in less time with less energy than the company's existing process.

User accesses the PSA and enters the Initial Data stage. The PSA displays the screen of FIG. 47 and prompts user to enter the Project Name, Process identity and present Process description. One or more Objectives must be entered. In this example, the user is presented with an Objectives table in which the user can click on the left most arrow to bring up a menu that can include a plurality of suggested objectives such as:

Energy consumption
Equipment cost
Labor expenditures
Losses of product material
Maintenance
Reliability
Safety conditions
Used area
Operation time As seen in FIG. 47, user selected Energy consumption in Row 1 and Operation time in Row 2 and selected Down for both of the desired conditions. User also entered the energy and time limits and desired and current values of these parameters and dragged the indicator on each of the right hand Importance slide based on a 1–10 scale.

By clicking on the Team icon, the screen in FIG. 48 appears where the user can enter all team members and related data and other project information that will appear on the report. This completes the Initial Data stage although the PSA could include additional data entry in this stage if desired.

User initiates the Component Model stage by clicking on the Components icon at the screen left. The PSA presents the screen (initially blank) of FIG. 49. User then draws box 1 and labels it "shaft" and box 2 and labels it "Gear". User then draws box 3 and labels it "Assembly Unit" and draws an arrow line from box 1 to box 3 and a second arrow line from box 2 to box 3, generally as shown. It will be understood that this example only involves the assembly of two units, however, the PSA has the capacity to analyze large complex systems that include many components, sub-assemblies and assemblies that could be drawn in FIG. 49.

Next the user clicks on the Operations icon to bring up the table shown in FIG. 50 in which the shaft, gear and assembly unit already appear on the left side in response to data entered in the previous screen. FIG. 50 table prompts user to enter one or more operation steps currently used to make the highlighted component. In this example, user entered in the first column, in proper numbered sequence, Cutting, Heat Treatment and Finishing. The PSA automatically designates the next columns the same as the Parameter objective row headings from initial data screen FIG. 47, i.e., Energy Consumption (kw) and Operation Time (min.) and enables user to enter the present values for each operation step. Similar data (not shown) is entered for the other component (Gear) in the assembly and for the Assembly Unit which would include steps, energy and time necessary to assemble the components as a unit.

Next, user clicks on Function tab of FIG. 50 in response to which the PSA displays the screen of FIG. 51. Here the PSA enables user to break down broad operation steps into more detailed specific actions, the specific tools used to perform the action, and the element of the component acted upon. As mentioned above, the action is ranked into one of 4 categories (Productive; Providing; Corrective; and Harmful) and its performance effect or value indicated.

As seen in FIG. 51A the upper part includes the three steps in forming the shaft: 1.1 Cutting, 1.2 Heating and 1.3 Finishing. These operation steps also appear in the table in the lower portion with the columns headed as mentioned above. The user highlights the component, i.e. Shaft, that brings up the two tables depicted but without any data other than the three operation steps Cutting, Heat Treatment and Finishing as described above. Next user clicks on the "tool" arrow in row 1 of 1.1 and is presented with a list of tools. User selected "spindle" which appears in row 1. Next, user enters the action "rotate" in the next column and selects "shaft" as the element receiving the action or acted upon by the spindle. Next the action is ranked by type. In this case, user entered Providing for the spindle in which case the PSA stores a "3" rank level for the spindle. Next the user enters the performance level of the tool/action which for the spindle is set at zero meaning optimal average performance, neither above (+) nor below (−) optimal.

As seen in Cutting 1.1 row 2, user enters Cutter—Removes—metal as a productive action with a mass metal removal value of 4.0.

User repeats entry of associated data for each action of each operation step, selects the specific tool that effects the action, designates the component element to which the action is directed, designates the type of action for the ranking value to be stored and enters the quantitative or qualitative value of the tool/action performance. As this data is entered, the PSA also displays the pertinent data in the upper chart of FIGS. 51A and 51B and stores the same in respective units of FIG. 46.

With the data entered in the screen of FIG. 51B, the user can click on any function such as the symbol in the "Type" column. The PSA responds by displaying the screen in FIG. 52 for the function 1.1.1 or Spindle Rotate Shaft with Providing checked or highlighted. The PSA displays a graphic to the right which shows the object of the function (shaft) and the operation steps and functions entered in FIG. 51B in hierarchical fashion.

User then selects those displayed operations and functions that are associated with the function "spindle rotates shaft". In this example, user clicked on the boxes labeled Cutting 1.1 and Cutter Remove Metal 1.1.2 because the function directly or indirectly provides the cutting action and the ability for the cutter to remove metal. The user understands that the cutter alone can not remove metal (in the present system) unless the spindle rotates the shaft under the cutter. Since the function "spindle rotates shaft" is not associated with Heat Treatment or Finishing, user checked no other box in FIG. 52. The user, when satisfied, clicks on "OK" and the screen of FIG. 51A re-appears with a new indicator, such as arrow 455, which represents a logic link between two respective functions. The user can now click on Function 1.1.2 Cutter Remove Metal and the screen of FIG. 53 appears. If desired, a "Next" button (not shown) can be provided in FIG. 52 screen which, when selected, immediately causes screen FIG. 53 to appear. Alternatively, screen FIG. 53 can appear when the "OK" button is selected in screen FIG. 52. Whenever an "OK" button is selected, the user entered data is stored or processed by the PSA as described above.

Referring to screen FIG. 53, the PSA highlights Productive for the function Cutter Removes Metal. No box on the right side can be checked because this function is the ultimate objective of the operation step, i.e. the Productive characteristic was designated for this function as described above.

The user then steps through the other functions displayed in screen FIG. 51A employing the same method as described above. Upon displaying the function Air Oxidize Shaft (1.2.3), screen FIG. 54 is displayed with Harmful type highlighted, e.g. appearing in red. The user can select no box under Heat Treatment because the action is designated harmful. User simply clicks "OK" and moves on.

Upon the user selecting function Grindstone Remove Slag (1.3.2) on screen FIG. 51, the PSA displays screen FIG. 55 with corrective type highlighted. Above the right graphic appears "Corrects What?" and the hierarchical functions of the process.

User clicks on Air Oxidize Shaft (FIG. 55) as the object of the corrective action of the function Grindstone Remove Slag. The PSA also clicks Heat Treatment operation step as receiving the correction.

Once the user enters appropriate data of the type described for all functions of all operation steps, the other logic link arrows are generated and displayed by the PSA as shown at the top portion of FIG. 51. At any time, the user can initiate the Link Analysis substage by clicking on the right most icon 456 for a specific function in FIG. 51.

In response, the PSA displays a Link Analysis screen for each function of each operation selected. The PSA prompts user to enter in graphic form the actual and required behavior of a user designated parameter through a time, space, and/or other parameter dependency. For example, FIG. 56 shows the Link Analysis screen for the function Inductor Heats Shaft (1.2.2). User designated "temperature" as a "useful" action and checked "time" as the dependency. The PSA displayed two graphics labeled "Actual" and "Required" behavior with all points (small circles) lying on the time axis. User then uses the cursor to move points (shown as small circles) to estimated vertical positions above the "time" axis to display and enter data of the actual and desired temperature/time curves. The PSA also enables entry of the significance factor for the temperature behavior and the acceptable deviation on a slide bar. The difference between the under-curve areas of the two graphs is calculated by PSA and also displayed, for example 8.0 in FIG. 56.

Next user clicks on "significance" appearing on screen FIG. 56. This causes display of screen FIG. 57 where user is prompted to enter the effect on each objective of the influence on the process if the required dependency could be achieved. For example, the temperature/time dependency would have no effect on the "operation time" objective if the actual temperature/time dependency were made to be the same as the required one. Accordingly, user leaves the indicator on "no" (meaning "none") for the "Operation Time" row of screen FIG. 57. However, since less energy is needed for the "required" than the "actual" behavior in Screen FIG. 56, user slides the marker to the left, i.e., "decreases". Difference is the average of the differences of the corresponding points of the two curves of FIG. 56, which in this example equals "±8.0".

With the markers set, the PSA displays the values. Note the scale reads from, in this example, zero to 2 in the direction of the objective ("Down"). If an objective were shown having an "Up" designation, the zero for it would be on the left and the 2 on the right of the marker scale.

The PSA acquires the readings of all rows (in this example, two rows) and calculates the significance which, for screen FIG. 57, is 6.0 using the algorithm as shown thereon. Note the importance factor had been entered by user during the Initial Data stage, see right side of FIG. 47. User clicks on "OK" and the PSA displays the "6.0" in the significance box in FIG. 56. Then clicking on "OK" in Screen FIG. 56 completes the link analysis and data entry for Inductor Heats Shaft and, in response, the PSA displays the same screens for the next stored Function. The link analysis method is repeated for all stored Functions.

Once the Link Analysis stage is completed to user's satisfaction, user moves to the Operation Trimming Stage by clicking on the Trimming Icon of any previous screen. The goal of this stage is to rank and analyze the various operations and functions, analyze the possible elimination or transfer of functions against a stored set of rules set forth above and display certain recommendations of elimination or transfer in order of importance to achieving stored objectives.

Upon entering Trimming Stage, the PSA first displays an Operation Evaluation Screen FIG. 58 which prompts each team member to rank each operation on a 10–1 scale for:

Function Rank: Importance of each Function to the process=10

Problem Rank: Largest Problem to implement=10

Cost: Actual or allocated cost in Dollars for the operation.

As seen in FIGS. 58, 59A and 59B, each team member entered his/her estimated function and problem ranks. If desired, the system can be configured so that each team member can see displayed only the ranking data he/she entered The PSA calculates the average and displays the results in the right hand columns of the screen. Each team member views the results, speaks with the other team members and makes modifications to his own evaluation as desired. In this case, the PSA will process the average of the various evaluations. When any team member presses the "consensus" button, data that team entered is entered and for all team member data.

User next clicks on the "next" icon of FIG. 59B causing the PSA to display the screen FIG. 60. The purpose of this screen is to display a number of Operations in possible (PSA recommended) trimming order based on the Trimming Factor resulting from processing the data with the algorithm as shown in FIGS. 60 and 61, Function Rank (e.g., as a percentage of 100%) and Problem Rank. The Trimming Factor value for each operation defines a specific parabolic curve. The smaller the area under the curve, the greater the value will result from trimming. In the present example, the PSA recommends Trimming or improving Heat Treatment (1.2) to yield the greatest value toward the entered project objectives. The PSA recommends improving or trimming Finishing to achieve the next best value and so on. In essence, the PSA, in this screen, presents a recommended list, in rank order of value, of operations to be trimmed or improved. PSA generates this list by applying the algorithm appearing in screen FIG. 61, which user accesses by clicking n the "set criterion" button in FIG. 60. In the event user does not wish to use the default algorithm, user clicks on "User's criterion" and enters user's own algorithm generally as shown. In any event, the PSA calculates the trimming factor using the user selected or entered algorithm and displays the results preferably in graphic and/or table form as described above and as shown in FIG. 60. Obviously, other forms of ranking display can be used instead of the specific ones shown in this exemplary embodiment.

Once satisfied, user clicks on "Next" to enter the Trimming Conditions routine in which the PSA will evaluate and recommend possible trimming conditions for overall process improvement. It is recommended the reader also refer to FIGS. 51A and 51B when reading the following. The Trimming Routine has access to previous stage data and also stores a set of internal rules for effecting the trimming or transfer recommendations. Specifically, in one exemplary example, those rules included the following:

If user chooses trimming condition:

The function to <action1 object1> performed during the operation <List of operations>.

This means that function <action1 object1> should be transferred to one of the operations from the <List of operations>.

In the present example shown in FIG. 51A and FIG. 60, action 1=heat, and object 1=shaft The PSA Trimming Routine automatically lists (parses) the stored Operations in accordance with the following ordered rules:

1. operation contains function with name <action1 object1>
2. operation contains function with name <action1 object1>
3. adjoining previous operation
4. adjoining subsequent operation If several operations meet the requirement of one of the conditions the PSA selects the next condition.

The PSA also analyzes logic links (Corrective, Providing) between functions and in accordance with this analysis displays to the user additional trimming conditions.

5. If function <action2 object2> provides function <action1 object1> and function <action1 object1> is transferred to another operation then PSA generate the following trimming conditions for function <action2 object2>
   * Trim the operation/function <action2 object2>
   * The function action2 provides function <action1 object1>

In the present example shown in FIGS. 51A and 60:

action2=support object2=shaft

Note in FIG. 51A, "support shaft" provides "heat shaft", thus "shaft" is object1 and object2 in the present example.

6. If function <action2 object2> corrects function <action1 object1> and function <action1 object1> is transferred to another operation then PSA generates the following trimming conditions for function <action2 object2>
   * Trim the operation/function <action2 object2>
   * The function action2 corrects function <action1 object1>

Thus, as seen below, application of Rule 6 in the present example can enable trimming of "support shaft" if the object 1 "shaft" is transferred to another operation because there is no need to "provide" in an operation if the provided object is transferred (or eliminated).

With reference to the above logic rules, when user selects "next" in FIG. 60, the PSA enables a transfer action evaluation routine and FIG. 62 appears with the Operation and Function with the highest candidate rating from FIG. 60. In the present PSA example, best candidate for trimming is Heat Treatment—heat shaft. The PSA displays in rank order the four trimming/transfer possibilities with the best (first on list) possibility or condition automatically selected as a default, which is the PSA best recommendation. User can override the default and select what user considers the most beneficial possibility by clicking on one of the other listed possibilities, e.g. "There is no object 'shaft'", if desired. In addition, the PSA shows the Operation-Function block diagram graphic with the default or selected block crossed out, in this example "heat shaft".

FIG. 62 also displays the graphic Operation, "Cutting", to which Operation the PSA recommends "heat shaft" be transferred. An arrow showing the direction of the transfer also renders clear information for the trimming or transfer recommended.

It should be understood that the user can simply and quickly evaluate various alternatives by clicking on alternate buttons to see and evaluate the modified process automatically displayed in the PSA. Thus, the PSA greatly enhances the user's ability to analyze the merits or disadvantages of possible process modification.

If agreeable, the user selects "next" to enable a logic link and related Function analysis and, in response, the PSA automatically displays FIG. 63A wherein the PSA recommends the elimination of "support shaft" function because, as seen in FIG. 51A, its purpose was a Providing Function to "heat shaft" which user agreed to transfer to a different operation, i.e. "Cutting".

Other possible trimming or transfer logic link conditions are also listed to enable user to override the PSA default (best) recommendation. Note button 271 for introducing alternate logic links and arrow 272 for introducing alternate trimmed functions.

When satisfied, user clicks "next" and PSA displays the next important recommendation, i.e. "remove slag" from the Finishing Operation. The PSA stored data indicating that "remove slag" was a corrective action because of the Harmful "oxidize shaft" function during the Heat Treatment Operation. See FIG. 51A. Since "heat shaft" is transferred the PSA recommends dropping "remove slag" in FIG. 63B.

When the user clicks "next" the PSA displays its recommendation to trim the "providing" action by "rotate shaft" to "remove slag" because "remove slag" had been trimmed.

Because there are no further possible trimming or transferring actions, when the user clicks "next" in FIG. 64, the PSA displays FIG. 65, the overall trimmed process block diagram, similar FIG. 51A, with the trimmed, and transferred functions and actions crossed out or modified or removed or shown under different Operations. FIG. 65 is generated from data stored for FIGS. 51A and 51B and FIGS. 62A through 64 and confirmed when user clicks "next" during the trimming condition routine. User with FIG. 65 can now see and understand what the new trimmed process can look like. Although FIG. 65 can not be edited, any of the data in prior screens can be changed at any time to affect the data shown in FIG. 65.

The user next can select Problem Manager displayed in FIG. 65. The PSA displays FIG. 66 which lists the problems to be solved in achieving a better, modified process. The PSA clearly lays out the problems on the right side of FIG. 66. On the left specific actions are listed along with the Problem Significance of each action generated by PSA from stored input data described above. Note the action with the highest significance (value) is "heat shaft transfer" with 83.0 compared to the others in the present example.

Accordingly, PSA advises user that solving the problem of how to transfer "heat shaft" to the Cutting operation will contribute the most, by far, toward the process redesign objectives of the entire project.

It will be understood by engineers and process designers that a computer based EAS-PSA provides a powerful tool enabling the user to undertake extensive, automatic process design, logic based analyses of a subject process and to obtain PSA recommendations of the most to the least significant design changes related to process modifications and to obtain a ranking list of the technical problems to be solved that will yield the greatest to the least benefits to the user and process design. It should also be understood that the design, layout, graphics, colors, and word choice appearing in screen shots disclosed in this application are exemplary and not limiting on the concepts and functions of the present invention. Architectural layout and flow charts are also exemplary of one embodiment of the present invention, and certain herein disclosed routines and software functions can be associated with various stages and software units for the convenience of the programmer as desired. It will be understood that various modifications and changes can be made to the herein disclosed examples without departing from the spirit and scope of the present invention.

GLOSSARY FOR EAS-PSA (Process System Analysis)

PROCESS:
Manufacturing Process: a model of an engineering system which reflects the nature and sequence of action undertaken on the main functions object of the engineering system and on the components of the object's supersystem.
Operation: Part of the technological process: a sequence of actions undertaken on the main function object of a given system and on the components of that object's supersystem.
FUNCTIONS:
Function: action of a material object that changes the parameters of another material object.
Carrier of the Function: an object that performs the function
Object of the Function: a material object that the action of the considered function is applied to.
Function Type: Characteristic of a function that reflects specific changes introduced into the object through fulfillment of the function.
Function of Operation: a function executed within the framework of a given operation.
Useful Function: a function that satisfies the requirements of the user of the function carrier.
Productive Function: a useful function that permanently changes the parameter(s) of the object. This change will exist partially or fully in the final state of the object or will bring object's parameters closer to that object's desired final state. (Example: cut shaft to length 12".)
Providing Function: a useful function that temporarily changes the parameter(s) of the object. This parameter change enables or facilitates subsequent or concurrent useful functions or operations. The temporary changes produced by providing functions are reversed by corrective functions (Example: heat an object to 100°, allow to cool to room temperature).
Corrective Function: a useful function that changes the parameter(s) of the object to eliminate unwanted object characteristics. This parameter change may reverse the changes of a providing function, reverse the changes of an excessive productive function, or eliminate/reduce unwanted results of a harmful function. (Example: file a cut metal edge to remove burs).
Harmful Function: a function that worsens the parameter(s) and/or performance of an object.
Parameter: descriptions of properties in terms of measure or quality or characteristic.
ACTIONS:
Useful Action: an action performing a useful function.
Harmful Action: an action performing a harmful function.
INTENSITY OF ACTIONS:
Normal Intensity: a situation when the actual intensity coincides with the required one.
Excessive Intensity: a situation when the actual intensity exceeds the required one.
Insufficient Intensity: a situation when the required intensity exceeds the actual one.
PARAMETERS OF ACTIONS (VALUES AND DEPENDENCIES):
Useful:
  Actual Value: the value of a parameter at a point in its life cycle.
  Required Value: a value that a parameter should have for optimal performance of its corresponding function(s).
  Actual Dependency: a dependency that the parameter has at a point in its life cycle.
  Required Dependency: a dependency that a parameter should have for optimal performance of its corresponding function(s).
  Acceptable Deviation: indicates the acceptable limits of the required value.
Harmful:
  Actual Value: value that the parameter has during the object life stage.
  Acceptable Value: Value that provides an acceptable level of damage for the object.
  Ideal value: value that provides absence of damage to the object.
  Acceptable Deviation: the variance allowed from the required or acceptable value of a parameter.
TRIMMING:
Trimming: a method of improving manufacturing process based upon the elimination of operations and the redistribution of their useful functions. The result of this is a simpler, more cost-effective process which performs as well (or better) than the original.
Trimming Conditions: the various options available for redistributing useful functions.
Goals of Trimming: the problem to be solved to realize the chosen trimming conditions.

We claim:
1. A digital computer system having a computer readable storage medium comprising a process system analysis module for analyzing a process system, said process analysis system module comprising:
   a component model unit responsive to user entered component model data for storing said component model data and generating on the computer screen a visual representation of a component model of the process system including said functional model components, manufacturing operations that produce each manufacturing component, and functions that form each operation,
   each function comprising an element or tool that performs an action and an element or tool that receives the action,
   a process analysis unit including a link analysis routine which is responsive to user entry to store and display logic links between functions of each operation and between functions of each operation and functions of other operations and to store and display link data representing one of at least three types for each link,
   a trimming unit comprising a stored set of rules, analyzing component model data and link data against said rules for generating recommendations for the elimination or transfer of some of said functions and designation of the relative importance to the modification of the process system of each recommendation, and wherein said process system analysis module displays said representation of said some of said functions and representations of said designation.
2. The digital computer system as set forth in claim 1 wherein
   said component model data includes a sequence of said functions in each said operation, at least one of cost, energy consumption, actuation time of each function.
3. The digital computer system as set forth in claim 1 wherein said link data includes four types including Harmful, Providing, Corrective and Productive.

4. The digital computer system as set forth in claim 1 wherein said link data includes function performance data.

5. The digtal computer systems set in claim 1 wherein said link data includes time, space, and parameter dependencies.

6. The digital computer system as set forth in claim 5 wherein said link data includes a quantitative representation of the significance of each function.

7. The digital computer system as set forth in claim 5 wherein said component model data includes a quantitative representation of the actual and required behavior for each parameter of each function.

8. The digital computer system as set forth in claim 1 wherein said model data includes for each function, function rank, problem rank, and cost data.

9. The digital computer system as set forth in claim 1 wherein said process analysis unit includes (i) a trimming/transfer set criterion routine including a trimming/transfer algorithm and (ii) an integrated operation evaluation routine for determining and displaying in table form or graphically the priority order of each function of each operation as a candidate for transfer or elimination and in response to the function rank, problem rank, and cost of the trimming factor of each function.

10. The digital computer system as set forth in claim 1 wherein said trimming unit displays portions of said component model displaying the operation from which a function is recommended or selected for transfer and the operation to which a function is transferred and representations showing the transfer.

11. The digital computer system as set forth in claim 1 wherein said trimming unit displays portions of said component model displaying one or more trimming conditions in rank order of significance to process improvement which trimming conditions can be selected selectively by the user.

12. The digital computer system as set forth in claim 1 wherein said trimming unit displays portions of said component model displaying the operation from which a function is recommended or selected for elimination and the operation and function which is effected by said elimination.

13. The digital computer system as set forth in claim 1 wherein said trimming unit displays portions of said component model displaying the operations and functions between which a link is recommended or selected for elimination.

14. The digital computer system as set forth in claim 1 wherein the trimming unit generates representations of a modified component model showing transferred and eliminated operations, functions, and links.

15. The digital computer system as set forth in claim 1 wherein said process analysis system further comprises a problem manager unit for generating representations of a list of problems to be solved with indications of the most significant to least significant function transfer or elimination problems which if solved would yield the most to the least improvement to the process system.

16. In a digital computer system, a method of analyzing a process system comprising:

storing user entered component model data, using at least a portion of stored component model data for generating and displaying on the computer monitor a visual representation of a component model of the process system including functional model components, manufacturing operations that produce each component, and functions that form each manufacturing operation, each function comprising an element or tool that performs an action and an element or tool that receives the action, storing and displaying logic links between functions of each operation and between functions of each operation and functions of other operations, and storing and displaying link data representing one of at least three types for each link, storing a set of trimming rules, analyzing component model data and link data against said rules and generating recommendations for the elimination or transfer to other operations of some of said functions and designating the relative importance to the modification of the process system of each recommendation, and displaying said representation of said some of said functions and representations of said importance designations.

17. The method according to claim 16 wherein said component model data and said component model includes a sequence of said functions in each said operation, and at least one of cost, energy consumption, actuation time of each function.

18. The method according to claim 16 wherein said link data includes four types including Harmful, Providing, Corrective and Productive.

19. The method according to claim 16 wherein said link data includes function performance data.

20. The method according to claim 16 wherein said link data includes time, space, and parameter dependencies.

21. The method according to claim 20 wherein said link data includes a quantitative representation of the significance of each function.

22. The method according to claim 20 wherein said component model data includes a quantitative representation of the actual and required behavior for each parameter of each function.

23. The method according to claim 16 wherein said component model data includes for each function, function rank, problem rank, and cost data.

24. The method according to claim 16 further comprising storing function rank, problem rank, and cost data for each function, storing a trimming/transfer algorithm for generating a trimming factor using the stored function rank, problem rank, and cost data, and determining and displaying in table form or graphically the trimming factor priority order of each function of each operation as a candidate for transfer or elimination.

25. The method according to claim 16 further comprising displaying portions of said component model showing the operation from which a function is recommended or selected for transfer and the operation to which a function is transferred and representations showing the transfer.

26. The method according to claim 16 further comprising displaying portions of said component model showing one or more trimming conditions in rank order of significance to process improvement with trimming conditions can be selected selectively by the user.

27. The method according to claim 16 further comprising displaying portions of said component model showing the operation from which a function is recommended or selected for elimination and the operation and function which is effected by said elimination.

28. The method according to claim 16 further comprising displaying portions of said component model showing the operations and functions between which a link is recommended or selected for elimination.

29. The method according to claim 16 further comprising generating representations of a modified component model showing transferred and eliminated operations, functions, and links.

30. The method according to claim 16 further comprising generating and displaying representations of a list of problems to be solved with indications of the most significant to least significant function transfer or elimination problems which if solved would yield the most to the least improvement to the process system.

* * * * *

UNITED STATES PATENT AND TRADEMARK OFFICE
CERTIFICATE OF CORRECTION

PATENT NO. : 6,202,043 B1
DATED : March 13, 2001
INVENTOR(S) : Igor G. Devoino et al.

It is certified that error appears in the above-identified patent and that said Letters Patent is hereby corrected as shown below:

<u>Title page,</u>
Item [75], Inventors, Igor G. Devoino; Oleg E. Koshevoy, both of Minsk (BY); Simon S. Litvin, St. Petersburg (RU); Valery Tsourikov, Boston, MA (US); Aleksander Skuratovich, Minsk (BY)

Signed and Sealed this

Twenty-eighth Day of May, 2002

*Attest:*

*Attesting Officer*

JAMES E. ROGAN
*Director of the United States Patent and Trademark Office*